(12) United States Patent
Eichelberger et al.

(10) Patent No.: US 7,830,000 B2
(45) Date of Patent: Nov. 9, 2010

(54) INTEGRATED THERMAL STRUCTURES AND FABRICATION METHODS THEREOF FACILITATING IMPLEMENTING A CELL PHONE OR OTHER ELECTRONIC SYSTEM

(75) Inventors: Charles W. Eichelberger, Wakefield, MA (US); James E. Kohl, Reading, MA (US)

(73) Assignee: Epic Technologies, Inc., Woburn, MA (US)

( * ) Notice: Subject to any disclaimer, the term of this patent is extended or adjusted under 35 U.S.C. 154(b) by 0 days.

(21) Appl. No.: 12/144,717

(22) Filed: Jun. 24, 2008

(65) Prior Publication Data

US 2008/0315404 A1 Dec. 25, 2008

Related U.S. Application Data

(60) Provisional application No. 60/945,988, filed on Jun. 25, 2007.

(51) Int. Cl.
*H01L 23/34* (2006.01)

(52) U.S. Cl. ............... 257/706; 257/675; 257/E23.087; 438/122

(58) Field of Classification Search ............... 257/706, 257/675, E23.08, E23.087; 438/122
See application file for complete search history.

(56) References Cited

U.S. PATENT DOCUMENTS

| | | | |
|---|---|---|---|
| 4,640,010 A * | 2/1987 | Brown | 29/832 |
| 4,783,695 A | 11/1988 | Eichelberger et al. | |
| 5,111,278 A * | 5/1992 | Eichelberger | 257/698 |
| 5,250,843 A | 10/1993 | Eichelberger | |
| 5,353,498 A | 10/1994 | Fillion et al. | |
| 5,841,193 A | 11/1998 | Eichelberger | |
| 5,998,859 A | 12/1999 | Griswold et al. | |
| 6,064,114 A | 5/2000 | Higgins, III | |
| 6,159,767 A | 12/2000 | Eichelberger | |
| 6,426,545 B1 | 7/2002 | Eichelberger et al. | |
| 6,507,115 B1 * | 1/2003 | Hofstee et al. | 257/777 |

(Continued)

OTHER PUBLICATIONS

Kohl et al., "Low Cost Chip Scale Packaging and Interconnect Technology", Proceedings of the Surface Mount International Conference, San Jose, California (Sep. 1997).

(Continued)

*Primary Examiner*—A. Sefer
*Assistant Examiner*—Allen L Parker
(74) *Attorney, Agent, or Firm*—Kevin P. Radigan, Esq.; Heslin Rothenberg Farley & Mesiti P.C.

(57) ABSTRACT

Circuit structures and methods of fabrication are provided for facilitating implementing a complete electronic system in a compact package. The circuit structure includes, in one embodiment, a chips-first multichip base layer with conductive structures extending therethrough. An interconnect layer is disposed over the front surface of the multichip layer and includes interconnect metallization electrically connected to contact pads of the chips and to conductive structures extending through the structural material. A redistribution layer, disposed over the back surface of the multichip layer, includes a redistribution metallization also electrically connected to conductive structures extending through the structural material. Input/output contacts are arrayed over the redistribution layer, including over the lower surfaces of at least some integrated circuit chips within the multichip layer, and are electrically connected through the redistribution metallization, conductive structures, and interconnect metallization to contact pads of the integrated circuit chips of the multichip layer.

16 Claims, 33 Drawing Sheets

U.S. PATENT DOCUMENTS

| | | | |
|---|---|---|---|
| 6,555,908 | B1 | 4/2003 | Eichelberger et al. |
| 6,586,827 | B2 | 7/2003 | Takeuchi et al. |
| 6,818,544 | B2 | 11/2004 | Eichelberger et al. |
| 6,838,776 | B2 | 1/2005 | Leal et al. |
| 6,972,964 | B2 | 12/2005 | Ho et al. |
| 7,006,359 | B2 | 2/2006 | Galvagni et al. |
| 7,112,467 | B2 | 9/2006 | Eichelberger et al. |
| 7,122,467 | B2 | 10/2006 | Lee et al. |
| 7,238,602 | B2 | 7/2007 | Yang |
| 7,339,279 | B2 | 3/2008 | Yang |
| 7,345,365 | B2 | 3/2008 | Lee et al. |
| 7,405,102 | B2 | 7/2008 | Lee et al. |
| 7,427,812 | B2 | 9/2008 | Wakisaka et al. |
| 7,429,793 | B2 | 9/2008 | Yamagata |
| 7,550,830 | B2 | 6/2009 | Yoon |
| 7,550,833 | B2 | 6/2009 | Mihara |
| 7,572,681 | B1 | 8/2009 | Hoemoeller et al. |
| 7,619,901 | B2 | 11/2009 | Eichelberger et al. |
| 2003/0197285 | A1 | 10/2003 | Strandberg et al. |
| 2003/0201534 | A1 | 10/2003 | Eichelberger et al. |
| 2005/0062147 | A1 | 3/2005 | Wakisaka et al. |
| 2005/0161799 | A1 | 7/2005 | Jobetto |
| 2006/0017155 | A1* | 1/2006 | Wang .................. 257/703 |
| 2007/0249102 | A1 | 10/2007 | Brunnbauer et al. |
| 2008/0315375 | A1 | 12/2008 | Eichelberger et al. |
| 2008/0315377 | A1 | 12/2008 | Eichelberger et al. |
| 2008/0315391 | A1 | 12/2008 | Eichelberger et al. |
| 2010/0031500 | A1 | 2/2010 | Eichelberger et al. |
| 2010/0032091 | A1 | 2/2010 | Eichelberger et al. |
| 2010/0035384 | A1 | 2/2010 | Eichelberger et al. |
| 2010/0044855 | A1 | 2/2010 | Eichelberger et al. |
| 2010/0047970 | A1 | 2/2010 | Eichelberger et al. |

OTHER PUBLICATIONS

"Wire Bond and Beyond: Semiconductor Packaging Innovation", White Paper, Freescale Semiconductor, Inc. Jul. 2006, pp. 1-9.

Leung, John, "Packaging Technology for Mobile Platforms", Wireless and Mobile Systems Group, Freescale Semiconductor, Inc., printed from Internet on Nov. 18, 2006, pp. 1-28.

Mangrum, Marc, "Packaging Technologies for Mobile Platforms", Wireless Mobile Systems Group, Freescale Semiconductor, Inc., Sep. 28, 2006, pp. 1-19.

"Redistributed Chip Package (RCP) Technology", Freescale Semiconductor, Inc., printed from Internet on Nov. 18, 2006, pp. 1-6.

Keser, Beth, "Birds-of-a-Feather: Redistributed Chip Package (RCP) Broad-Range Applications for an Innovative Package Technology", Freescale Semiconductor, Inc., Jun. 2007, pp. 1-18.

Keser, Beth, "Redistributed Chip Packaging", http://www.semiconductor.net/index.asp? layout=articlePrint&articleID=CA6428421, Semiconductor International, Apr. 1, 2007, pp. 1-5.

Office Action for U.S. Patent Publication No. 2008/0315377 A1 (U.S. Appl. No. 12/144,725), dated Mar. 17, 2010.

Office Action for U.S. Patent Publication No. 2008/0315375 A1 (U.S. Appl. No. 12/144,720), dated Apr. 29, 2010.

Office Action for U.S. Appl. No. 12/144,840 (U.S. Patent Publication No. 2008/0315391 A1), dated Jul. 6, 2010.

Office Action for U.S. Appl. No. 12/144,720 (U.S. Patent Publication No. 2008/0315375 A1), dated Nov. 19, 2009.

* cited by examiner

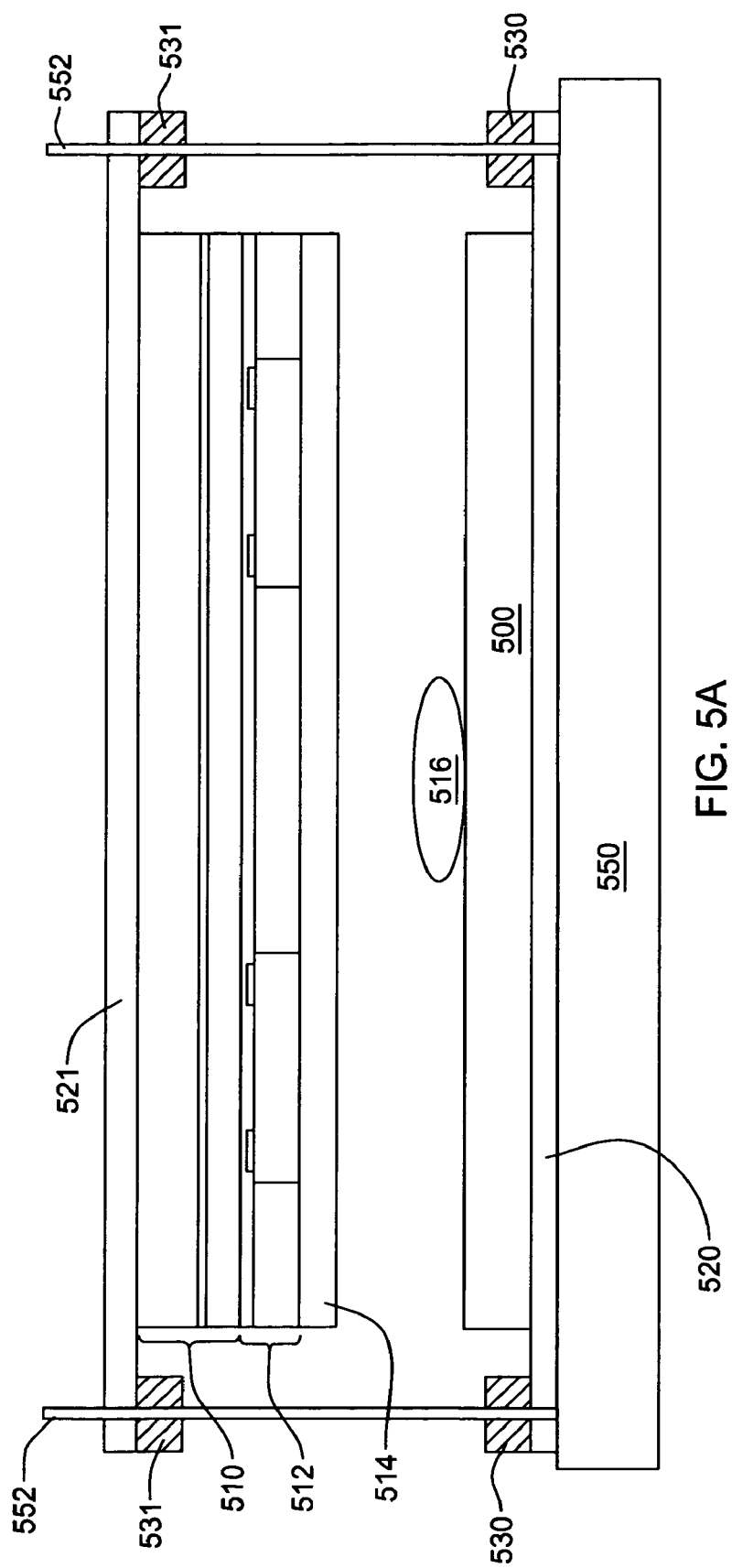

US 7,830,000 B2

INTEGRATED THERMAL STRUCTURES AND FABRICATION METHODS THEREOF FACILITATING IMPLEMENTING A CELL PHONE OR OTHER ELECTRONIC SYSTEM

CROSS-REFERENCE TO RELATED APPLICATIONS

This application claims priority from U.S. Provisional patent application Ser. No. 60/945,988, filed Jun. 25, 2007, entitled "Integrated Structures and Fabrication Methods Thereof Implementing a Cell Phone or Other Electronic System", by Eichelberger et al., the entirety of which is hereby incorporated by reference.

TECHNICAL FIELD

This invention relates in general to circuit structures and methods of fabrication thereof, and more particularly, to integrated structures and methods of fabrication thereof implementing a complete cell phone system or other electronic system, or subsystem, in a highly compact package.

BACKGROUND OF THE INVENTION

The conventional approach to electronic packaging and interconnect has been to package individual integrated circuit (IC) chips into a single package and to attach these packages to a printed circuit board to provide interconnect between the individual IC chips. In recent years, this approach has met with problems of speed, size and interconnect density due to ever-constant demands for reduced size and increased performance from such integrated circuit packages.

Process speed is conventionally limited by the fact that individual packages have loading capacitance and inductance associated with their relatively long pins and by the large size of conductor runs in the packages relative to the size of the conductors of a bare IC chip. As the speed of computers and other devices continues to increase, the problem of providing electronic packaging and interconnect which provides maximum performance has become a significant challenge. One solution to the problem is the multichip module (MCM). In an MCM, bare (unpackaged) IC chips are interconnected by means of a miniature printed circuit board whose interconnect pitch may match the pitch of the IC chips themselves. There are presently two main classes of MCM. These are the chips-last MCM and the chips-first MCM. In the chips-last MCM, the miniature circuit board is fabricated first and then the bare IC chips are attached and interconnected to the circuit board. The method of interconnect is usually wire-bond or solder bump. In the chips-first MCM, the chips are placed first relative to each other and a miniature circuit board is then built above the chips. The interconnect is formed to the IC chips as an integral part of the processing of the circuit board.

Structures in accordance with the present invention fall into the category of chips-first MCMs. Chips-first MCMs provide one way to minimize size of a multichip module and provide high performance interconnect. Examples of chips-first modules are given in U.S. Pat. Nos. 5,250,843; 5,353,498; and 5,841,193, each of which is hereby incorporated herein by reference in its entirety.

One problem with an assembly using chips-first technologies is that modules are costly to repair. If a module is fabricated with a defective integrated circuit chip, then all other chips in the module are lost. Thus, it is desirable to take advantage of a chips-first technology for size and performance aspects, while still providing a fabrication method which avoids incorporating components that are not thoroughly tested and known to be good.

Another problem in the art is to provide very thin chips-first modules that have mechanical rigidity and protection so that they are easily handled by automated assembly equipment and can be used without further structural considerations by, for example, a cell phone assembler. A further problem is that certain components of an electronic system, such as a cell phone, generate a significant amount of heat. An example of this is the power amplifier. The use of a heat sink is prohibitive in that it adds an unacceptable thickness to the package. Instead, the conventional approach is to deliver heat to the circuit board on which the components are mounted. Still another problem is that in an extremely dense package, cross-talk between sensitive RF receiver components, powerful transmitter components and high speed digital components is markedly increased. This problem is reduced in circuit board versions of a cell phone in that the individual components can be spaced from one another and individual shield shells placed around the cross-talking components.

The chips-first circuit structures and methods of fabrication presented herein are directed in part to addressing the above-noted problems.

SUMMARY OF THE INVENTION

Briefly summarized, this invention comprises in a first aspect an electronic module which includes: a chip layer including at least one chip comprising at least one side surface, an upper surface, a lower surface, and at least one contact pad at the upper surface; a structural material surrounding and physically contacting the at least one side surface of each chip of the at least one chip of the chip layer, the structural material having an upper surface substantially co-planar with or parallel to an upper surface of each chip of the at least one chip and defining at least a portion of a front surface of the chip layer, and a lower surface substantially co-planar with or parallel to a lower surface of each chip of the at least one chip and defining at least a portion of a back surface of the chip layer; at least one device disposed over the front surface of the chip layer; and a thermal conduit from a surface of the at least one device to the back surface of the chip layer, the thermal conduit comprising at least one thermally conductive structure extending through the structural material between the front surface and the back surface of the chip layer, the thermal conduit facilitating extraction of heat from the at least one device disposed over the front surface of the chip layer through the back surface of the chip layer.

In another aspect, an electronic module is provided comprising: a chip layer including at least one chip, each chip including at least one side surface, an upper surface, a lower surface, and at least one contact pad at the upper surface, and a structural material surrounding and physically contacting the at least one side surface of each chip of the chip layer, the structural material having an upper surface substantially co-planar with or parallel to an upper surface of the at least one chip and defining at least a portion of a front surface of the chip layer, and a lower surface substantially co-planar with or parallel to a lower surface of the at least one chip and defining at least a portion of a back surface of the chip layer; at least one device disposed over the back surface of the chip layer; and a thermal conduit from a surface of the at least one device to the front surface of the chip layer, the thermal conduit comprising at least one thermally conductive structure extending through the structural material between the back surface and front surface of the chip layer, the thermal conduit facilitating extraction of heat from the at least one device disposed over the back surface of the chip layer to the front surface of the chip layer.

In a further aspect, an electronic module is provided which includes: a chip layer including at least one chip, each chip including at least one side surface, an upper surface, a lower surface, and at least one contact pad at the upper surface, and a structural material surrounding and physically contacting the at least one side surface of each chip of the chip layer, the structural material having an upper surface substantially co-planar with or parallel to an upper surface of the at least one chip and defining at least a portion of a front surface of the chip layer, and a lower surface substantially co-planar with or parallel to a lower surface of the at least one chip and defining at least a portion of a back surface of the chip layer; a redistribution layer disposed over the back surface of the chip layer; a plurality of contacts arrayed over the redistribution layer over the back surface of the chip layer; and at least one thermal conduit extending from the at least one surface of the at least one chip of the chip layer to at least one contact of the plurality of contacts arrayed over the redistribution layer, each thermal conduit extending through the redistribution layer and facilitating extraction of heat from the at least one chip to a respective contact of the plurality of contacts.

Various methods of fabricating the above-summarized modules are also described and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 5A & 5B depict use of a fixture for facilitating adhesive attachment of a process carrier to a process structure obtained during manufacturing of a multichip module, in accordance with an aspect of the present invention;

BEST MODE FOR CARRYING OUT THE INVENTION

Figure 1:
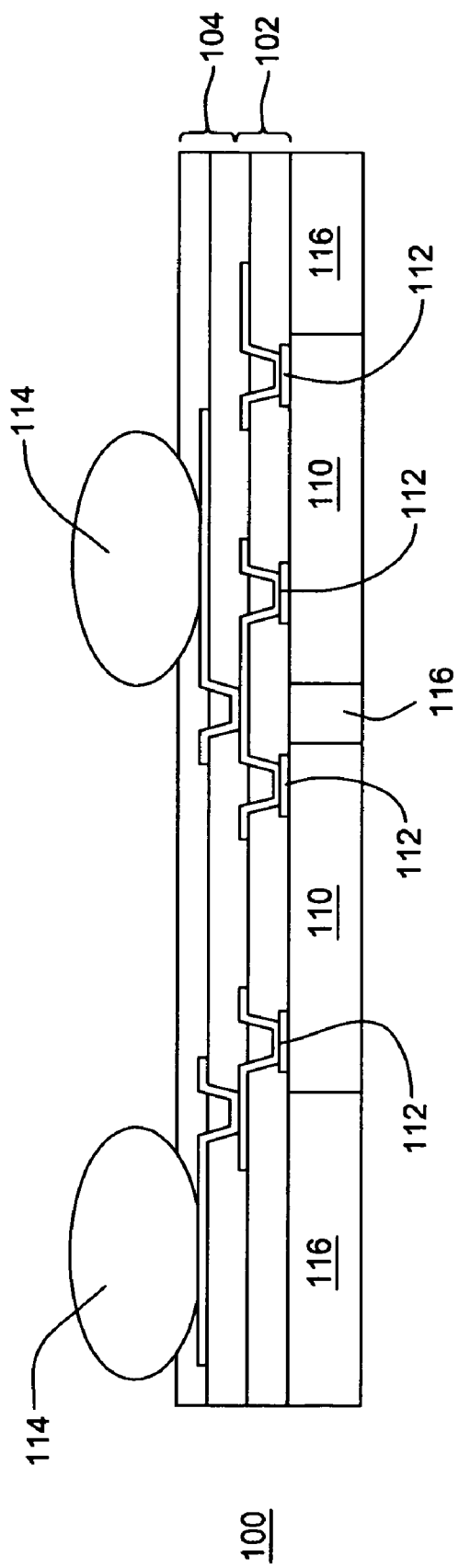
FIG. 1 is a cross-sectional elevational view of a conventional chips-first module.

Generally stated, provided herein are numerous enhancements to multichip modules, and in particular, to chips-first multichip modules. Advantageously, complete electronic systems or subsystems, and methods of fabrication thereof are disclosed herein in which a second layer of modules or other circuit components is connected to a multichip layer fabricated as a chips-first module. The multichip layer forms a base for the second layer of modules or components. Structures are provided for making through connection from a front surface to a back surface of the multichip layer. Interconnect structures are provided over the front surface of the multichip layer for interconnecting contact pads of integrated circuit chips in the multichip layer, as well as for connecting second layer components or for connecting to input/output contacts. The multichip modules disclosed herein include input/output contacts (e.g., contact pads or bumps) which may be placed at any location above the front surface of the multichip layer or below the back surface of the multichip layer, including over the upper surfaces and lower surfaces of the integrated circuit chips within the multichip layer.

In enhanced aspects, structures are disclosed for providing Faraday shields, high thermal conductivity paths, power bus structures, and for stiffening the complete system or subsystem. Structures and methods for extremely thin-stacked modules are also disclosed using the chips-first multichip layer and featuring input/output contacts arrayed anywhere above and below the integrated circuit chips of the multichip module.

One application of the multichip modules described herein is in providing a complete cell phone system integrated as a single package. It is highly desirable to incorporate all of the electronics of a system, such as a cell phone, into a single package that a cell phone assembler can incorporate as a completely tested unit into a cell phone by simply connecting battery and input/output means. The structure and methods disclosed are applicable to a wide variety of systems such as Bluetooth, portable computers, PDAs, stand-alone communication devices, etc. Although the concepts disclosed herein are presented with reference to a complete cell phone in a package, it should be realized that any small electronic system or sub-system can benefit from the structures and methods disclosed. In cell phone and portable electronic applications it is desirable to provide electronic modules that are as compact as possible, and in particular that have as little thickness as possible. As previously stated it is also highly desirable to incorporate as much of the electronic system as possible in a single multichip module that can be tested before supplying the module to the system manufacturer. One goal then is to provide a complete system in a module that is both thin and presents minimal footprint area.

To better understand the value of the present invention, an example of prior art cell phone systems and prior art cell phone modules is given. Presently, cell phone manufacturers use a main circuit board and mount the individual components or subassemblies on that circuit board. Typically the components are mounted on both sides of the circuit board. Connection is made from the I/O, such as keyboard and display, by flex circuit or ribbon cable. The antenna is connected through an RF connector or direct connection. The battery is also connected by individual wires or a battery connector mounted on the circuit board. In this configuration, the individual packages are each relatively large. The net result is that the cell phone assembler must mount many individual components and packages and test each board before shipping the phone. Ideally, if all the electronics for a cell phone were available in a pre-tested module, then the cell phone manufacturer would have reduced testing requirements. In addition, if that module were smaller than the cell phone manufacturer's individual component board today, it would allow for smaller cell phones and less cost to the manufacturer.

FIG. 1 is a cross-sectional view of a typical chips-first structure, generally denoted 100, showing direct interconnect between integrated circuit chips 110 utilizing two interconnect layers (i.e., a first layer 102 and second layer 104), and featuring edge to edge placement of chips, and I/O bumps 114 above the chips. A structural filler/encapsulant material 116 fills the spaces between chips, provides structural support and provides a planar surface for the interconnect layers 102 and 104. Chips-first interconnect structures are described in detail in the above-incorporated patents. As discussed in these patents, one advantage of a chips-first structure is that interconnection is made directly to the chip pads 112 and therefore the interconnection takes up minimal space. The chips can be placed essentially edge to edge further minimizing space. Minimum thickness is achieved because the chips themselves may be thinned to an arbitrary thickness, and because of the direct interconnection, there is no requirement for bumps or interposers (which would add to thickness) to connect from the chip pads to the interconnect layers.

Since chips-first fabrication methods are batch fabrication methods, a full panel of chips-first modules can be fabricated at the same time, and thus the manufacturing process can take advantage of economy of scale. One of the problems that chips-first modules face is that the economies are lost when bad chips are incorporated into the modules. One bad chip in the module renders the module and therefore the other chips in the module unusable. As a result, it is advantageous that the incorporated chips be thoroughly tested so that they are known to be good before they are affixed within the module. Semiconductor memory is one of the elements that are available in bare die form as "known good die". Therefore incorporating memory in a chips-first base layer takes advantage of the "chips-first" production economies, as well as minimal size and high performance, while not suffering the fallout caused by incorporation of bad die.

As used herein, the term "chip" or "chips" includes any semiconductor device, including a transistor or integrated circuit (e.g., those made with silicon, gallium arsenide, silicon-germanium, indium phosphide, etc.). Further, as used herein, the term "chip" can include integrated devices with one or more passive devices (such as resistors, capacitors and inductors). In addition, "chip" can refer to a metal or conductive die of any thickness, as well as to active devices (such as imagers, light sensors, photo or laser diodes, etc.). The term "chip" also includes a surface-mounted component or device, such as a capacitor or resistor.

Figure 2:
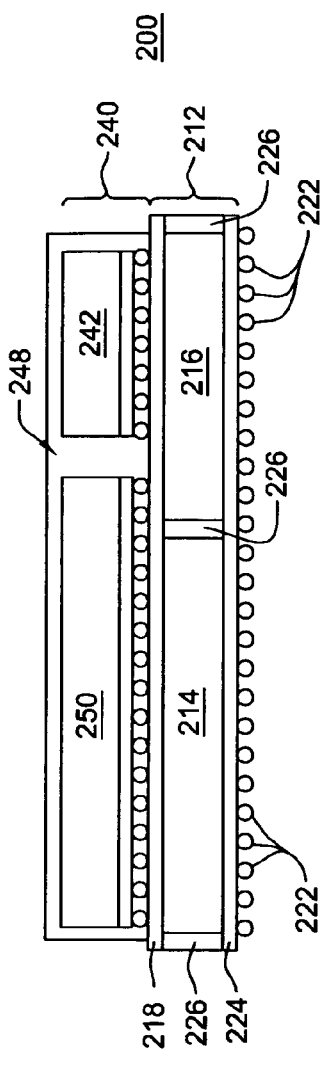
FIG. 2 is a cross-sectional elevational view of one embodiment of a multichip module, in accordance with an aspect of the present invention.
Figure 3:
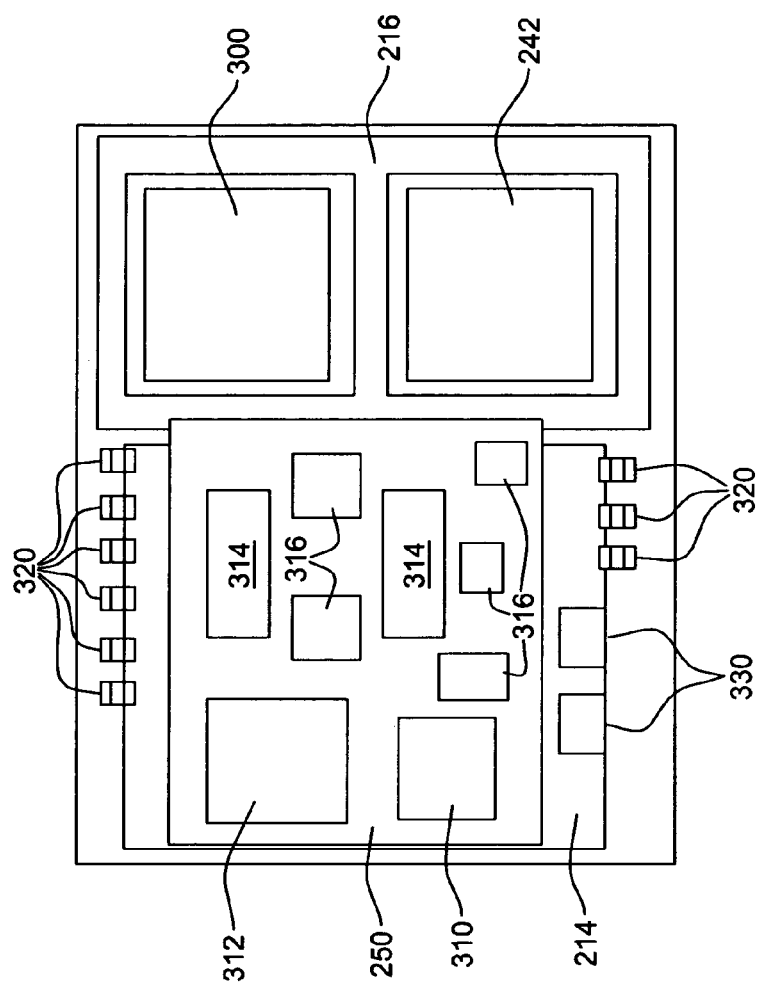
FIG. 3 is a cross-sectional plan view of the multichip module of FIG. 2, in accordance with an aspect of the present invention.

As noted, presented herein are further enhancements to the chips-first module approach to packaging multiple integrated circuit chips. By way of example, FIGS. 2 & 3 depict a cross-sectional elevational view and a cross-sectional plan view of one embodiment of a multichip module implementing a cell phone system or subsystem as a highly integrated compact package. This multichip module, generally denoted 200, includes DRAM 214 and FLASH 216 memory elements incorporated in a chips-first base or multichip layer 212. As noted, the multichip layer allows for the most compact packaging of these "known good die" elements. The interconnect makes direct connection between integrated circuit chips in the multichip layer without the use of interposers, such as solder bumps. The direct connection improves electrical performance, as well as reducing the overall thickness of the multichip module. Additionally, integrated circuit chips in the multichip layer can be placed essentially edge to edge so that the overall footprint is minimized. Input/output structures such as contact pads or solder bumps may be placed in an array above the integrated circuit chips, thus minimizing the area required for interconnection to the next interconnect level.

In accordance with an aspect of the present invention, a second layer of devices 240 is surface mounted onto multichip layer 212. In one embodiment, these additional devices are also fabricated as chips-first modules, which again minimizes their footprint and thickness. The second layer of devices 240 includes chips of all kinds that are adapted to be surface-mounted. Device layer 240 also includes individual surface-mount components (e.g., resistors, capacitors, and inductors). Device layer 240 further includes surface acoustic wave (SAW) devices, piezo-electric devices (e.g., crystals and annunciators), and magnetic elements (e.g., speakers, transformers, and magnetic sensors). As explained above and in further detail below, the second layer of devices 240 can also include modules that can be chip scale packages (CSPs), conventional ball grid arrays (BGAs), and surface-mount packages, such as quad flat packs (QFPs). These modules may themselves be multi-component/device modules.

FIG. 3 illustrates how a variety of devices are surface mounted and positioned on the multichip layer. One of the devices is referred to as Apps. μP 242. This is a chips-first chip scale package (CSP). The Apps. μP 242 is a type of chip that is typically tested and additionally burned-in in packaged form. After testing and burn-in, module 242 can be incorporated into the cell phone as a packaged module in a chips-first CSP without impacting the yield.

A similar module referred to as a Phone μP 300 is also a chips-first module that performs control functions for operation of the phone. Similarly, another type of module can be incorporated. This other type of module is not just a single chip, but is rather a specific subsystem. FIG. 3 shows positioning of this other type of module, referred to as a "Chips-First rf/PA/Pwr Mgmt" module 250. Module 250 includes several electronic components and provides a sub-system with multiple functionalities.

FIG. 3 depicts one embodiment of the elements that make up "Chips-First rf/PA/Pwr Mgmt" module 250. One of these functionalities is a power amplifier (PA) 310, which is responsible for generating the power necessary for the phone to transmit a signal. The PA adds the requirement of removal of a significant amount of heat and also the requirement to shield generated RF noise from the rest of the system. Detailed explanation of certain techniques to achieve shielding and heat removal are provided herein. The "Chips-First rf/PA/Pwr Mgmt" module 250 also contains several other functional chips to provide the full subsystem function. These include a Pwr Mgmt chip 312 which controls how power is utilized in the cell phone and helps improve battery life. Integrated passive chips 314 are also incorporated. These chips provide the functions of resistors, capacitors and inductors, and are each configured as a monolithic chip for incorporation into a chips-first module. Additional miscellaneous chips 316 are also incorporated to complete the function of the subsystem. Other components included to complete the entire system are conventional surface mount passives 320 such as resistors, capacitors, and inductors. Surface Acoustic Wave filters (SAW) 330 can be surface mounted directly as provided by the SAW manufacturer. At this point, a complete system for all the electronics of a "feature rich" cell phone have been incorporated. A preliminary estimate shows that the entire cell phone electronics can be incorporated in a package with a footprint of 16×20 mm. By comparison, a typical circuit board containing the same electronic capability using conventional packaging has a minimum size of 39×59 mm. The multichip module presented herein thus represents a savings both in size and cost. Similar size and cost savings can be obtained for other portable electronic systems as well.

Two additional innovations can be added to the structure described in order to further enhance the efficacy of the cell phone in a package presented herein. If the module is to be provided to the cell phone assembler in a way that it is most easily assembled into a system, it should have a means for easy interconnection to the keyboard, battery, antenna and display. FIG. 2 shows a configuration where bumps 222 are provided on the back surface of, multichip layer 212. Cell phone assemblers are set up to handle components that can be surface mounted by soldering means. Bumps 222 are connected to the rest of the system by a redistribution layer 224 (which may comprise one or more metal levels) that redistributes signals from an array of bumps to conductive structures or through connects in the filler encapsulant material 226.

A second innovation that improves efficacy of the system is the addition of an encapsulant and stiffener or stiffening member (which is planar in one embodiment) to the side away from the bumps. This stiffener adds rigidity and protection to the module, and makes handling of the module easier since one of the main surfaces is flat. In addition, the added rigidity eliminates any requirement for the assembler to add a separate means to stiffen the module. FIG. 2 shows the incorporation of an encapsulant 248 that also provides stiffness and a uniform handling and protective surface.

Still referring to FIGS. 2 & 3, the thickness of the multichip module 200, that is, of the complete cell phone in a package in this example, containing all electronics and including the thickness of the bump interconnect 222 and the stiffener/encapsulant 248, is (in one embodiment) advantageously less than 1.6 mm. The description below details methods of fabrication of the above-described multichip module, as well as details of various alternate embodiments thereof. While the advantages are described herein in terms of a cell phone any electronic system or subsystem can benefit from the disclosed methods and structures.

Fabrication Of Chips-First Base Layer

Figure 4A:
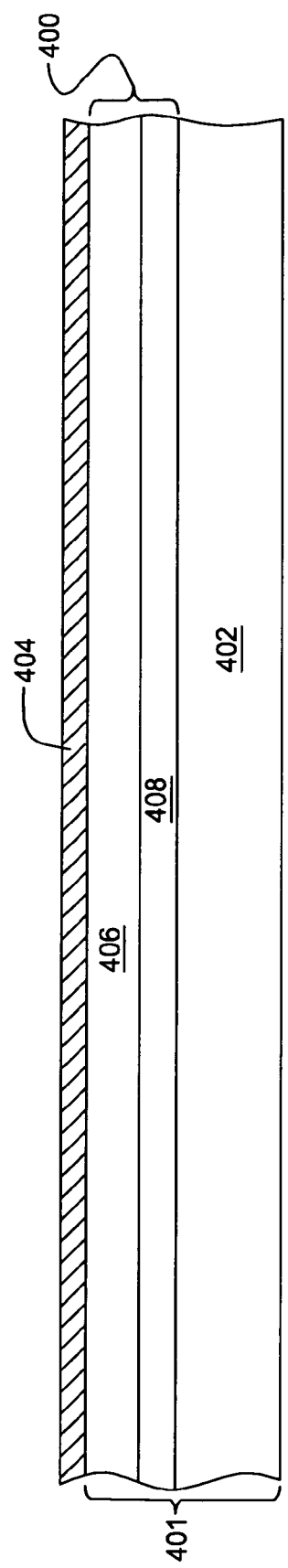
FIGS. 4A-4O are cross-sectional elevational views of process structures obtained during manufacturing of multichip modules, in accordance with an aspect of the present invention.
Figure 4B:
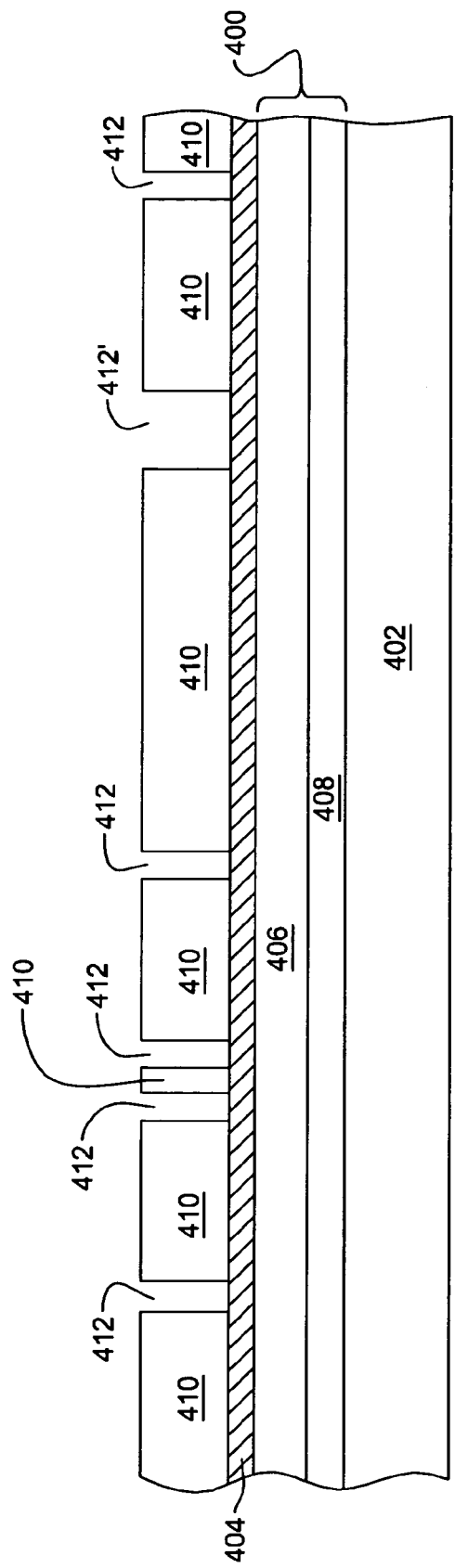
Figure 4C:
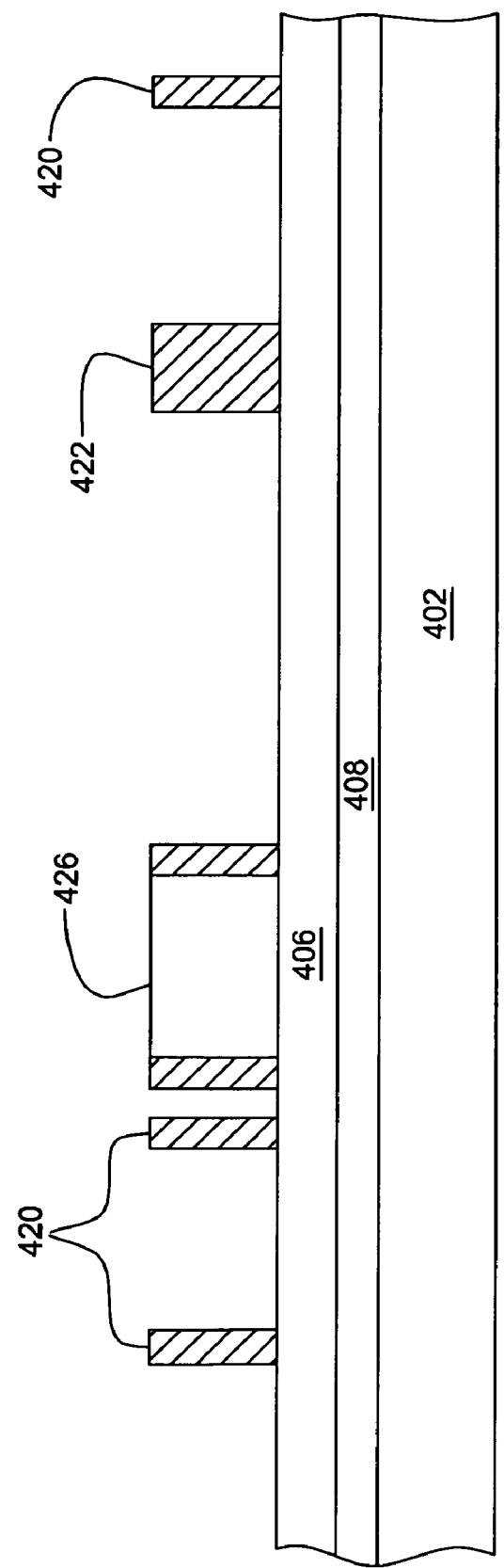
Figure 4D:
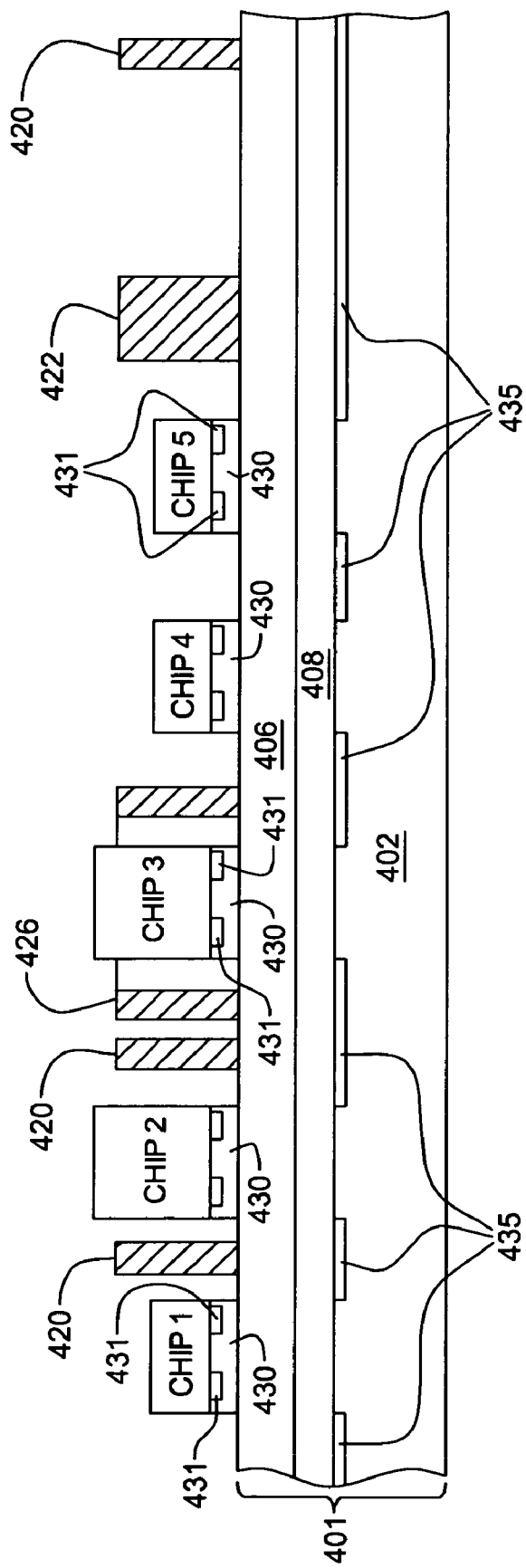
Figure 4E:
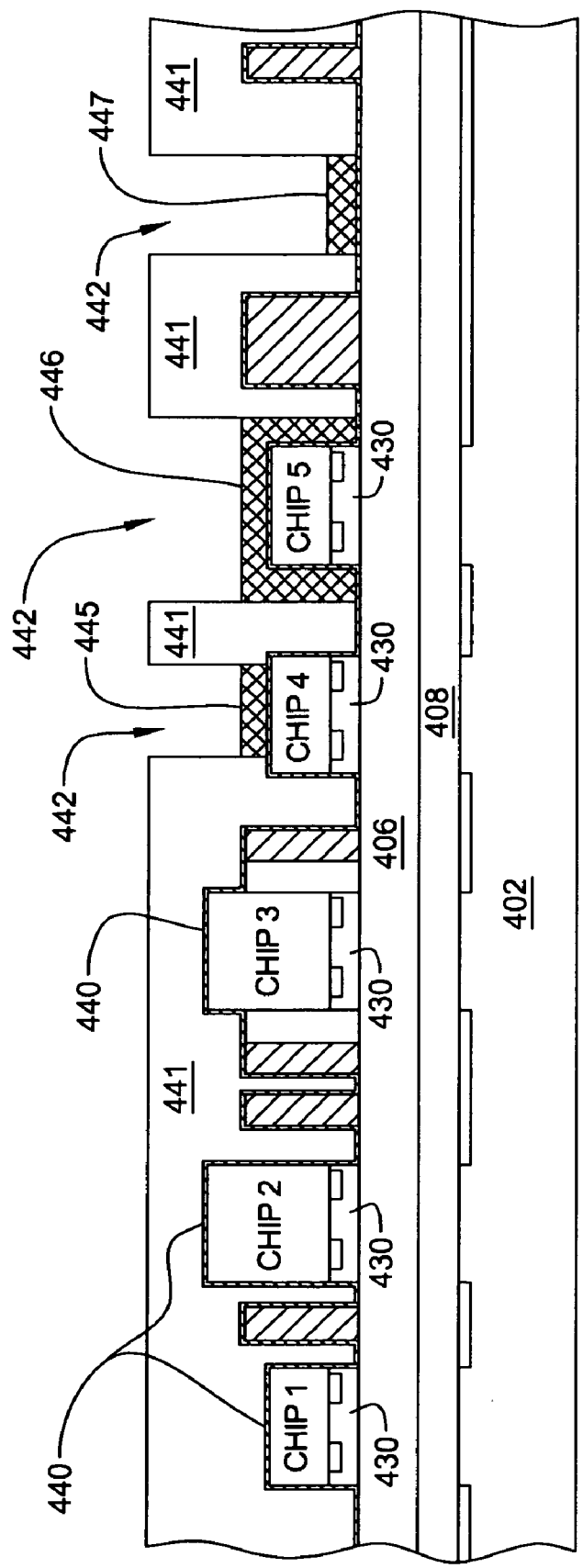
Figure 4F:
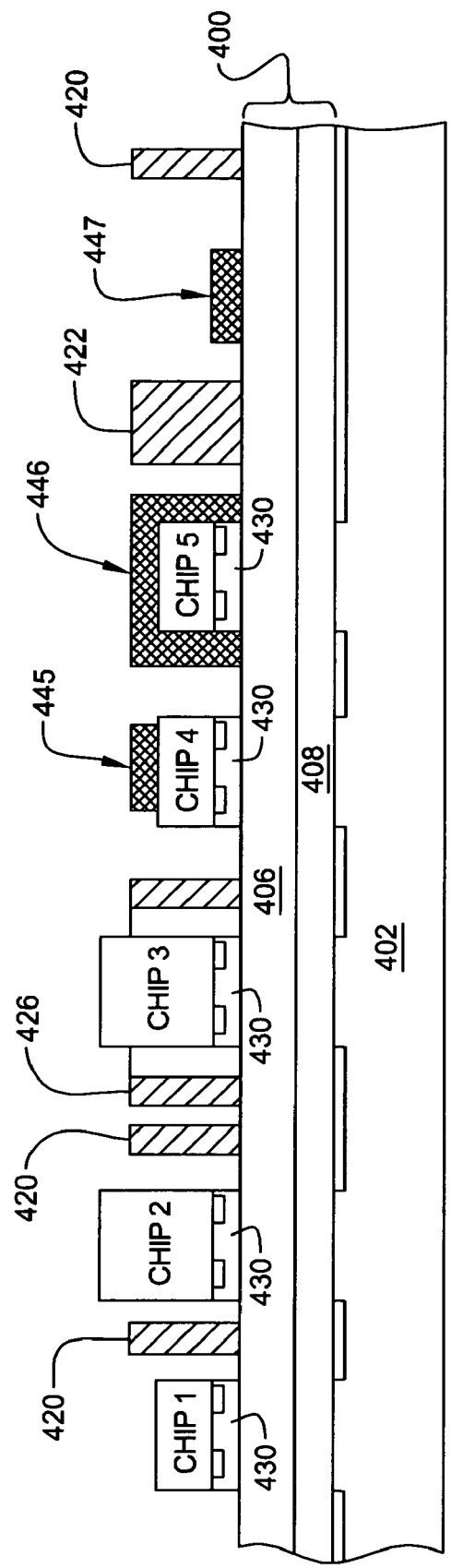
Figure 4G:
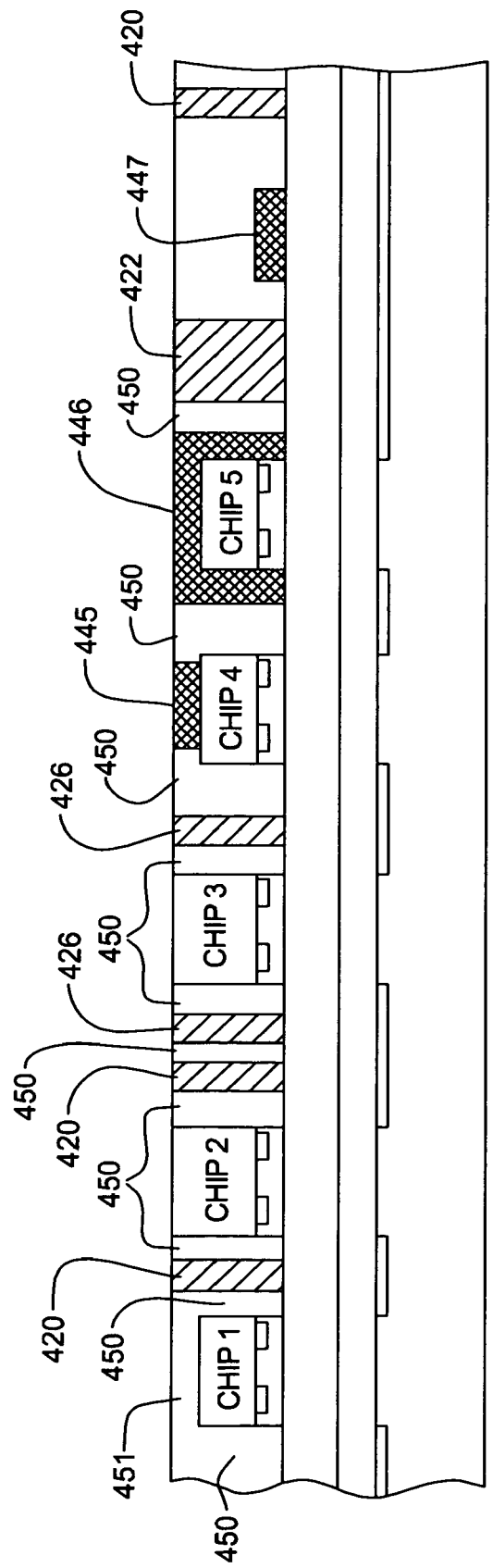
Figure 4H:
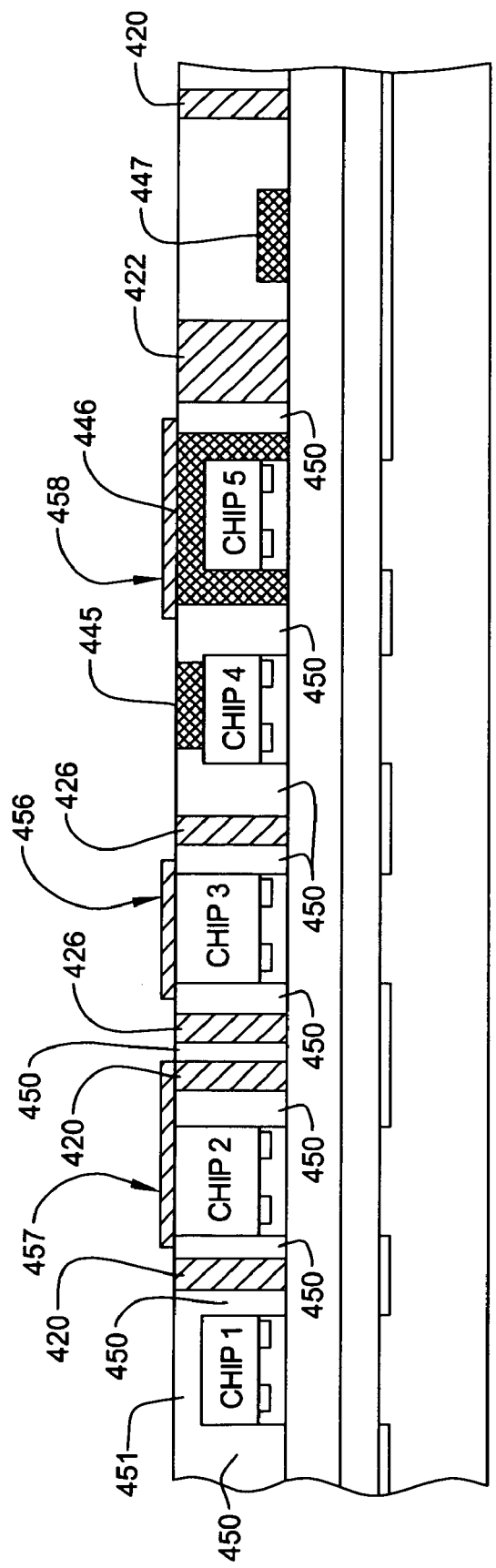
Figure 4I:
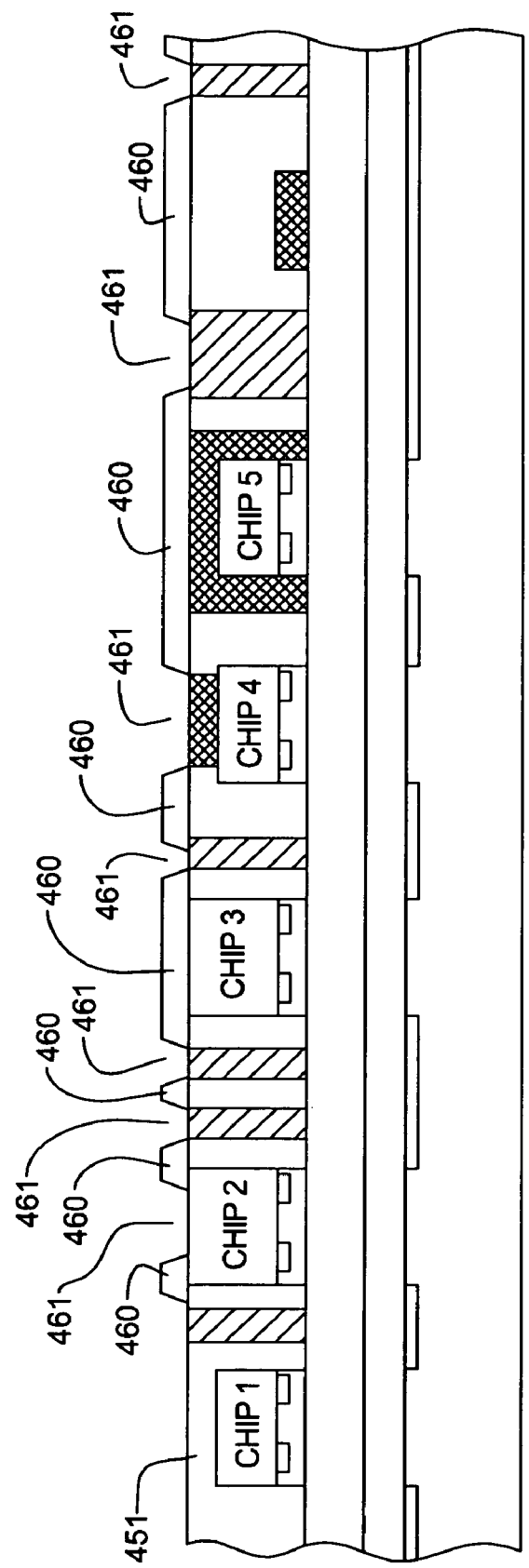
Figure 4J:
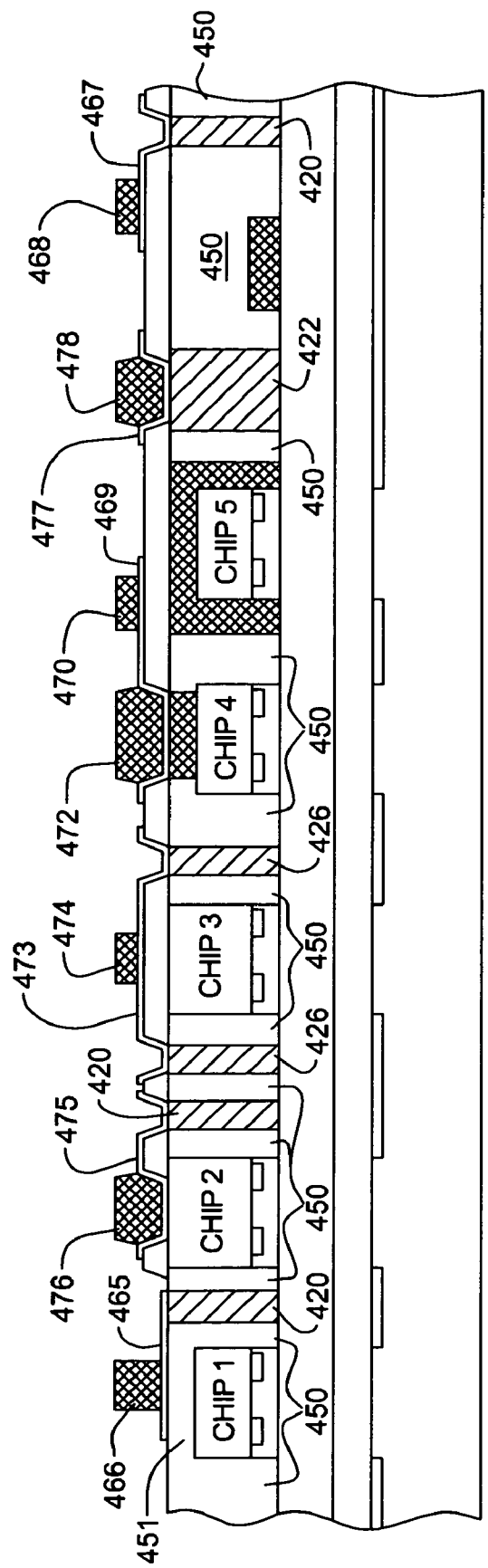
Figure 4K:
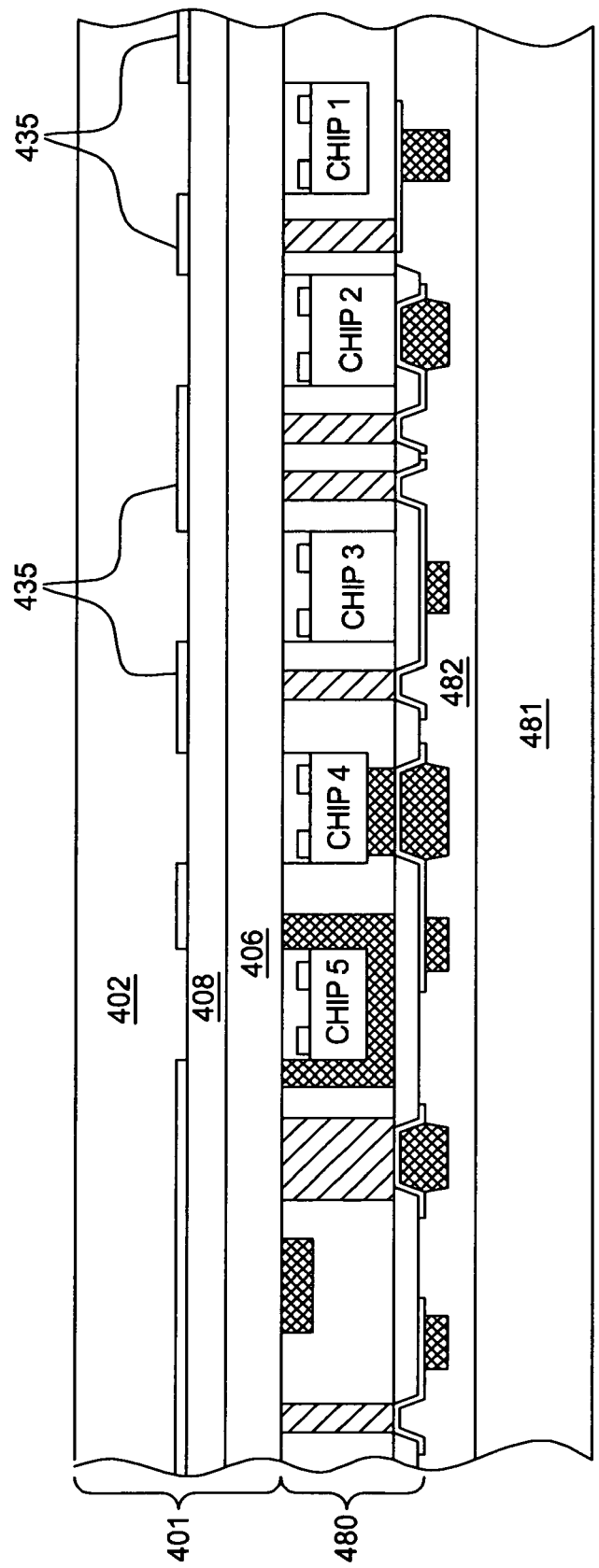
Figure 4L:
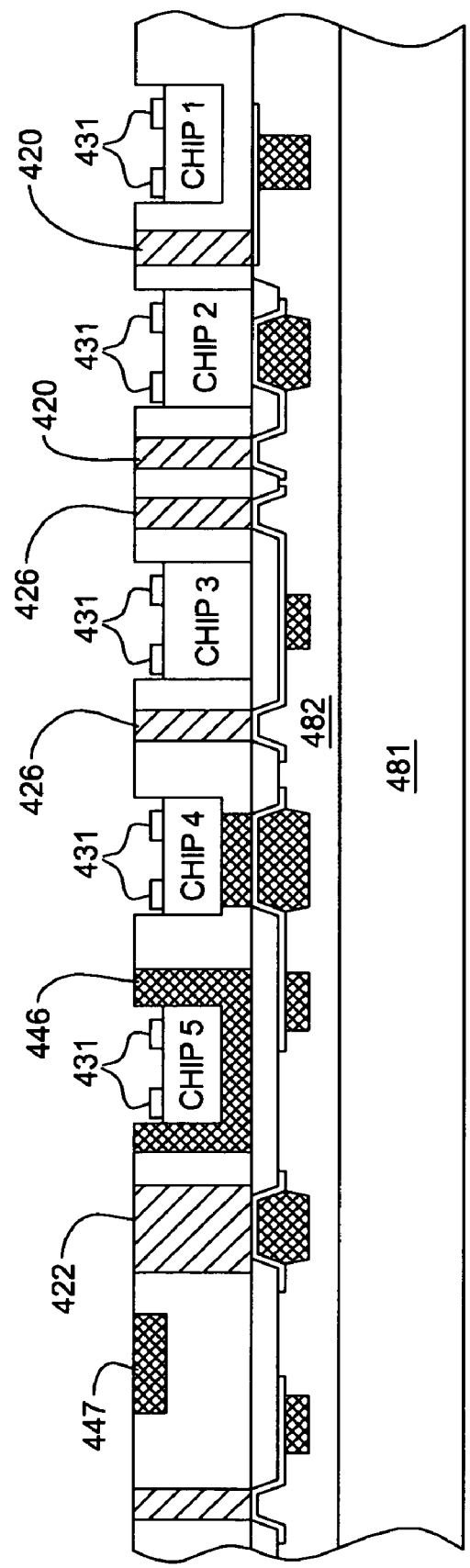
Figure 4M:
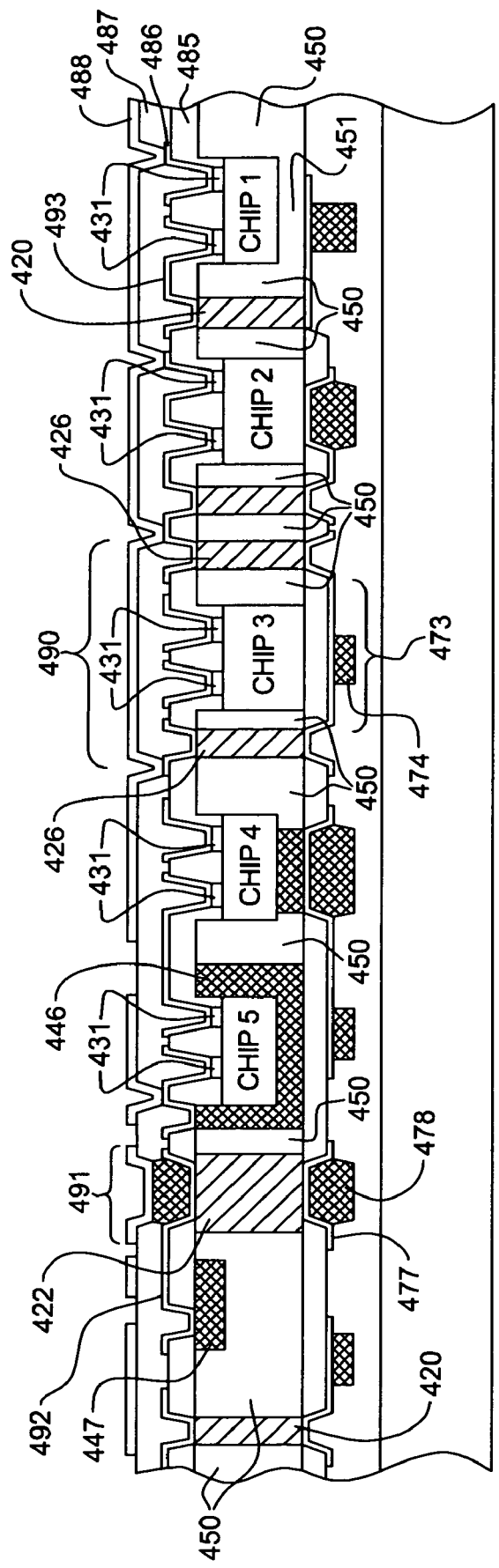
Figure 4N:
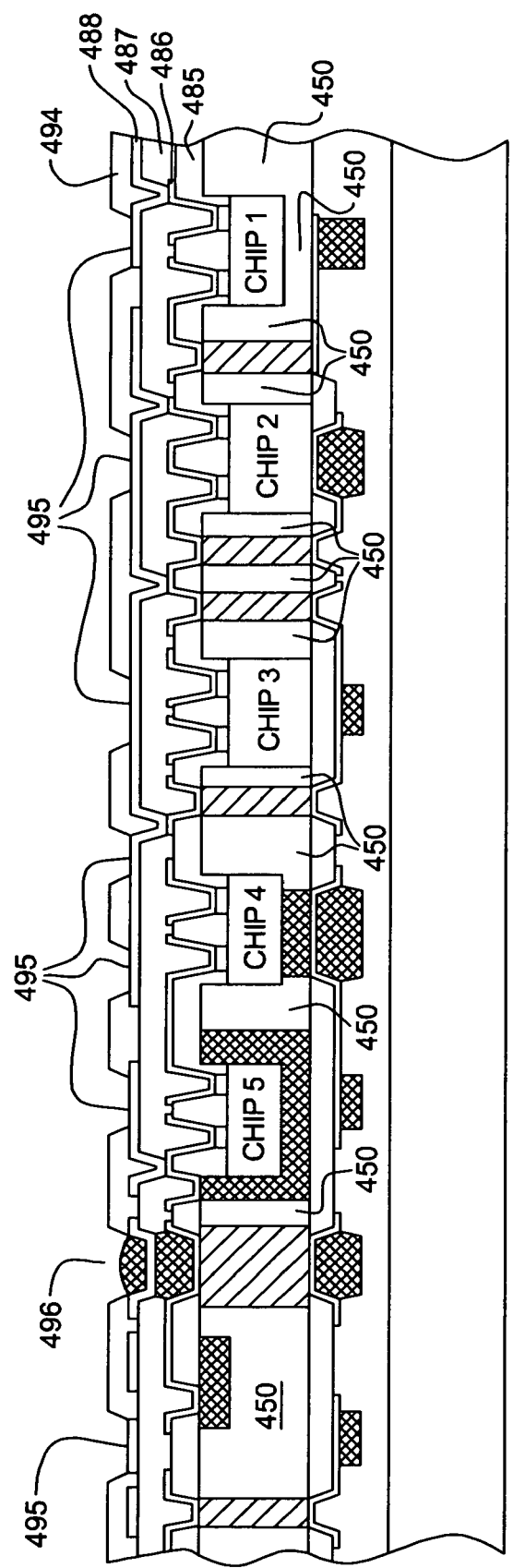
Figure 4O:
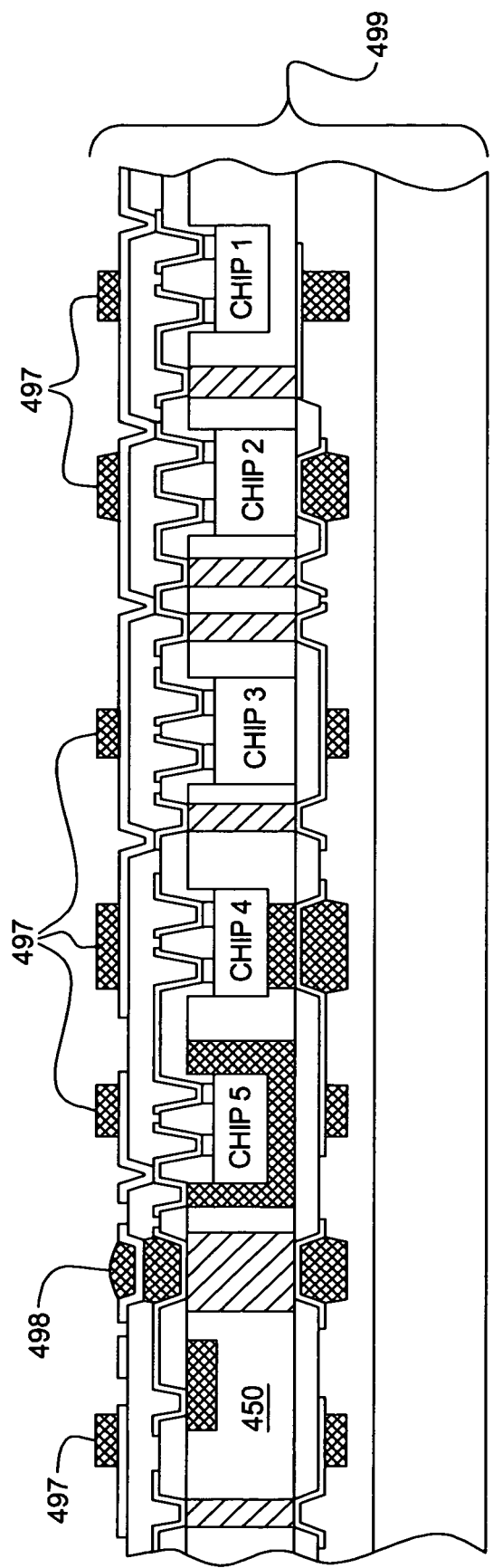

FIGS. 4A-4O show various process steps to achieving a chips-first base layer (also referred to herein as a multichip layer or a chip layer). Referring to FIG. 4A, an alignment carrier assembly 401 is provided in which a film 400 comprising a polyester film 406 and UV release adhesive 408 is adhesively bonded to the alignment carrier. In one embodiment, a UV release film such as Adwill D218 Available from Lintec of Tokyo, Japan, is laminated to a plain glass plate 402. U.S. Pat. No. 7,112,467 B2, entitled "Structure and Method for Temporarily Holding Integrated Circuit Chips in Accurate Alignment", which is hereby incorporated herein by reference in its entirety, describes fabrication of chips-first modules using such an alignment carrier. In that patent, a second adhesive is applied to the back of the exposed side of the UV release film and IC chips are placed face down into that adhesive. In the fabrication of the chips-first base layer of the present invention additional steps are added. In particular, structures such as through connects, bus bars, thermal conduction paths, and Faraday shields are provided integrated within the chips-first multichip layer.

After lamination of the UV release film to the glass plate, copper 404 is sputtered onto the exposed surface of the UV release film. In one embodiment, the actual sputtering operation includes providing a very thin adhesion layer of titanium. Sputtering is well known in the art. By way of example, the thickness of the titanium is 400 angstroms followed by 4000 angstroms of copper. In an alternate embodiment, a film that has UV release adhesive on one side and metallization precoated on the other side could be laminated to the glass plate. This saves the step of sputtering the individual panels. FIG. 4A shows an alignment carrier with UV release film bonded to a glass plate with copper coated on the film.

Referring to FIG. 4B, a thick resist layer is spray coated over the sputtered copper. The resist 410 is then exposed and developed to form openings 412, 412' in the resist. Thick resist materials with excellent aspect ratios are well known in the art and can be supplied in both positive and negative acting form. The pattern of resist openings determines what copper structures will be provided. By way of example, through vias are provided by small round openings. Faraday shield structures are provided either with a frame-like opening that will surround the device to be shielded or by a "picket fence" of closely spaced round openings. Thermal slugs are provided by a rectangular opening 412' in the appropriate location. FIG. 4B shows the patterned resist 410 with openings 412, 412' disposed over the copper coated UV release film. Copper is then electroplated to the thickness required by subsequent processing steps, generally to the final thickness of the encapsulant/filler which will be added in subsequent processing. The resist is then removed. After all resist is removed, the sputtered copper and titanium is removed by etching the copper in ammonium persulfate and etching the titanium in 5% TFT Etchant in DI water. TFT Etchant is available from Transene Corp. Rowley, Mass.

FIG. 4C shows the copper structures formed on the alignment carrier. Through connects 420 are cylinders that will provide a conductive path from the top to the bottom of the structural filler material. The Faraday shield structure 426 will form a copper enclosure for one or more devices that create or are sensitive to RF noise. The Faraday shield enclosure will be completed by subsequent processing of top (i.e., interconnect) and bottom (i.e., redistribution) layers discussed below. Thermal slug 422 provides a highly thermally conductive path between the top and bottom of the multichip layer.

Referring to FIG. 4D, a chip attach adhesive 430 is next applied to the exposed side of the UV release tape. This adhesive is, in one embodiment, an adhesive that can be cured by UV light, although other types of adhesive may be used. Details of using a UV release tape and UV cureable adhesive are given in U.S. Pat. No. 7,112,467 B2 incorporated above. The adhesive can be spray coated to the UV release film and dried of solvent at 50-75° C. for a period of 30 minutes in a forced hot air oven. By way of example, thickness of the adhesive is 3 to 6 microns.

Chips (e.g., Chip1, Chip2, Chip3, Chip4 & Chip5) are placed face down into the UV curable adhesive 430. The UV curable adhesive is exposed to UV light, e.g., 500 mJ/cm$^2$ at a fluence of 5 mW/cm$^2$. This particular material is air inhibited at the above fluence level such that it only cures under the chips where the air is excluded. After exposure, the adhesive is developed away in a spray developer using propanol as a developer. In an optional embodiment, the alignment carrier is provided with a masking pattern 435 that aligns openings with the placement of the chips. By exposing with a collimated UV source, the area under the chips is exposed while the area away from the chips is completely unexposed. This also has the advantage that alignment marks can be provided which allow for extremely accurate alignment of the chips on the alignment carrier.

FIG. 4D shows the alignment carrier assembly 401 with chips (Chip1, Chip2, Chip3, Chip4 & Chip5) positioned face down, with their contact pads 431 in the adhesive 430, and with the adhesive developed away in areas not under the chips. The alignment carrier is also provided with a masking pattern 435 that corresponds to the positioning of the chips. This masking pattern may be provided by the same processes that are well known for the formation of chrome on glass photomasks.

Referring to FIG. 4E, in a further optional embodiment a second sputtering step can be performed which covers the backs of chips and other exposed surfaces with a seed layer of copper 440. A resist is coated and patterned with openings at least partially over the backs of selected chips, and optionally, at least partially opening the resist over the alignment carrier region adjacent to selected chips. Resist 441 is shown with openings 442. Electroplating builds up the copper and forms thermal slugs 445 or high conductivity shells 446 around the chip for low inductance back-side connection or Faraday shielding. When the resist opening is over the film 406 of the alignment carrier assembly, a bus bar 447 is formed.

FIG. 4E shows the patterned resist with a second metal plated in the resist openings. At this point the resist is stripped and the copper seed metal is etched. FIG. 4F shows the chips adhesively bonded to the UV release film as well as the metallization structures formed by the first and second metallization steps.

Exposed chip surfaces, the copper structures, and the adhesively bonded film are next cleaned by wet cleaning and plasma etching followed by appropriate adhesion promotion steps to adhesion promote the copper as well as the chip surfaces. Filler/encapsulant, such as a liquid epoxy resin, is added to the module to cover all exposed surfaces on the back. To increase strength and improve the expansion match of the filler/encapsulant (i.e., the structural material) to that of the silicon chips, the filler/encapsulant can be loaded with an inert powder such as alumina or glass particles. The filler/encapsulant can be poured or dispensed onto the alignment carrier, or the alignment carrier may be covered at its outer edges or other locations on the carrier with a mold form and injection molded, or covered with a frame and frame molded. In one embodiment, the filler is dispensed by a liquid dispensing machine such as a CamALot Dispensing Machine available from CamALot Division of Cookson Electronic Equipment located in Franklin, Mass. The dispensing machine accurately dispenses the relatively high viscosity loaded epoxy to the edge of the alignment carrier. The viscosity keeps the filler from flowing off the carrier. This eliminates the need for molds or frames in the fabrication process. Alternatively, a mold may be used if it is required to contain the filler/encapsulant in cases where viscosity is low or where injection molding is used.

In one embodiment, a two-part epoxy system which can be cured at or near room temperature is used. The cured filler/encapsulant is then lapped to the appropriate thickness. In one embodiment, the filler and chips are thinned to a minimum thickness. This thickness is in the range of 50 to 100 microns. It is possible to go thinner than that thickness, but there is a tradeoff between lapping speed and final chip thickness. The finer the grit size the slower the lapping rate, but thinner chips can be made and still not be damaged. Noting that the chips are rigidly held by the alignment carrier, there is no penalty in going very thin except the economy of lapping very slowly or using multiple grit sizes. In any event, the lapping exposes the through connects and thermal slugs for further processing. Alternatively, if the chips are adequately thinned before application of the filler/encapsulant, then the filler/encapsulant can be lapped to a thickness that is greater than the chips, but that still exposes through connects and thermal slugs. Practical molding techniques could also achieve this without a lapping step to thin the filler/encapsulant.

FIG. 4G shows both of these cases in cross section in the same multichip layer. Note that Chip1 is thinner than the final thickness of the filler/encapsulant 450. The filler/encapsulant covers the back of this chip as well as the sides. The area of encapsulant that is thicker than Chip1 is denoted 451. Chip2 and Chip3 are thinned during lapping of filler/encapsulant 450, and thereby are the same thickness as the filler/encapsulant, so that filler/encapsulant only contacts the sides of these chips. Likewise, Chip4 and Chip5 have copper structures that are partially thinned with the filler/encapsulant lap and are thereby the same thickness. Note also that the through connect 420, Faraday shield 426, thermal slug 422, backside thermal slug 445, and low inductance backside connect 446 structures are uncovered by the lap operation so that electrical or thermal connection may be made to these structures.

Adding Redistribution Interconnect

In the next processing steps, one or more redistribution interconnect layers (generally referred to herein as the "redistribution layer") are provided that connect the exposed copper to other locations on the bottom of the multichip layer. Alternative processing is used depending on the desired structure.

In one optional but novel embodiment, copper is sputtered over the exposed back surface. The actual sputtering operation includes providing a very thin adhesion layer of titanium. Sputtering is well known in the art. By way of example, the thickness of the titanium is 400 angstroms, followed by 4000 angstroms of copper. Next, a resist layer is spray-coated over the sputtered copper. The resist is then exposed and developed to form openings in the resist. Resist materials with excellent aspect ratios are well known in the art and can be supplied in both positive and negative acting form. The pattern of resist openings determines what copper structures will be provided. Next, copper is electroplated in the openings (for example, to a thickness of 3 to 12 microns). The resist is then removed by methods well known in the art and depending on whether a positive or negative resist is used. This is followed by removal of the sputtered copper and titanium seed layer by etching the copper in ammonium persulfate and etching the titanium in 5% TFT Etchant in DI water. TFT Etchant is available from Transene Corp., of Rowley, Mass. FIG. 4H shows the resulting structure. Two copper structures are fabricated. Copper structure 456 covers all of the back of Chip3 and extends beyond the chip to the filler/encapsulant material. This structure provides a strengthening function by bridging from the chip to the filler/encapsulant. When the modules are in final form, stress is induced on the interface between the chip edge and the filler/encapsulant. The copper strengthening member securely holds this interface together. Copper structure 457 provides the same strengthening function and additionally connects electrically from the back of the chip to a through-connect. Structure 458 provides a strengthening function by bridging from the copper covered back of Chip4 to the filler/encapsulant. The strengthening function is especially valuable as the overall thickness of the module is decreased. Throughout the remaining discussion, structures 456, 457 and 458 may be left in place or, optionally, the steps outlined above may be eliminated without impacting the other structures to be described. In the interest of clarity, optional structures 456, 457 and 458 are not shown.

In one embodiment, a dielectric is added to the back side and openings are provided in the dielectric. The dielectric is applied as a liquid, dried and then hardened in all areas except the openings by exposing the material through a photomask with collimated UV light. As an example, the material is a low modulus high elongation dielectric such as described in U.S. Pat. No. 6,426,545 B1, entitled "Integrated Circuit Structures and Methods Employing a Low Modulus High Elongation Photodielectric" which is incorporated herein by reference in its entirety. Details of suitable processing and material formulations are explained in U.S. Pat. No. 6,426,545 B1, which is hereby incorporated herein by reference in its entirety.

FIG. 4I shows a dielectric layer 460 with patterned openings 461 overlying the copper structures exposed by the above mentioned lapping steps. The advantage of using a low modulus high elongation material is that it relieves the stress caused by a mismatch in expansion coefficient between the module and the circuit board to which it is attached. This allows the solder balls or contact bumps to be much thinner than would be required with a rigid dielectric. Alternatively, other photo-patternable and non photo-patternable in situ formed dielectrics such as epoxy or BCB could be used. In addition, a fully cured material (such as polyimide) may be adhesively bonded in place to form the dielectric layer. For example, kapton polyimide may be adhesively bonded in place to form the dielectric layer. In cases where the material is not photo-patternable, the openings can be formed by laser ablation or by reactive ion etching. Both techniques are well known and suitable parameters for the polymer dielectrics described above are described in the via formation discussion of the above-incorporated U.S. Pat. No. 5,250,843. Alternatively, if the encapsulant is thicker than the associated chips as depicted by area 451, then the encapsulant may be used as the dielectric layer.

FIG. 4I shows the patterned dielectric with openings as described above. Note that Chip1 is thinner than the filler/encapsulant so that the encapsulant itself may act as an insulating dielectric. In FIG. 4I, the opening in the dielectric 460 extends entirely over the area above Chip1. In this way, both the dielectric and filler/encapsulant structures may be fabricated at the same time. Next, a seed layer of copper is sputtered over dielectric 460 and into the openings 461. In one embodiment, the actual sputtering operation includes providing a very thin adhesion layer of titanium. Sputtering is well known in the art. Thickness of titanium may be 200 angstroms followed by 4000 angstroms of copper. A resist layer is spray coated over the sputtered copper. The resist is then exposed and developed. Resist materials with excellent aspect ratio are well known in the art. The pattern of resist openings determines what copper structures will be formed. One example is an interconnect that distributes from the exposed through connections to positions where connection pads or bumps are to be disposed.

Faraday shield structures are provided by an opening that defines metallization behind the chip and also connects to the previously defined Faraday shield structure in the filler/encapsulant. Connections to the back side of chips are provided by openings behind exposed chip surfaces and patterns to the through connects. Thermal slugs are provided by an opening located over the backs of chips. Thermal continuation slugs can be provided by openings over the copper slug in filler/encapsulant previously provided. The copper is electroplated to the thickness required by subsequent processing steps. For example, the copper may be plated to a thickness of 6 to 12 microns. The resist is removed by methods well known in the art and depending on whether a positive or negative resist is used. A second layer of resist is applied and patterned to provide built up copper in the area where I/O pads, or I/O bumps are desired and also in the areas where thermal slugs are desired. Copper is electroplated to a thickness of, for example, 12 to 50 microns to accommodate the various structures described. The second layer of resist is removed followed by removal of the sputtered copper and titanium seed layer by etching the copper in ammonium persulfate and etching the titanium in 5% TFT Etchant in DI Water. TFT Etchant is available from Transene Corp. of Rowley, Mass.

FIG. 4J shows a cross section of the structure with patterned copper for redistribution from the through connects to I/O structures such as bumps or pads, connection to the back side of components, thermal slugs through the filler/encapsulant and also to the back of chips, and direct patterning of redistribution on the filler/encapsulant. Patterned metal 465 redistributes connection from a through connect 420 to an I/O pad 466. This redistribution is insulated from Chip1 by the filler/encapsulant itself area 451. Patterned metal 467 redistributes from a through connect 420 to an I/O pad 468. Redistribution interconnect 469 makes electrical interconnection from I/O pad 470 to the back of Chip4 by contacting electrical contact and thermal slug 445 (see FIG. 4G). A high conductivity thermal path is shown by the plated area 472 which directly contacts metal 469 and slug 445. The redistribution interconnect provides a capping structure 473 on the bottom side of the enclosure contacting Faraday shield structure 426. Through this structure, the back of Chip3 is covered by the capping structure 473 and the sides are covered by metallization 426 in the filler/encapsulant. Pad 474 provides electrical connection to the Faraday shield structure. Redistribution metallization 475 makes interconnection from through connect 420 to the back of Chip2 as well as to pad 476. Note also that thermal connection is also provided from the back of Chip2 to thermal slug 476. A high thermal conductivity path is provided through the filler/encapsulant 450 by the combination of plating structures 477, 478, making contact to thermal slug 422.

Attaching Process Carrier and Initiating Processing on Top Side

At this point, processing on the top of the chips-first structure may be initiated. This is begun by attaching a process carrier to the back, which will facilitate handling of the very thin chips-first structure. It will also maintain accurate spacing between chips and will facilitate processing alignment when processing large panels. FIG. 4K shows a process carrier 481 attached to the multichip layer of FIG. 4J by adhesive 482. This process carrier is (in one embodiment) a plain glass panel that has been slightly roughened on one side to improve adhesion. The dielectric and metal on the module attached to the alignment carrier (as shown in FIG. 4J) is pre-coated with a layer of adhesive. In one embodiment, a high temperature epoxy that can be cured at or near room temperature is used. This material is coated to a thickness of, for example, between 12 and 50 microns by spin or spray coating. The material is cured until solid but not completely cured. An epoxy that cures in 24 hours at room temperature is coated then baked on a hot plate for 30 minutes at 75° C. to achieve this solid, but not fully cured objective.

Figure 5B:
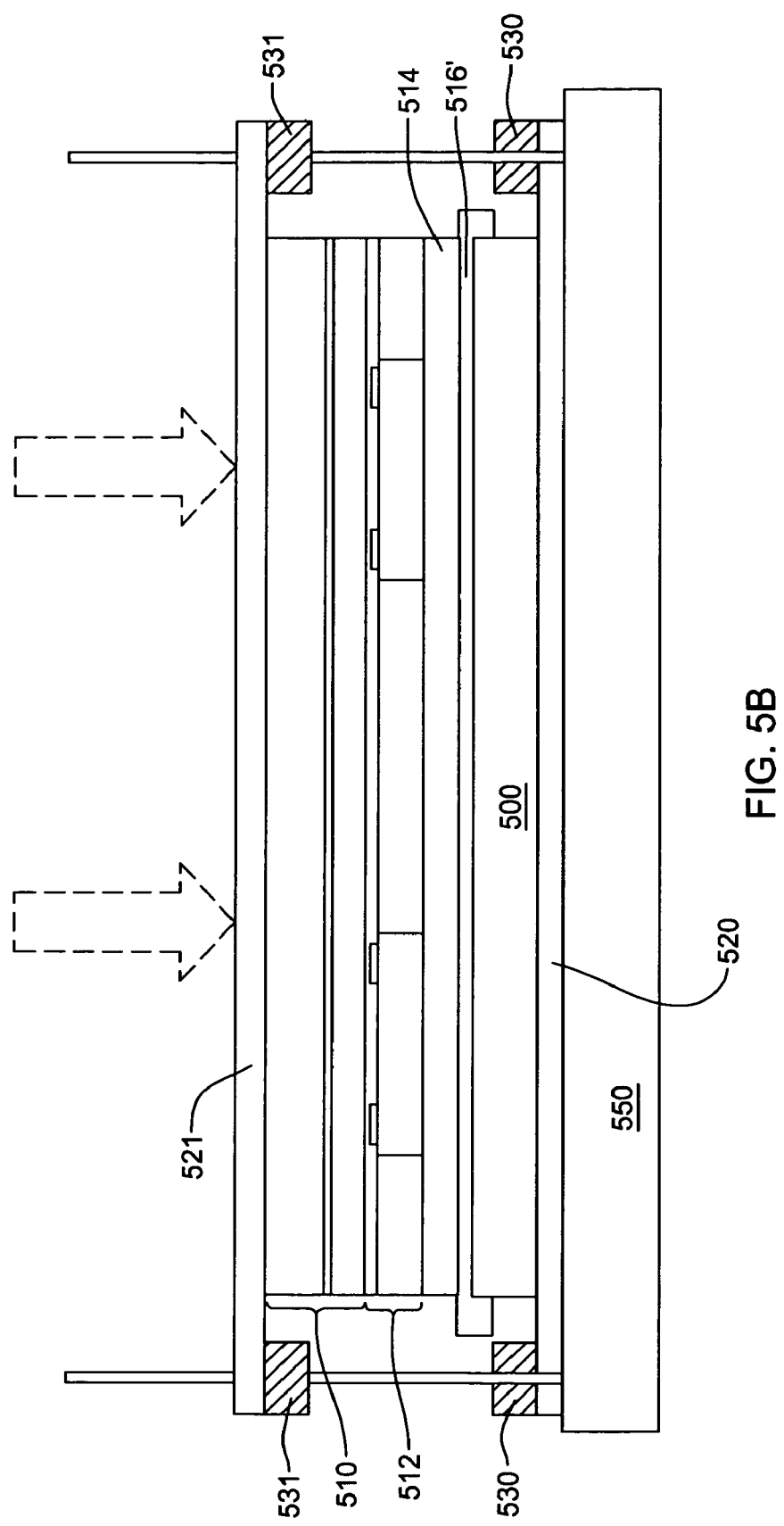

The next steps of the process may be understood with reference to FIGS. 5A and 5B. These figures show a representative module 512 attached to an alignment carrier assembly 510 with a partially cured adhesive 514 coated to the back side of module 512. Next, the process carrier 500 and alignment carrier assembly 510 are bonded by low adhesion tape 520 and 521 into open frames 530 and 531. Such a process is well know in the art for the purpose of holding wafers when they are diced by a dicing saw. A frame bonder that is suitable for this use is sold by Semiconductor Equipment Corp. of Moorpark, Calif. Various sizes and configurations can be supplied to accommodate different size substrates and to allow contact or non contact to the front face of the taped substrate. Low tack tape is also available from the same company. The frames are available from the companies that sell dicing saws. A suitable dicing frame may be purchased from Disco Corp. of Tokyo, Japan. Frames to 300 mm or larger are available. The process carrier frame 530 is then placed on a fixture 550 that holds the frame in alignment by way of alignment pins 552 and thereby holds the process carrier in alignment. The same liquid, high temperature epoxy adhesive 516 is then applied to the center of the process carrier. The alignment carrier frame 531 is placed on the same fixture such that the two untaped surfaces face one another.

Referring to FIG. 5B, the fixture 550 is then placed into a laminating press and pressure is applied. This squeezes the adhesive into a thin uniform film 516' and bonds the process carrier 500 to the bottom of the partially processed chips-first base 512. The total glue line thickness is primarily dictated by the thickness of the pre-applied and partially cured coating 514. After the adhesive has bonded the process carrier 500 to the chips-first base 512 the fixture is removed from the laminating press and the low tack tape 520 and 521 is removed from both the alignment carrier and the process carrier. The low tack tape and frame thus serve the dual purpose of holding the process carrier and alignment carrier in alignment and also containing any run off of the adhesive.

Returning to FIG. 4K, the process carrier 481 is shown attached to the partially processed chips-first base 480, which is still attached to the alignment carrier assembly 401. At this point the alignment carrier is separated from the partially processed chips-first base. This is done by exposing the adhesive 408 to UV light which decreases the adhesion of the UV release tape to the glass alignment carrier. It should be noted that this exposure of the release tape to UV light can be done anytime after the tape has been laminated to the alignment carrier. The residual adhesion is sufficient to maintain accurate positioning through the subsequent processing steps. In fact, in the case where the alignment carrier has a mask 435, as described above, it is necessary to expose the UV release tape before the opaque filler/encapsulant is applied. This exposure is from both sides since the mask prevents light from reaching some significant areas from the masked side. The alignment carrier can be easily removed by prying from a corner. Moderate heating of the assembly at this point aides the removal process as it slightly softens the adhesives and makes separation easier. Additionally, the removal process is aided by making process carrier 481 just slightly smaller than the alignment carrier. This prevents the adhesive that is squeezed out during the lamination operation from adhering to the alignment carrier edges. If the adhesive does contact the edge of the alignment carrier it bonds the two carriers and the edges and hampers separation. The separation occurs at the UV release adhesive 408 to alignment carrier glass 402 interface and therefore leaves the UV release film attached to the top of the partially processed chips-first module. At this point, a corner of the film is engaged and peeled in a 90 degree peel. This whole process works because of the difference between the adhesion over the area of chips and the adhesion of the film that is being peeled. It should be noted that the adhesion is quite sufficient to hold the chips in accurate position due to high shear capability of a thin glue line over the area of the chips. When a 90 degree peel is initiated the adhesive gives up readily as the adhesive force of the very thin adhesive is spread over a concentrated area of the bend point of the peel.

Any residual adhesive left on the chips is now cleaned off. The first step is to soak the structure in acetone which lifts the cured adhesive film from the tops of the chips. The second step is a light plasma etch, with either $O_2$ or $O_2/CF_4$ (70/30) to remove any residual adhesive that was not removed by the acetone soak. The final step is cleaning by wet processing which removes any residual ions such as sodium and chloride from the surface of the chips. FIG. 4L shows a cross-sectional view of the chips-first base ready for application of the one or more interconnect layers (generally referred to herein as the "interconnect layer") above the chips. Note that the top of the through connects 420, copper bus bars 447, copper Faraday shielding layers 426, low inductance chips backside connection 446, and thermal slug 422 are exposed, as well as pads 431 of the chips.

Adding the Interconnect Above the Chips

In one embodiment, the interconnect layer starts with a layer of low modulus high elongation dielectric containing openings down to pads of the chips and down to the copper through connects and copper bus bar. This dielectric is applied as a liquid, dried and hardened in all areas except the openings by exposing through a mask with collimated UV light. Details of processing and formulations of low modulus high elongation dielectrics are again given in the above-incorporated U.S. Pat. No. 6,426,545 B1.

Alternatively, other photo patternable and non photo-patternable in situ formed dielectrics such as epoxy or BCB could be used. In addition, a fully cured material such as kapton polyimide may be adhesively bonded in place to form the dielectric layer. In cases where the material is not photo-patternable, the openings can be formed by laser ablation or by reactive ion etching. Both techniques are well known and suitable parameters for the polymer dielectrics described above are described in the above-incorporated U.S. Pat. No. 5,250,843.

Next, a seed layer of copper is sputtered over the dielectric and into the openings to make connection to the IC chip pads and other copper structures in the encapsulant. In one embodiment, the actual sputtering operation includes providing a very thin adhesion layer of titanium. Sputtering is well known in the art. The thickness of titanium may be 200 angstroms, followed by 4000 angstroms of copper. A resist layer is coated over the sputtered copper. The resist is then exposed and developed. Resist materials with excellent aspect ratio are well known in the art. The resist is patterned with openings where the copper interconnect runs are desired. The copper is then electroplated to the thickness required by subsequent processing steps. A thickness of 6 to 12 microns may be used. The resist is removed by methods well known in the art and depending on whether a positive or negative resist is used. The sputtered copper and titanium is removed by etching the copper in ammonium persulfate and etching the titanium in 5% TFT Etchant in DI water. TFT Etchant is available from Transene Co. of Rowley, Mass. In the area where a thermal slug is desired two alternatives may be used.

Without adding any processing steps the area above the thermal slug that goes through the filler/encapsulant can be patterned with tightly spaced vias at the same time that the rest of the interconnect is patterned. For maximum performance, an additional resist step can open an area above the thermal slug as was done on the other end of the slug. Again, copper is electroplated and resist removed. After removal of resist, the sputtered copper and titanium is removed by etching the copper in ammonium persulfate and etching the titanium in 5% TFT Ecthant in DI water.

Additional interconnect layers can be patterned by repeating the steps of applying dielectric, patterning openings in the dielectric, sputtering copper, applying photo resist, patterning the resist, electroplating the copper and stripping the resist and etching the sputtered seed layer. FIG. 4M shows a cross section of two layers of dielectric and interconnect. Dielectric1 485 with Metal1 486 makes direct connection to the exposed areas shown in FIG. 4L. Dielectric2 487 with Metal2 488 forms additional interconnect structures. Interconnect in area 490 completes the Faraday shield enclosure. Specifically, capping structure 473 forms the bottom/top of the enclosure and makes connection to the Faraday shield side structures 426. Structures 426 lie in the filler/encapsulant 450 and surrounds Chip3 on the sides. Capping structure 490 completes the enclosure above/below Chip3 and makes connection to the top end of Faraday shield side structures 426. A complete ground enclosure is thus formed at the same time and with the same processing steps as the through connects and other interconnect and redistribution layer interconnects.

A high conductivity path through the filler/encapsulant 450 is provided by structure 491 connected to slug 422 and back side elements 477 and 478. This thermal path facilitates heat removal from a device to be soldered in place above. Interconnect structure 492 provides interconnection to the bus bar 447. Interconnect structure 493 makes connection from a through connect 420 to chip pads 431 of Chip1 showing direct connection from a chip to the other side of the filler/encapsulant. When all interconnect layers are completed, there are two possible finishing steps depending on the final use of the module. In one embodiment, a solder mask is applied, for example, by spray coating. Solder mask type LP2 available from Rogers Corp. of Chandler, Ariz., may be used. The mask is coated, for example, to a thickness of 25 microns. Mixing, coating drying, exposure, development, and post bake are all done in accordance with the specifications of the manufacturer. Openings in the solder mask expose the solder landing pads for surface mounting of components, and for attachment of heat removal slugs associated with components requiring heat removal through the chips-first base. FIG. 4N shows the structure of FIG. 4M with solder mask 494 added and openings for electrical connection 495 and thermal connection 496.

In an alternative embodiment, it is desired to have no solder mask at this point, but rather have an array of solder landing pads. This is accomplished by stripping the resist when the final layer is processed, then applying another layer of resist and patterning holes where the solder landing pads are desired. Copper is electroplated to form the pads followed by stripping the resist and etching the seed layer. FIG. 4O shows this alternative structure generally denoted 499. Land pads 497 are for electrical connection and pads 498 are for thermal connection.

At this point, the chips-first base portion of the structure of FIG. 4N or 4O can be tested. The advantage of testing at this stage is that if the interconnect or components in the chips-first base layer for a given module are found to be defective, then further population of that module with additional components can be halted. This way the value of the unpopulated components can be saved by not associating them with an ultimately defective module.

Adding Devices of the Second Layer

The devices of the second layer are next added. Starting with the module of FIG. 4N, solder paste is screen printed onto the base layer over openings 495 and 496 in the solder mask. Stencil printing solder paste is well known in the art. Second layer devices are placed with their bumps or pads disposed within the solder paste. The assembly is placed into a reflow oven and heated on a rapid ramp to just above the melting point of the solder, which melts the solder to complete the electrical interconnection between the second layer devices and the chips-first base layer.

Figure 6:
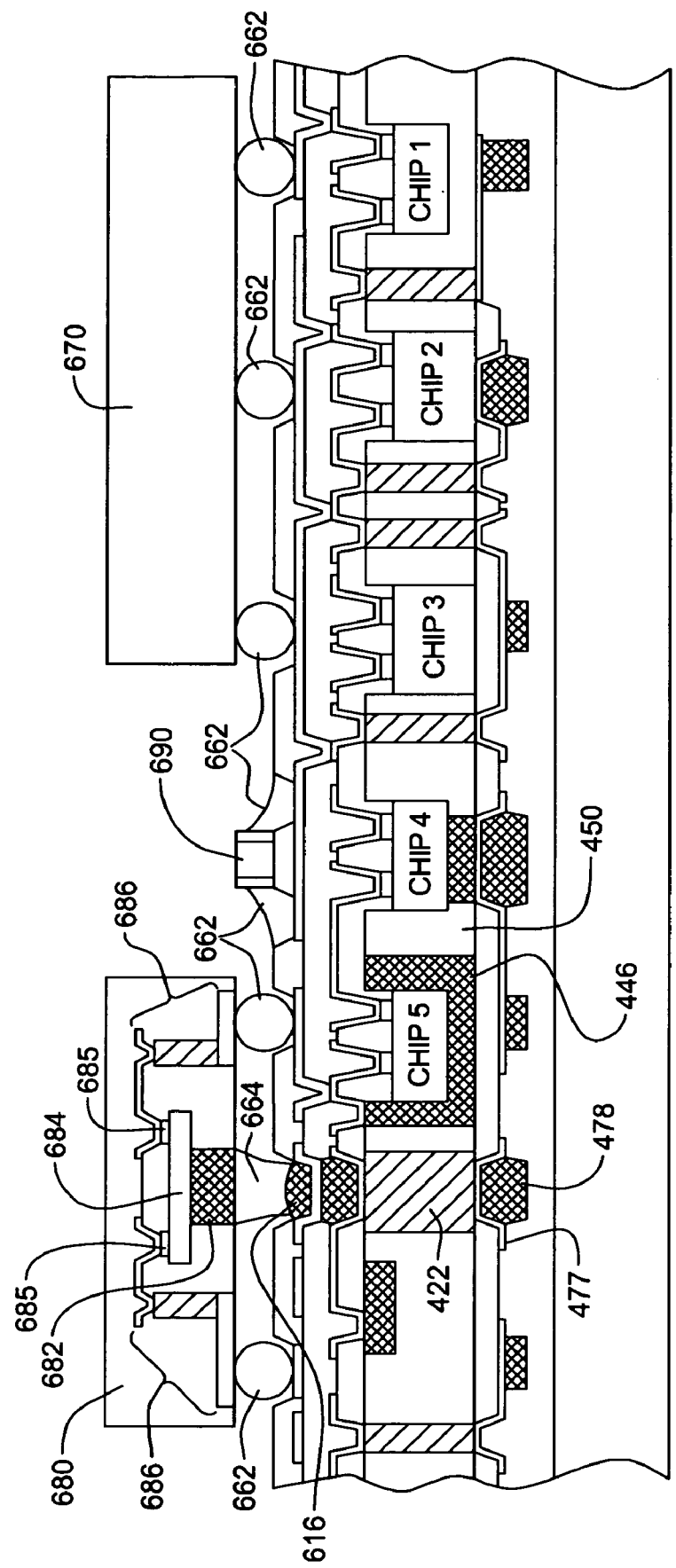
FIG. 6 is a detailed cross-sectional elevational view of one embodiment of a multichip module, in accordance with an aspect of the present invention.

FIG. 6 shows the chips-first layer with second layer devices attached electrically 662 and thermally 664. Note that a thermal conduit is formed under a thermal slug of the second layer devices by solder melting to provide an all metallic path for heat flow from the second layer devices through the structural encapsulant of the chips-first base. Although one mode is to use solder to interconnect the chips-first base to second layer interconnect, it is also possible to screen print conductive epoxy, and then place the bumps or pads of the second layer devices into the conductive epoxy and cure the conductive epoxy. Another method is to dip the solder bumps of some or all of the second layer devices in flux and place them bumps down on the chips-first base. Solder paste is not required where flux dipped bumps are used. The same reflow process that was used to reflow the solder paste can at the same time reflow bumps that are just flux dipped. This method is of value when stacks of devices are assembled since it is difficult to print solder paste on an uneven surface. It should also be noted that the use of the high elongation low modulus dielectric on the chips-first base and/or over the second layer devices allows the solder bumps to be extremely thin. This is because substantially all the strain is taken up in the dielectric and little strain is transmitted to the bumps. This allows the structure to be considerably thinner.

In the example shown in FIG. 6, two bumped modules are illustrated as part of the second layer. It should be understood that there are a vast variety of modules that could be used, such as: chip scale packages, conventional bumped packages and modules, stacked packages, bumped chips, SAW modules and essentially any device that may be surface mounted to a circuit board. Additionally one or more of the incorporated modules could be a subsystem module which was previously fabricated according to this application. One of the modules 670, which is representative of a generic module and could be any of the above mentioned modules, includes solder bumps or pads that interconnect the module to the multichip layer.

Module 680 is depicted as a module optimized for heat removal. Such a module may be formed by the processing steps disclosed herein. Some of the salient internal structure of this module is shown in FIG. 6. Chip 684 is mounted such that the back side is connected to thermal slug 682, which allows both electrical and intimate thermal contact to chip 684. Structure 686 makes electrical connection from the top chip pads 685 to bumps/pads 662 on the bottom of the module. A continuous highly thermal conductive path is provided by copper slug 682, solder bump 664, structure 616, slug 422 and the back side structures 477 and 478. To further generalize the structure, a surface mount component 690 is shown. This component represents components such as resistors, capacitors, inductors, crystals etc. that are required in a complete system and not incorporated in one of the integrated modules.

Adding Encapsulant and Stiffener

In one embodiment, an encapsulant layer is added to provide mechanical rigidity to the module and to provide a flat surface for improved handling by automated equipment. The encapsulant may be added alone or with a rigid stiffening member. Using the rigid stiffening member is advantageous if the module is to be of minimum thickness since practical encapsulants are not as stiff for a given thickness.

Figure 7A:
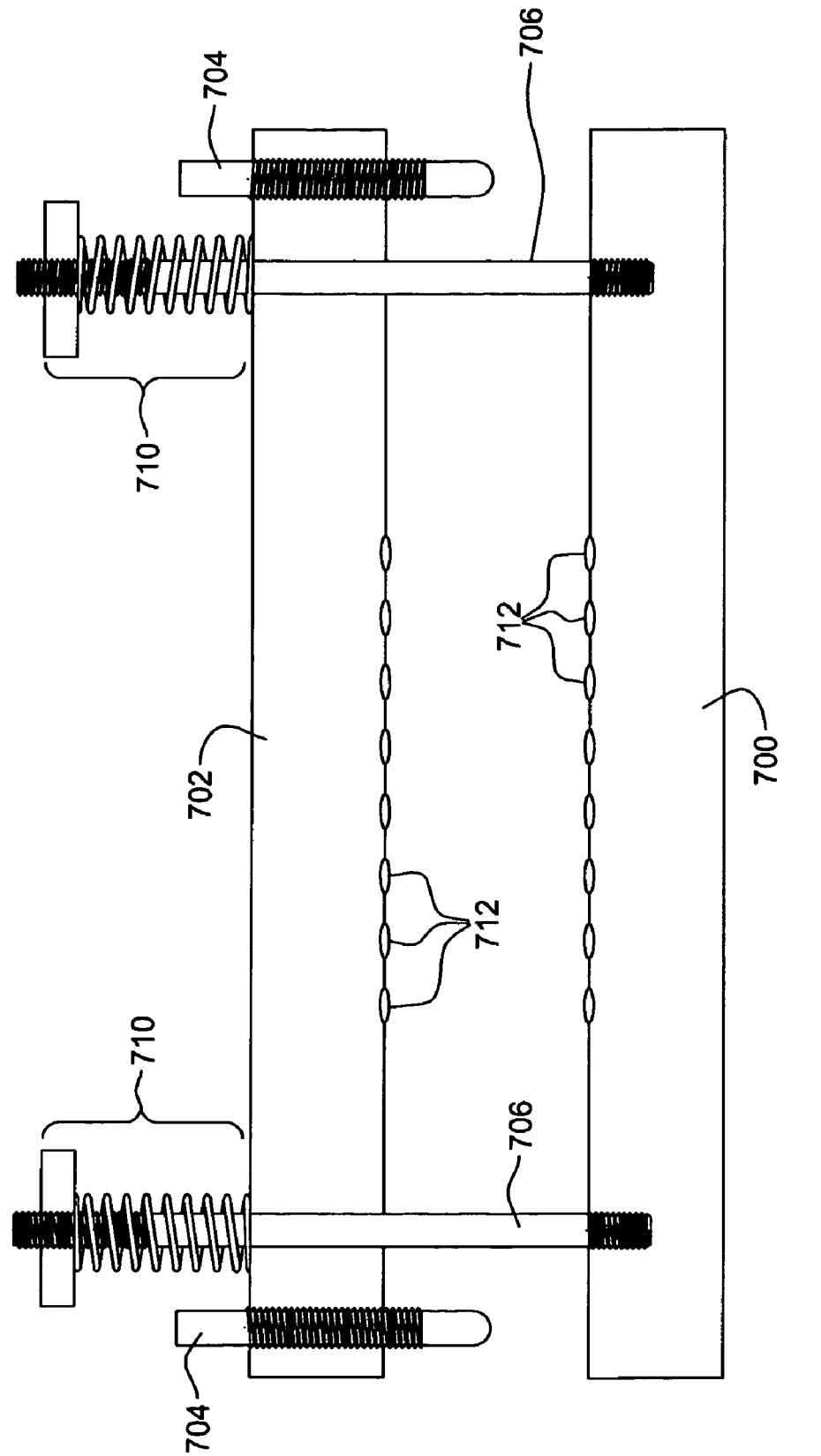
FIGS. 7A & 7B are side elevational views of one embodiment of an apparatus for applying an encapsulant and a stiffener to the multichip module of FIG. 6, in accordance with an aspect of the present invention.
Figure 7B:
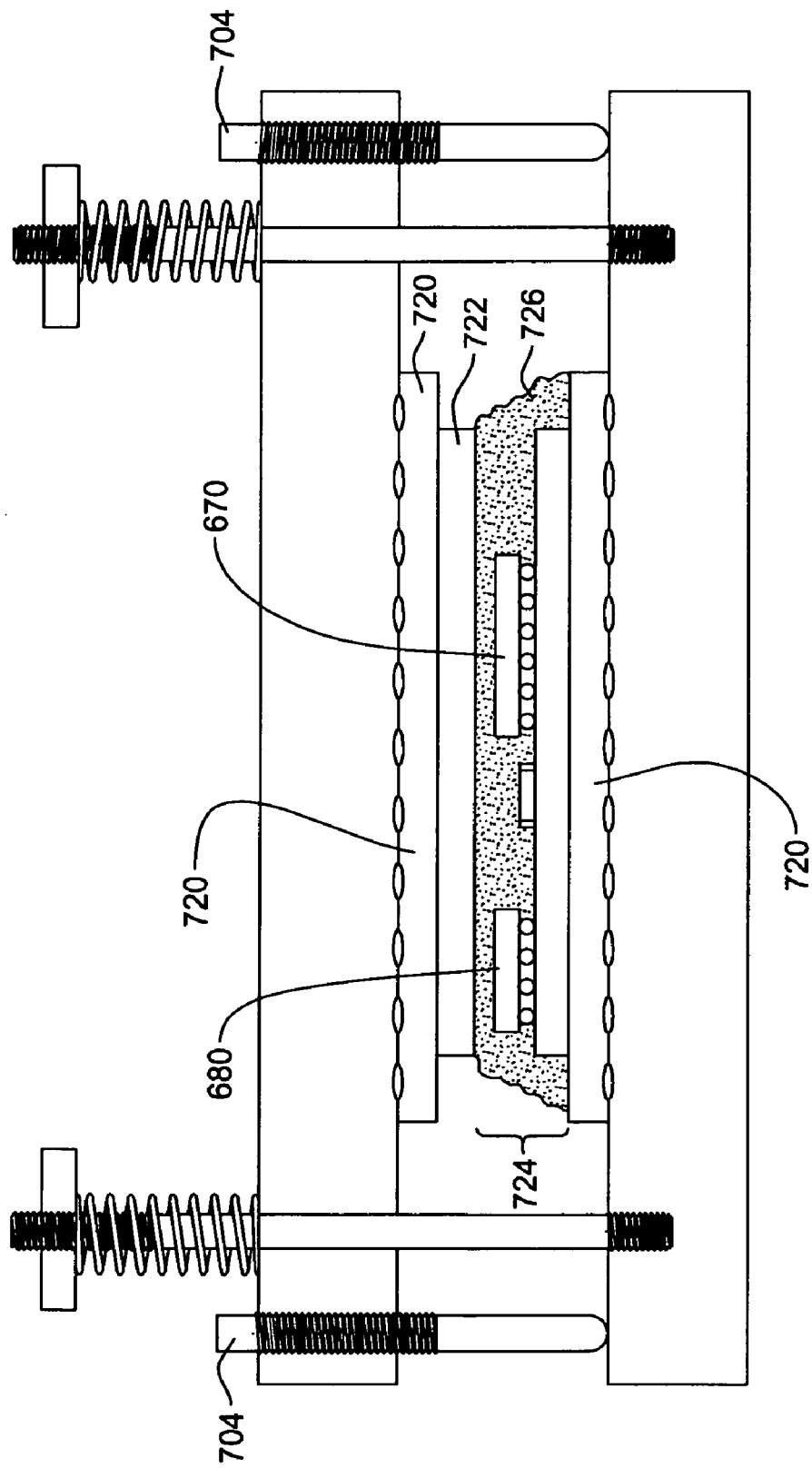

FIGS. 7A and 7B show a laminating fixture suitable for molding encapsulant and bonding a stiffener to the module. The fixture consists of two plates 700 and 702 held apart by fine adjustment screws 704. An arrangement 710 is provided that forces the two plates together under moderate pressure either by pneumatics or by springs. Alignment studs 706 hold the top and bottom plates in alignment. Vacuum hold down holes 712 are provided in each plate for maintaining alignment of the parts to be molded.

With reference to FIG. 7B, both the stiffener 722 and a chips-first module with second layer devices and components 724 (similar to the module shown in FIG. 6) are laminated with low adhesion tape 720. This is done to contain the encapsulant runoff. Tape lamination can be done using a roll laminator from Think & Tinker, Ltd. of Palmer Lake, Colo., and a low tack tape such as available in various sizes and thickness from Semiconductor Equipment Corp. of Moorpark, Calif. Encapsulant is applied to both the stiffener and module. By way of example, the encapsulant material is one that contains a curing agent, and can be applied in liquid form, such as an epoxy or a urethane acrylate. Applying the material in liquid form allows it to run under the attached second layer modules and allows entrapped air bubbles to flow out. In an alternative embodiment, conventional underfill material is dispensed and allowed to flow under the modules by capillary attraction. This underfill is cured before the encapsulant is applied. The use of underfill is well known in the art.

The encapsulant material 726 is applied and dried. The stiffener 722 mounted on low tack tape 720 is attached to the upper plate of the fixture. This can be done by incorporating vacuum hold down in the fixture plate or by applying a thin layer of low tack adhesive or both. Similarly, the module 724 mounted on low tack tape 720 is attached to the bottom of the fixture. The top and bottom plates are assembled with the module facing up and the stiffener facing down. Pressure to force the plates together is applied and the fixture is heated to a temperature that allows the encapsulant to flow and also causes it to cure. The plates are held apart by a precise amount by adjustable stops 704. After the encapsulant is cured the fixture is cooled. If a holding vacuum is applied, then it is released along with the applied pressure, and the fixture plates are separated. The laminated part is then removed from the fixture plate and the low tack tape peeled from both sides.

Figure 8A:
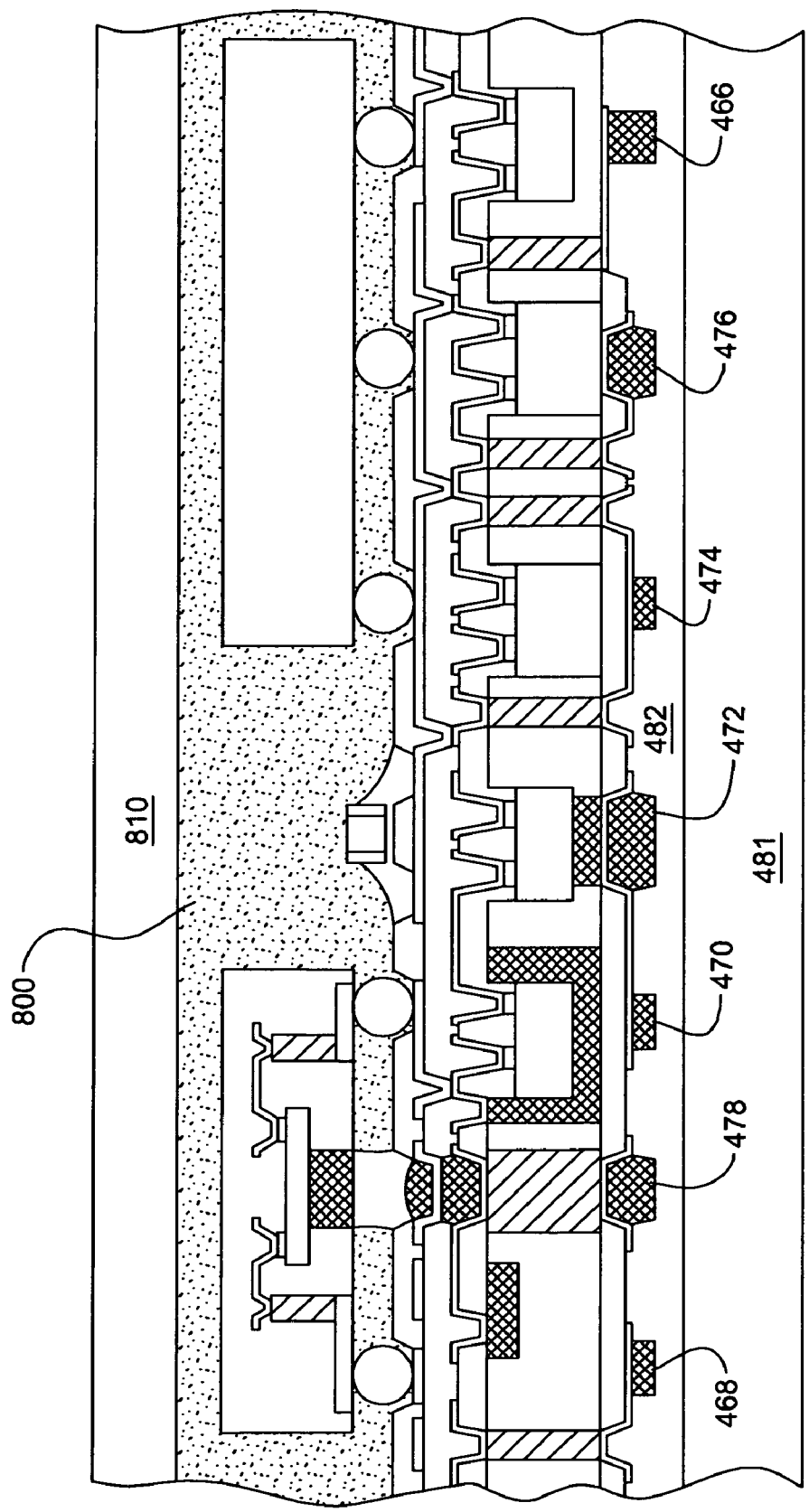
FIG. 8A depicts the structure of FIG. 6 with encapsulant and a stiffener applied thereto, in accordance with an aspect of the present invention.

FIG. 8A shows the module of FIG. 6 after removal of the low tack adhesive tape with permanent encapsulant 800 and optional stiffener 810.

FIGS. 7A and 7B show a fixture that maintains accurate thickness of the encapsulant, as well as allows the attachment of a stiffener. It should be understood that conventional molding devices such as used to form electronic packages could also be used. In addition, if the fixture of FIGS. 7A and 7B is contained in a vacuum and the forcing devices are made pneumatic or otherwise remotely actuated, then the encapsulant may be degassed before the upper and lower plates of the fixture are forced together.

Removal of Process Carrier

With reference to FIG. 8A, at this point the process carrier 481 is removed. This can be accomplished by lapping the glass process carrier and continuing lapping partially into the adhesive 482 until the redistribution pads (466, 468, 470, 474), and thermal slugs (472, 476, 478) are exposed. Lapping equipment of various sizes is available from Lapmaster International of Mount Prospect, Ill. Lapping is carried out using an alumina lap slurry such as WCA 20 available from Microabrasives of Westfield, Mass. The panel is attached to a vacuum hold down diamond stop lap carrier also available from Lapmaster. The diamond stops are set to prevent lapping beyond the point where redistribution pads and thermal slugs are exposed. The lapping process proceeds by applying a pressure in a five minute ramp to 2 psi, lapping then continues until the diamond stops are riding on the lapping wheel. Alternatively, the process carrier may be removed by fine grinding equipment which is also available from Lapmaster. Yet another alternative is to use backgrinding equipment such as used for back-grinding finished wafers to thin the wafers before they are diced and the dice put into packages. Such equipment is available from Disco of Tokyo, Japan.

Note that the lapping or grinding process can yield a solder mask which can be used either to provide masking for application of solder bumps or for solder land pads when the bumps are on another module, device component or circuit board. This solder mask feature is automatically provided since the adhesive that was used to adhere the module to the process carrier still surrounds the land pads and thermal slugs. As mentioned this material was chosen to be a high temperature material such as epoxy which is ideal for solder mask applications.

Adding Solder Bumps to the Back Side

The final processing steps add the interconnect bumps to the bottom of the module. Solder paste is screen printed onto the exposed land pads and thermally conductive metal slugs. Stencil printing solder paste is well known in the art. The assembly is placed into a reflow oven and heated on a rapid ramp to just above the melting point of the solder which melts the solder and forms bumps. The module panel is then cooled.

Figure 9A:
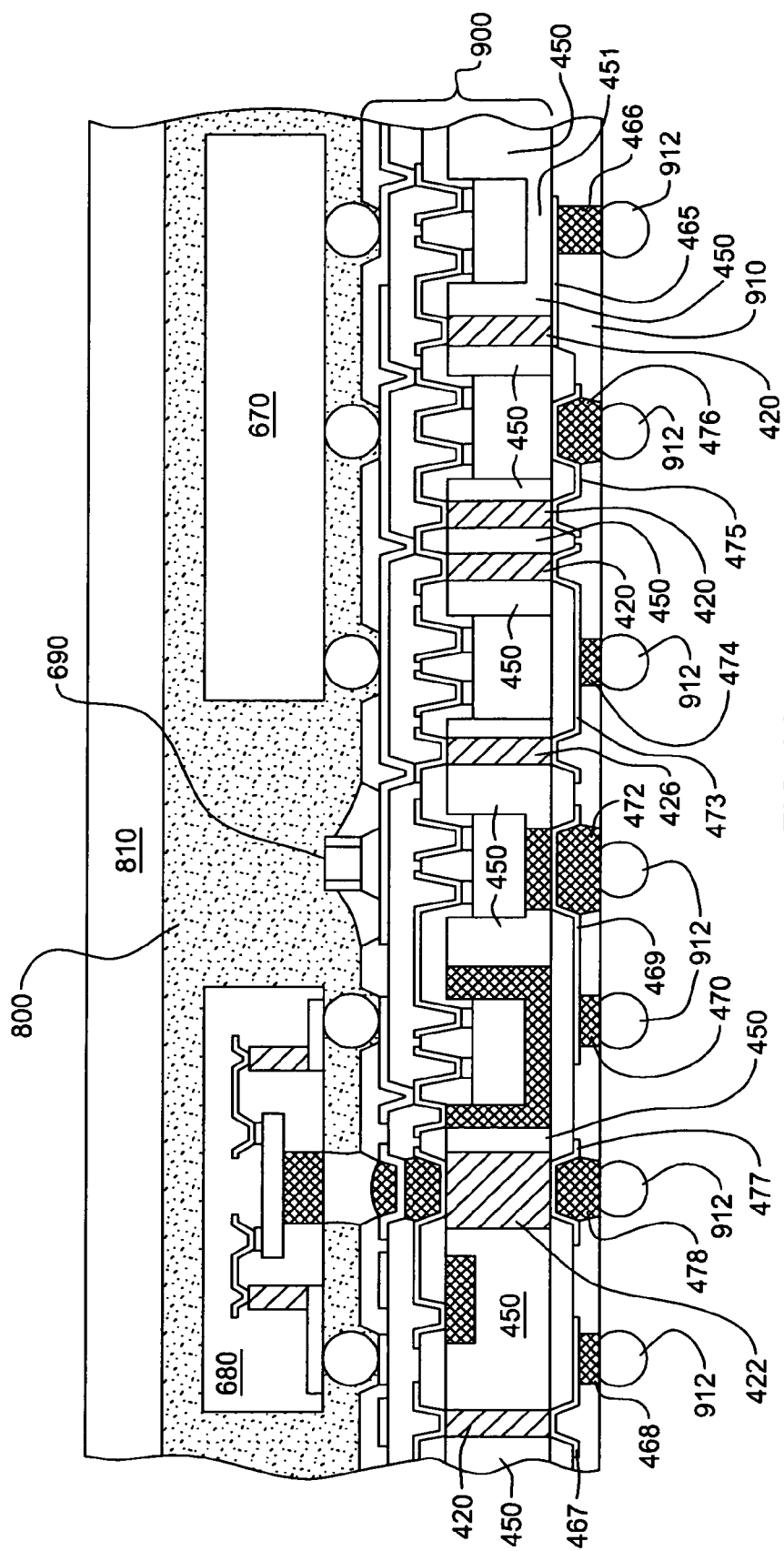
FIG. 9A is a cross-sectional elevational view of the structure of FIG. 8A after the removal of the process carrier and application of I/O contacts arrayed over the back surface of the multichip layer, in accordance with an aspect of the present invention.

FIG. 9A shows the cell phone in a package module with a chips-first base layer 900, through connects 420 from top to bottom in the filler/encapsulant 450, redistribution interconnect (467, 468, 469, 470, 472, 473, 474, 475, 476, 465, 466), bumps 912 on the bottom masked by solder mask 910 formed when the adhesive is lapped into the land pads, a second layer of surface mounted modules 670, 680 and components 690, and an encapsulant 800 and optional stiffener 810.

Although only one module has been shown in many of the figures, the modules are processed in a large panel that holds many modules. At this point the panel can be singulated into individual modules using a dicing saw. Dicing saws available for this application are available from Disco Corp of Tokyo, Japan. This completes the fabrication of one embodiment of the electronic system or subsystem in a package.

Variations of the Process

There are several variations of the process as described which lead to different and novel structures.

No Stiffener or No Encapsulant

In the section that describes Adding Encapsulant and Stiffener, and with reference to FIGS. 7A and 7B, if no stiffener is laminated to the top low tack tape, the result will be an encapsulated module with encapsulant 726 surrounding the second layer of components and a flat surface of encapsulant for automated handling.

If it is desired to have the stiffener just bonded to some of the second layer components, then the stiffener can be coated with a low flow adhesive and no encapsulant 726 would be applied to the module side. The balance of the steps discussed above would be followed with the desired result.

No Second Layer Devices

If devices are not included in the second layer, a chips-first module with encapsulant, optional stiffener, and through connects, thermal slugs, backside connection and Faraday shielding capability is fabricated. The above steps are followed except those outlined in Adding Devices of the Second Layer. Modules with bumps 912 on the side away from the active side of the chips have particular utility in systems where it is desired to electrically or thermally connect the back side of the chip to the same circuit board where the I/O is connected. Such a module is depicted as module 680 in FIG. 9A.

Accommodating Very Thick Second Layer Devices

If a hole is provided in the stiffener, a very thick component can be accommodated without increasing the overall thickness of the resultant module. The thick component protrudes into the hole and the encapsulant is kept even with the top of the hole by the low tack tape. Some novel structures that may be formed by this technique are given below.

If a surface mount connector is placed as one of the second level devices, then this connector may be accessed from the top of the module after the module is mounted. This can allow connection, for example, of an antenna or I/O device such as a keyboard. A photo optic sensor or source may be surface mounted in such a way that direct interface to a fiber optic cable may be effected. If a patch antenna is printed on the top of the module, it may be connected by an embedded connector.

Temporary Encapsulant Structures

There are several innovative structures that are enabled by the use of a temporary encapsulant. The temporary encapsulant is applied at the same point in the process as the permanent encapsulant shown as 726 in FIG. 7B. This gives the advantage that the remaining process may be followed and at the appropriate point in the process the encapsulant may be easily removed to reveal the desired resulting module.

Stacked Modules

To fabricate a very thin module that can be stacked the same processing steps as outlined above may be followed. Specifically, reference the above discussion for Fabricating a Chips-First Base Layer, Adding Redistribution Interconnect, Attaching a Process Carrier and Initiating Processing of Top Side, and Adding the Interconnect Above the Chips. This processing results in the structure shown in FIG. 4N. FIG. 4N shows an embodiment that has had back side processing and has had two metal interconnect layers (485, 486) (487, 488) and solder mask 494 applied to the top side of the module. The solder mask is patterned with openings 495 in the solder mask. Solder paste is now screen printed into openings 495 and the module is reflowed in a solder reflow oven. Bumps are thereby formed on the top surface. Next, the steps outlined in Adding Encapsulant and Stiffener are performed, except that a temporary encapsulant is used instead of the permanent one.

Figure 8B:
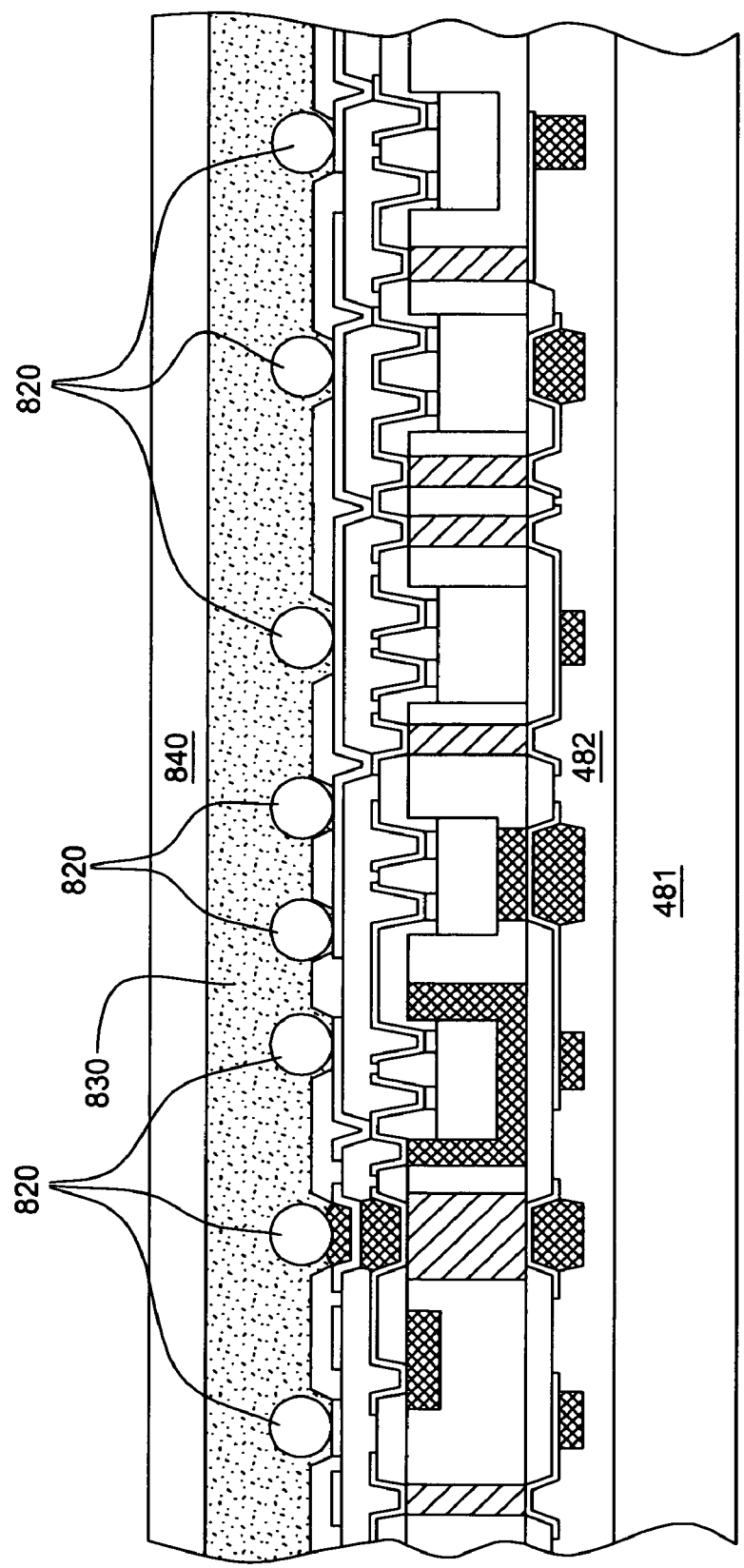
FIG. 8B depicts an alternate embodiment of a multichip module having a temporary encapsulant and stiffener applied over a plurality of input/output contacts disposed over the front surface of the multichip layer, in accordance with an aspect of the present invention.

Using the temporary encapsulant results in the embodiment shown in FIG. 8B. Aquabond A55 available from Semiconductor Equipment Corp. of Moorpark, Calif., can be used as a temporary encapsulant 830. When this material is heated to 90° C., it flows with a viscosity nearly that of water. At 90° C., it can be dispensed on top of the chips-first bumped structure described above, which is preferably preheated to 100° C. The stiffener 840 is also coated by dispensing the heated liquid, temporary encapsulant material on the preheated stiffener. For this embodiment, a stiffener 840 may be a glass plate roughened on the encapsulant side. Both pieces are cooled to solidify the temporary encapsulant before assembly. As outlined in Adding Encapsulant and Stiffener, a low tack tape is laminated to the process carrier and to the stiffener. The encapsulant molding fixture of FIGS. 7A and 7B is assembled and heated with the fixtures plates forced together as show in FIG. 7B. The temporary encapsulant flows to mold the encapsulant together with the stiffener. After cooling and removal of the low tack tape, the assembly is as shown in FIG. 8B. FIG. 8B shows the module with temporary encapsulant 830, stiffener 840, solder bumps 820 and with process carrier 481 attached by adhesive 482.

The process carrier may be removed by following the steps in the above-noted section Removal of Process Carrier. For clarity, these steps are repeated here. Removal of the process carrier is accomplished by lapping the glass process carrier 481 and continuing lapping partially into the adhesive 482 until the redistribution pads, and thermal slugs are exposed. Lapping is carried out on a (for example) a Lapmaster 36 available form Lapmaster International of Mount Prospect, Ill., using an alumina lap slurry such as WCA 20 available from Microabrasives of Westfield, Mass. The panel is attached to a vacuum hold down diamond stop lap carrier also available from Lapmaster. The diamond stops are set to prevent lapping beyond the point where redistribution pads and thermal slugs are exposed. A pressure of 2 psi is applied by ramping from 0 psi over a 5 minute interval and lapping continues until the diamond stops are riding on the lapping wheel. Alternatively, the process carrier may be removed by fine grinding equipment available from Lapmaster or by back-grinding equipment typically used for back-grinding finished wafers to thin the wafers before they are diced and the die put into packages. Such equipment is available from Disco of Tokyo, Japan.

Note that the lapping or grinding process can yield a solder mask which can be used either to provide masking for application of solder bumps or for solder land pads when the bumps are on another module, device, component or circuit board. This solder mask feature is automatically provided since the adhesive that is used to adhere the module to the process carrier still surrounds the land pads and thermal slugs. As noted, this material is chosen to be a high temperature material, such as epoxy which is ideal for solder mask applications.

Figure 9B:
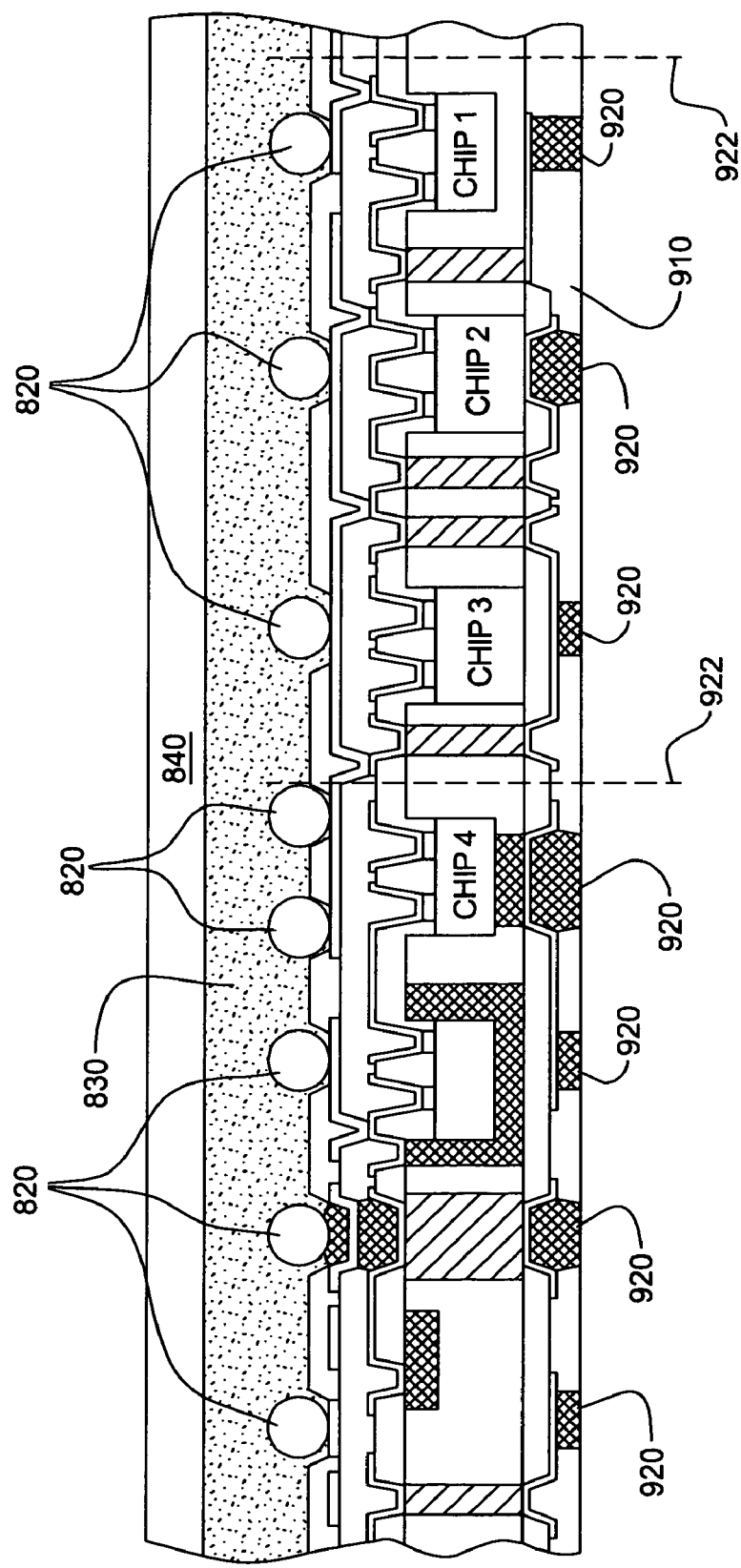
FIG. 9B is a cross-sectional elevational view of the structure of FIG. 8B after removal of the process carrier and exposure of input/output contacts arrayed over the back surface of the multichip layer, in accordance with an aspect of the present invention.

FIG. 9B shows one embodiment of the resultant module. On the back side, the exposed lands 920 for solder or other interconnect are exposed on the surface and surrounded by the residual adhesive that acts as a solder mask 910. To dice a panel into individual modules a dicing saw is used such as available from Disco Co. of Tokyo, Japan. The saw is set to dice part way into the temporary encapsulant from the module side. After dicing is completed the panel is heated to 100° C. and individual modules can be picked with a vacuum tool and placed in suitable wash pack, such as available from Entegris Corp. of Chaska, Minn. The washing process may include dipping for a period of 10 minutes in 90° C. DI water and surfactant, then 5 minutes in 90° C. DI water, then 1 minute in room temperature DI water, followed by propanol displacement drying in hot propanol or propanol vapor dryer.

The module represented by Chip1, Chip2 and Chip3 is an example of a stackable module (or multichip layer) that could be diced on the panel. The dicing lines 922 are shown in FIG. 9B. Note that there is no stiffener or encapsulant so these modules are fragile and in their thinnest form are not practically capable of standing on their own.

Figure 10A:
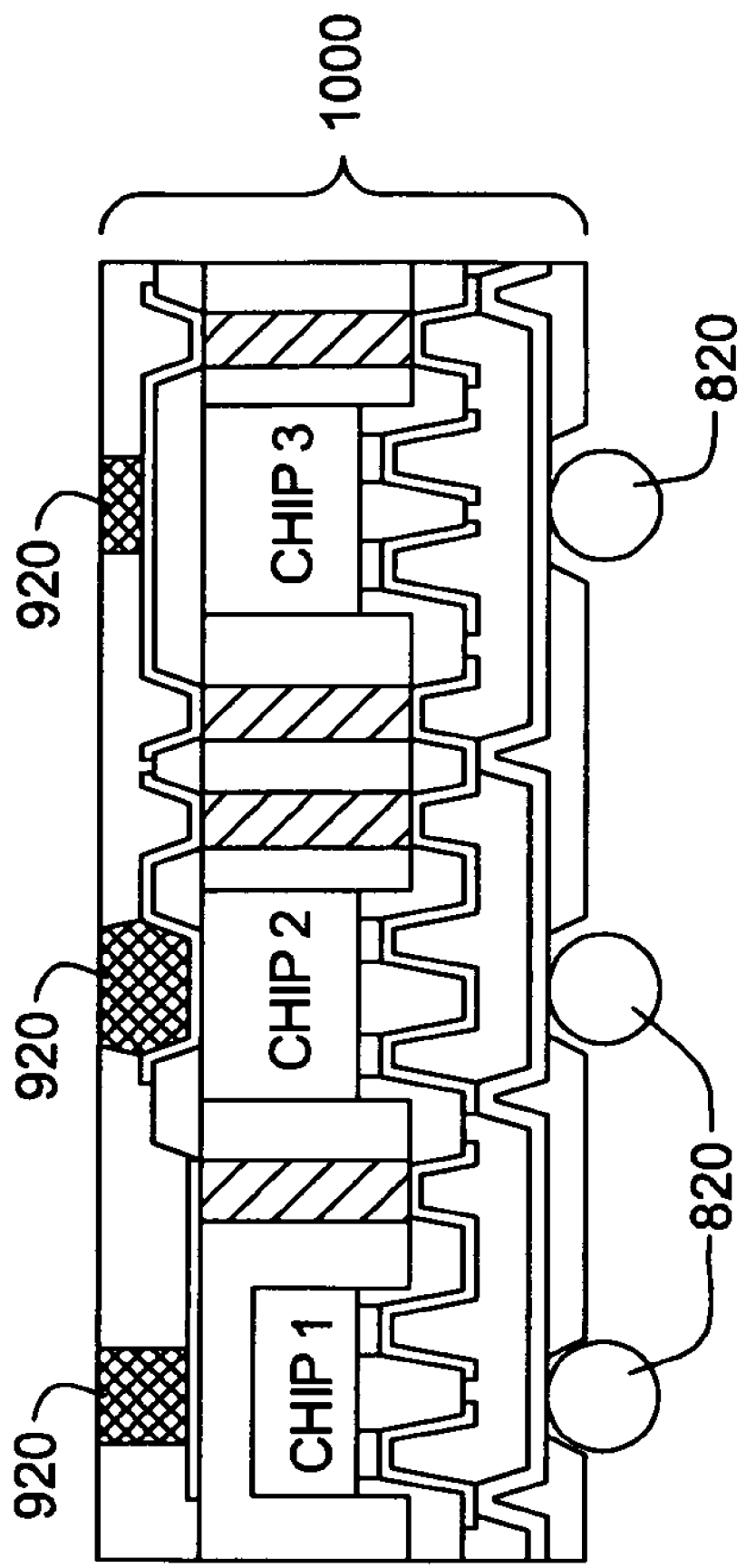
FIG. 10A depicts a cross-sectional elevational view of the multichip module of FIG. 9B after the removal of the temporary encapsulant and stiffener to expose the plurality of input/output contacts arrayed over the front surface of the multichip layer, which is shown inverted in the figure, in accordance with an aspect of the present invention.
Figure 10B:
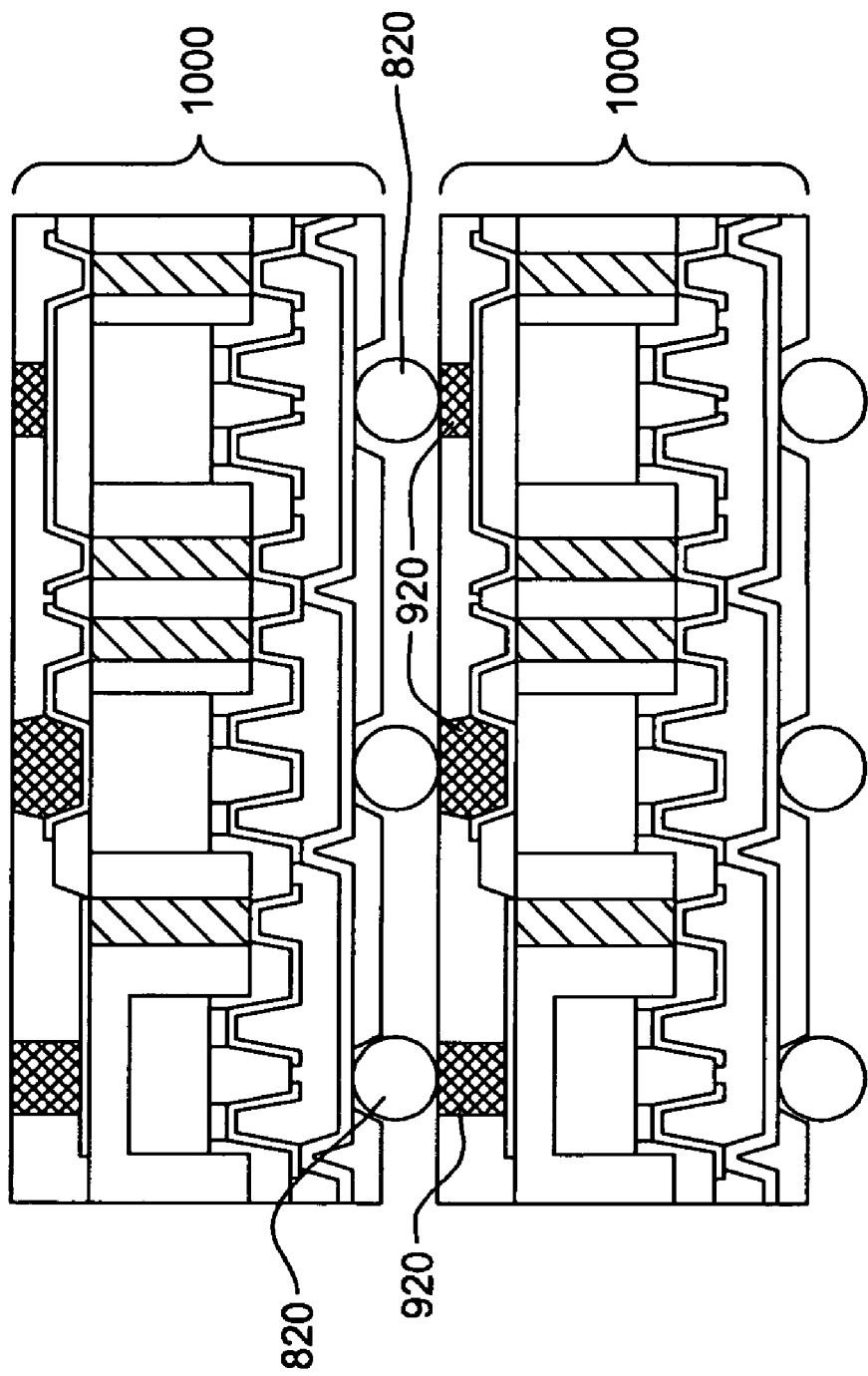
FIG. 10B is a cross-sectional elevational view of multiple multichip layers of FIG. 10A stacked and electrically interconnected in a compact package, in accordance with an aspect of the present invention.

FIG. 10A shows the Chip1, Chip2 and Chip3 module as diced and cleaned of temporary encapsulant. Note that solder bumps 820 and land pads 920 are in alignment. As an example stack, this module is mounted to the base layer of FIG. 4N in the location shown by the generic module 670 (see FIG. 6). A first module can be mounted with its solder bumps to the land pads of the base layer. The assembly is then placed in an oven and the solder is reflowed. A second module is then soldered to the land pads 920 of the first module shown in FIG. 10A. This is accomplished by dipping the bumps of the second module in solder flux then placing the second module bumps onto the land pads of the first module. Again the assembly is placed in an oven to reflow the solder to make connection. The reflow may be done after each stacked module is added or the reflow process may be applied after the stack is completed. At this point, the permanent encapsulant may be applied with or without the optional stiffener and the process continued. Note that rigidity and robust protection is afforded to the very thin stackable modules by the encapsulant. FIG. 10B shows a generic module 670 (such as shown in FIG. 9A) as an exemplary stack of two of the modules 1000 as shown in FIG. 10A. It should be noted that the stacked module disclosed herein is the thinnest module known that has bumps on one side and pads on the other side, wherein both the pads and bumps are distributed above and below the chip or chips that are interconnected. A completely freestanding module with multiple stacked components may be attained where each element of the stack may be tested before assembly and where the resulting module is of minimal thickness.

Encapsulant Filler to Provide Stiffness

In cases where the filler/encapsulant is thicker than the chips, the filler/encapsulant can supply a stiffening function. In the example embodiment of FIGS. 4N & 9B, Chip1 and Chip4 are thinner than the final filler/encapsulant 450. Modules that are formed using structures associated with Chip1 and Chip4 would result in filler/encapsulant that is thicker than the chips. If the filler/encapsulant is thick enough it can provide a stiffening function and eliminate the need for a stiffener in the top side. Specifically, area 451 (FIG. 4M) on the back of Chip1 is the area of encapsulant 450 that is thicker than Chip1. The processing would proceed until the assembly reaches the point shown by FIG. 8B, where in the encapsulant is a temporary encapsulant 830. The process carrier is now removed by lapping techniques disclosed above. The module is heated to 100° C. and the rigid stiffening member 840 is removed. The module is now cleaned by soaking for 10 minutes in a 5% surfactant DI water solution at 90° C. followed by a rinse in 90° C. DI water. This is followed by a rinse for 1 minute in DI water and a propanol water displace for drying. The resultant module would have no encapsulant or stiffener, but would obtain sufficient rigidity from the thick filler/encapsulant shown as area 451.

Chips Completely Surrounded by Copper

With reference to FIG. 6, the module formed around Chip5 is one that has copper 446 surrounding the back and sides of the chip. As stated, this is of value in fabricating very low inductance connection to the back side of the chip. It also provides a heat path from the back and sides of the chip to the top of the module. Finally, it provides high conductivity shielding around the chip. In addition, this particular structure configuration doesn't allow filler/encapsulant 450 to contact the chip.

Figure 11:
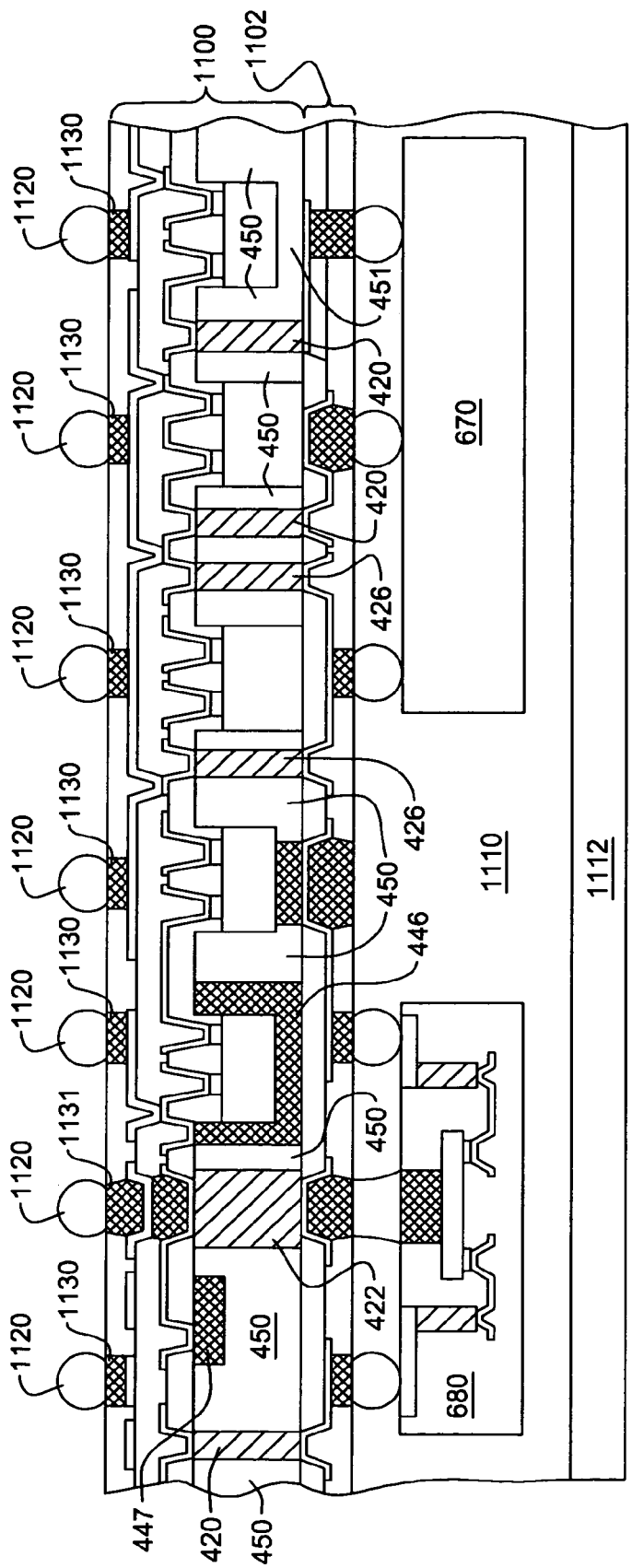
FIG. 11 is a cross-sectional elevational view of an alternate embodiment of a multichip module, in accordance with an aspect of the present invention.

Complete System in a Package with Second Layer Devices on Back of Chips-First Base In another embodiment, the second layer of devices is interconnected on the back of the chips-first module, and bumps on the top of the module are used for input/output. FIG. 11 shows one embodiment of this structure. This configuration can be advantageous in digital systems where the chips-first base layer contains chips that have a significant amount of I/O. In such systems, having the I/O contacts on the back would require that the through connections pass through the chips-first base layer. For large amounts of interconnect this could increase the size of the module. In such cases putting the second layer devices on the side away from the active area of the chips allows efficient redistribution of the large I/O compliment on the same side as the pads of the high I/O content chips.

To fabricate a module according to this embodiment the steps below are followed. First a chips-first base layer is fabricated as described in Fabrication of Chips-first Base Layer. Next, the redistribution interconnect is fabricated on the back side as described in Adding Redistribution Interconnect. This is followed by the steps contained in the section entitled Attaching the Process Carrier and Initiating Processing of the Top Side. Next, the interconnect is added above the chips. This process follows the steps described in the section Adding the Interconnect Above the Chips. The optional embodiment that provides solder landing pads and no solder mask is fabricated. The module at this point is shown in FIG. 4O. At this point, the processing departs somewhat from that already disclosed.

Adding Second Process Carrier

In the above-described embodiments, processing is carried out to add the second layer devices or add solder bumps. In this embodiment, a second process carrier is attached to the just finished interconnect layers above the chips. The steps are very similar to those described in Attaching Process Carrier & Initiating Processing of Top Side, but will be repeated here in order to avoid confusion.

The second process carrier is (in one embodiment) a plain glass panel that has been slightly roughened on one side to improve adhesion. The top surface of the module 499 as shown in FIG. 4O is pre-coated with a layer of adhesive. In one embodiment, a high temperature material such as an epoxy that can be cured at or near room temperature is used. This material is coated to a thickness of between 12 and 50 microns by spin or spray coating. The material is cured until solid, but not completely cured. An epoxy that cures in 24 hours at room temperature is coated and then baked on a hot plate for 30 minutes at 75° C. to achieve this solid but not fully cured objective.

Figure 12A:
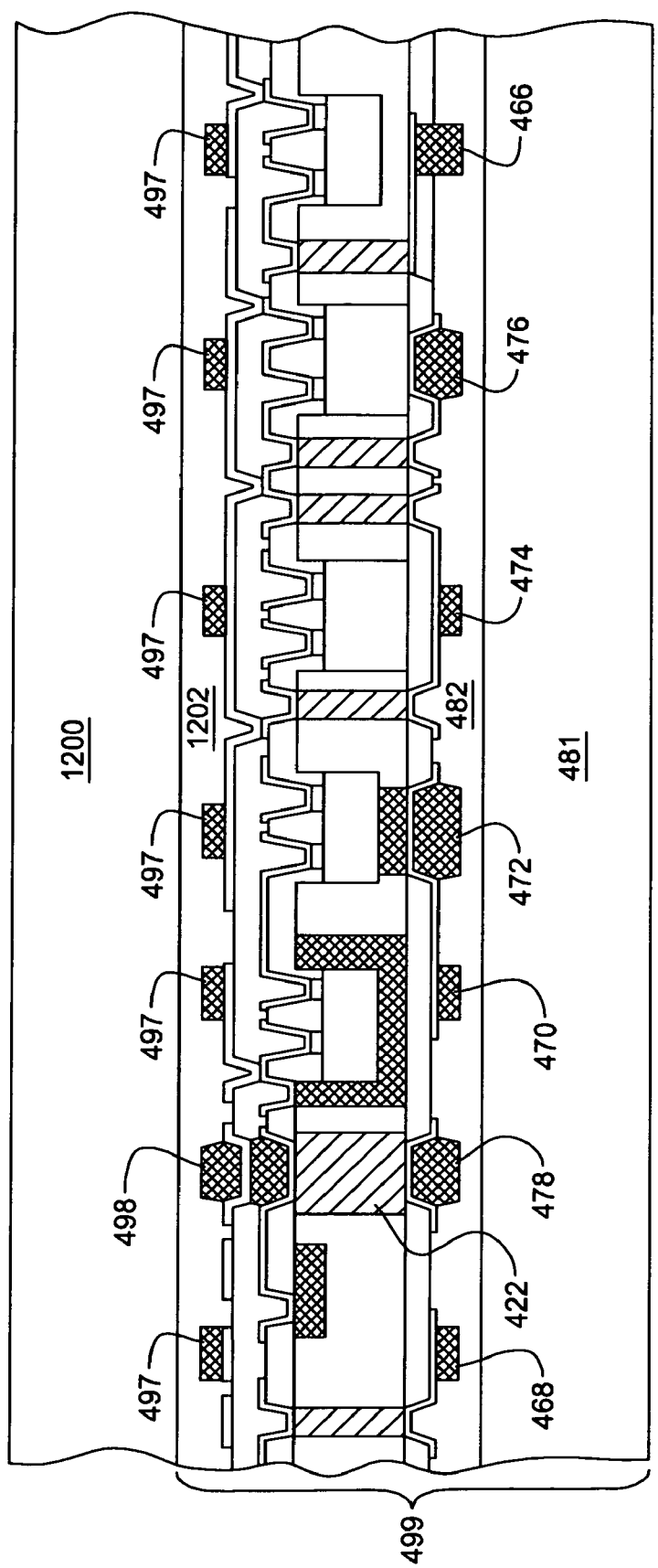
FIGS. 12A-12D are cross-sectional elevational views of process structures obtained during manufacturing of a multichip module, such as the module of FIG. 11, in accordance with an aspect of the present invention.

Next, each of the process carrier 1 of module 499 and process carrier 2 are bonded by low adhesion tape into open frames. Such a process is well know in the art for the purpose of holding wafers when they are diced by a dicing saw. A frame bonder that is suitable for this use and also the low tack tape is sold by Semiconductor Equipment Corp. of Moorpark, Calif. The process carrier frame is then placed on a fixture that holds the frame in alignment and thereby holds the process carrier in alignment. The same high temperature, liquid epoxy adhesive is then applied to the center of the process carrier 2. The process carrier 1 frame is placed on the same fixture such that two untaped surfaces face one another. The fixture is then placed into a laminating press and pressure is applied. This squeezes the adhesive into a thin uniform film and bonds the process carrier 2 to the top of the partially processed chips-first base. The actual glue line thickness is primarily dictated by the thickness of the pre-applied coating. After the adhesive has cured, the fixture is removed from the laminating press and the low tack tape is removed. The low tack tape and frame thus serve the dual purpose of holding alignment and also containing any run off of the adhesive. FIGS. 5A and 5B show the lamination fixture used to attach a process carrier to a partially processed module. FIG. 12A shows process carrier 2 1200 attached with adhesive 1202 to the partially processed base layer 499.

Removing First Process Carrier

Still referring to FIG. 12A, the first process carrier 481 is removed by the steps outlined in Removal of Process Carrier. This process is repeated below for clarity. Removal of first process carrier 481 can be accomplished by lapping the glass process carrier and continuing lapping partially into adhesive 482 until the redistribution pads (468, 470, 474, 466), and thermal slugs (478, 472, 476) are exposed. By way of example, lapping is carried out on a Lapmaster 36 using an alumina lap slurry such as WCA 20. The lapper is available form Lapmaster International of Mount Prospect, Ill., and the WCA 20 is available from Microabrasives Co. of Westfield, Mass. The panel is attached to a vacuum hold down diamond stop lap carrier also available from Lapmaster. The diamond stops are set to prevent lapping beyond the point where redistribution pads and thermal slugs are exposed. A pressure of 2 psi is applied in a five minute ramp and lapping continues until the diamond stops are riding on the lapping wheel. Alternatively, the process carrier may be removed by fine grinding equipment also available from Lapmaster. Another alternative is backgrinding which typically is used for backgrinding finished wafers to thin the wafers before they are diced and the die put into packages. Such equipment is available from Disco Co. of Tokyo, Japan.

Figure 12B:
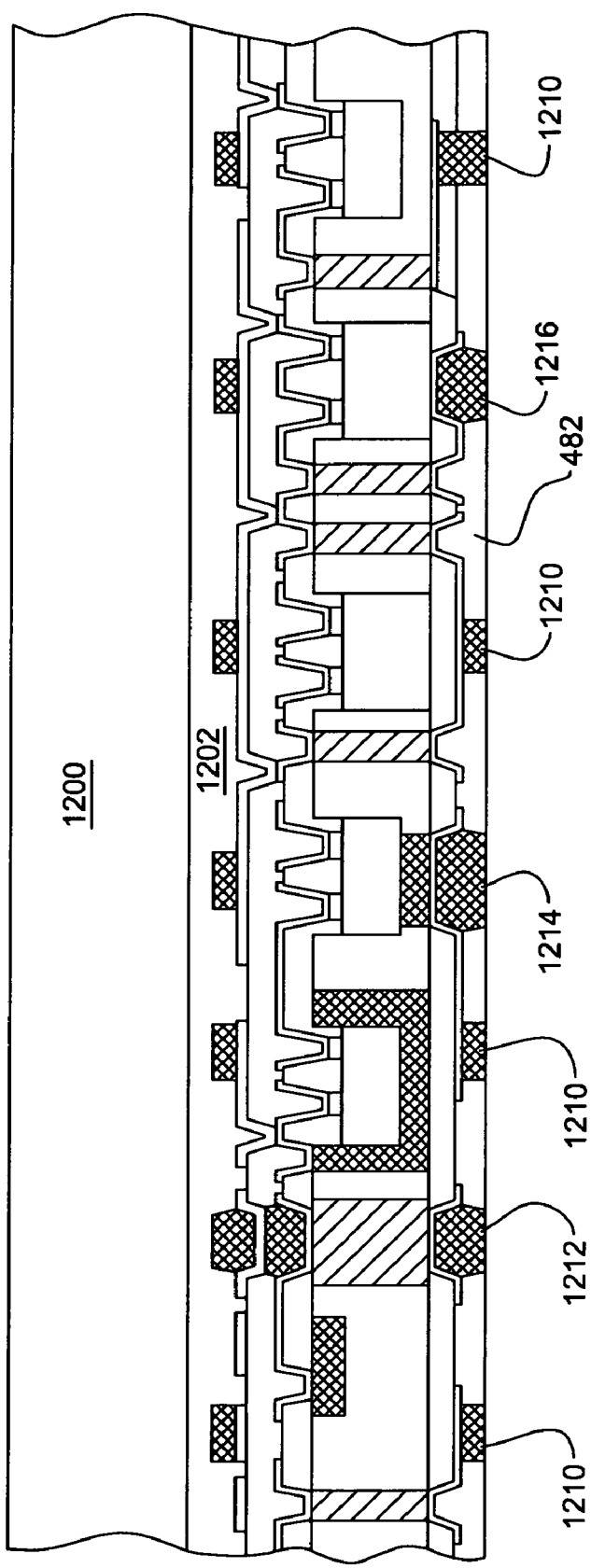

Note that the lapping or grinding process can yield a solder mask, which can be used either to provide masking for application of solder bumps or for solder land pads when the bumps are on another module, device component or circuit board. This solder mask feature is automatically provided since the adhesive that is used to adhere the module to the process carrier still surrounds the land pads and thermal slugs. As mentioned, this material is chosen to be a high temperature material such as epoxy which is ideal for solder mask applications. FIG. 12B shows process carrier 1 removed and the redistribution pads 1210 and thermal slugs 1212, 1214, 1216, exposed, with the residual adhesive 482 acting as a solder mask.

Adding Devices of the Second Layer to the Backside of Chips-First Base

The components of the second layer are next added. This process is similar to the process described in Adding Devices of the Second Layer where components are added to the top of the chips-first base. The process discussion is repeated here to avoid confusion. First solder paste is screen printed onto the base layer over land pads (1210, 1212, 1214, 1216). Stencil printing solder paste is well known in the art. The second layer devices 670, 680 are placed with their bumps or pads into the solder paste. The assembly is placed into a reflow oven and heated on a rapid ramp to just above the melting point of the solder, which melts the solder to complete the interconnection from the second layer devices to the chips-first base layer. Under the thermal slug of second layer device 680, solder melts to provide an all metallic path or thermal conduit for heat flow from second layer device 680 through the structural material of the chips-first base layer.

Figure 12C:
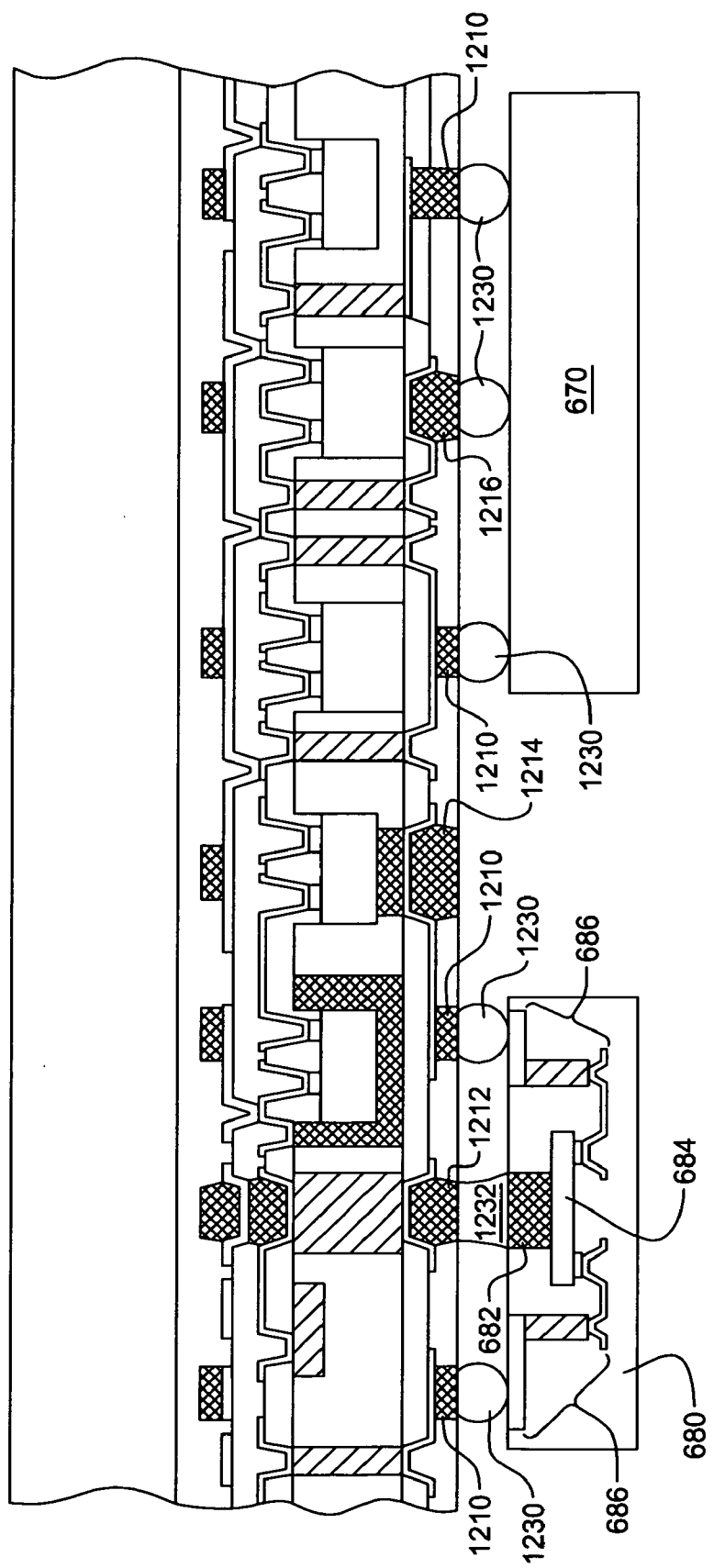

FIG. 12C shows the chips-first layer with second layer devices 670, 680 attached electrically and thermally. Although one mode is to use solder to interconnect the chips-first base and second layer devices, it is also possible using screen print conductive epoxy, for example, by placing the bumps or pads of the second layer devices into the conductive epoxy and curing the conductive epoxy. Another method is to dip the solder bumps of some or all of the second layer devices in flux and place the devices bumps-down on the chips-first base. Solder paste is not required where flux dipped bumps are used. The same reflow that is used to reflow the solder paste can at the same time reflow bumps that are just flux dipped. This method is of value when stacks of devices are fabricated since it is difficult to print solder paste on an uneven surface. It should also be noted that the use of the high elongation low modulus dielectric on the chips-first base and/or the second layer devices allows the solder bumps to be extremely thin. This is because substantially all the strain is taken up in the dielectric and little strain is transmitted to the bumps. This allows the resultant structure to be considerably thinner.

In the example embodiment, two bumped modules are shown as part of the second layer. It should be understood that there is a vast variety of modules that could be used, such as: chip scale packages, conventional bumped packages and modules, stacked packages, bumped chips, SAW modules and essentially any device that may be surface mounted to a circuit board. Additionally, one of the incorporated modules could be a subsystem module that was previously fabricated according to this disclosure.

Adding Encapsulant and Stiffener to Bottom of Chips-First Base

In one embodiment, an encapsulant layer is next added to provide mechanical rigidity to the module and to provide a flat surface for improved handling by automated equipment. The encapsulant may be added alone or with a rigid stiffening member or layer. Using a stiffener is advantageous if the module is of minimum thickness since practical encapsulants are not as stiff as practical stiffeners for a given thickness. FIGS. 7A & 7B show a laminating fixture suitable for molding encapsulant and bonding a stiffener to the multichip module. The operation of this fixture is explained in detail in the section entitled Adding Encapsulant and Stiffener.

Both the stiffener and chips-first module (i.e., multichip base layer) with second layer devices as shown in FIG. 12C, are laminated with low adhesion tape. This is done to contain the encapsulant runoff. Tape lamination can be done using a roll laminator from Think & Tinker, Ltd. of Palmer Lake, Colo., and low tack tape is available from Semiconductor Equipment Corp. of Moorpark, Calif. Encapsulant is applied to both the stiffener and the module. One encapsulant material which can be used contains a curing agent, and can be applied in liquid form, such as an epoxy or a urethane acrylate. Applying the material in liquid form allows it to run under the attached second layer modules and allows entrapped air bubbles to flow out. (In an alternative embodiment, conventional underfill material is dispensed and allowed to flow under the modules by capillary attraction. This underfill is cured before the encapsulant is applied. The use of underfill is well known in the art.) The encapsulant material is applied and dried. The stiffener is attached to the upper plate of the fixture. This can be done by incorporating vacuum hold down in the fixture plate or by applying a thin layer of low tack adhesive or both. Similarly the module is attached to the bottom of the fixture. The top and bottom plates are assembled with the module facing up and the stiffener facing down. Pressure is applied to force the plates together, and the fixture is heated to a temperature that allows the encapsulant to flow and also cause it to cure. After the encapsulant is cured, the fixture is cooled. If a vacuum is applied, it is released and the force is released, which is followed by the fixture plates being separated. The laminated structure is then removed from the fixture plate and the low tack tape peeled from both sides.

Figure 12D:
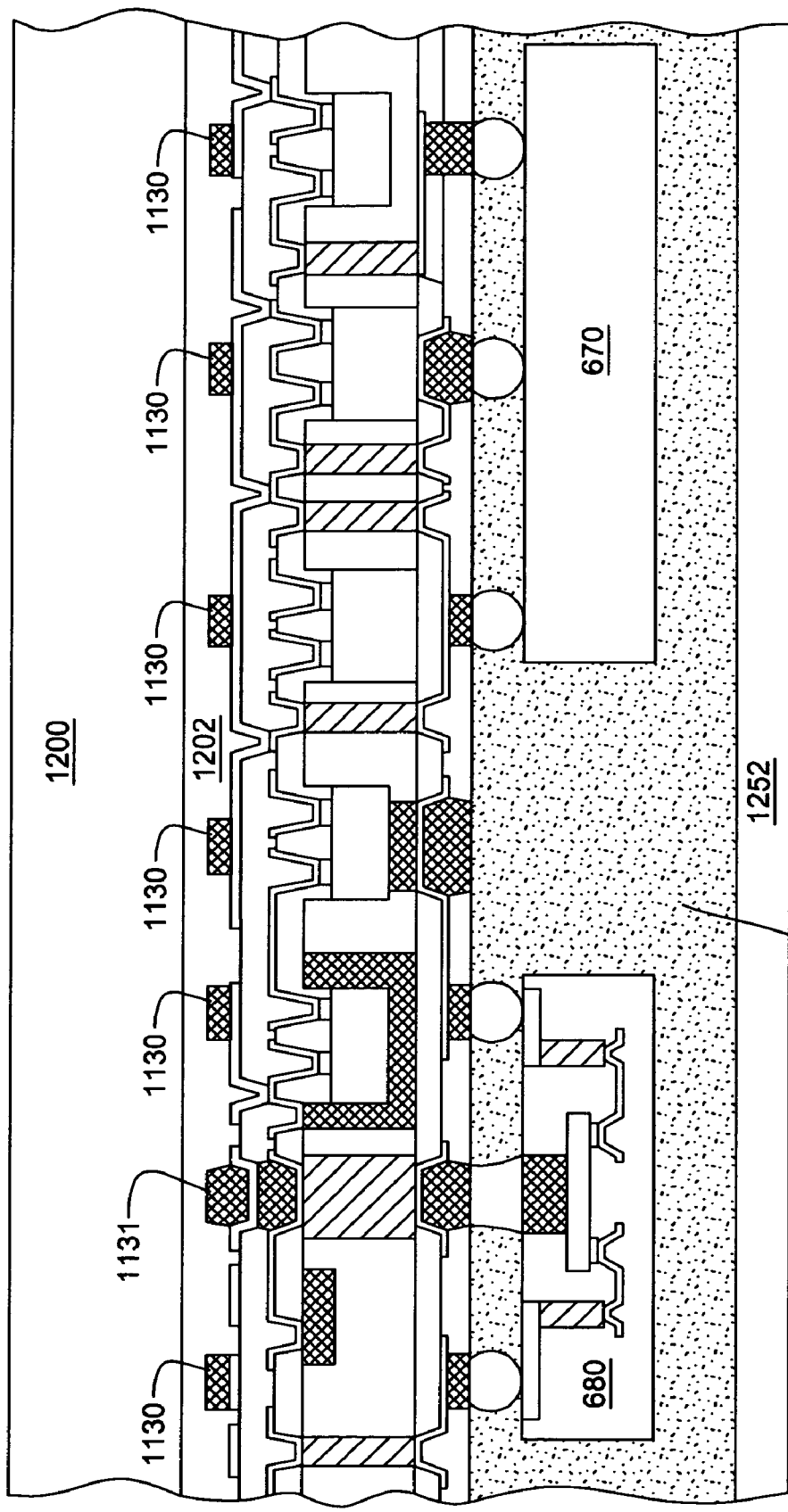
Figure 1:
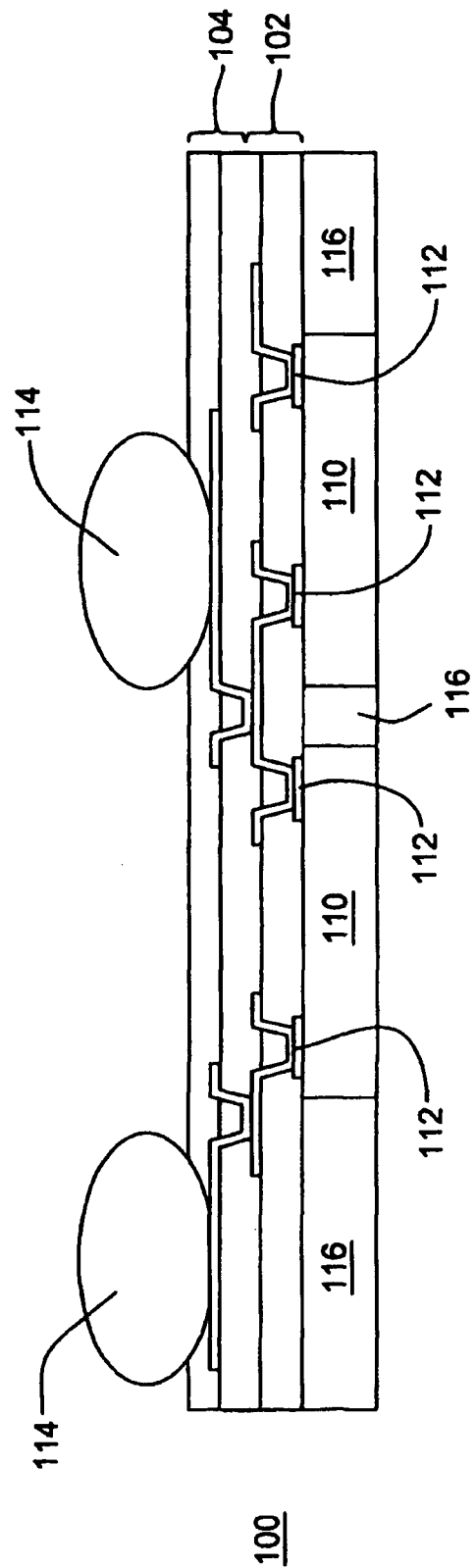
Figure 2:
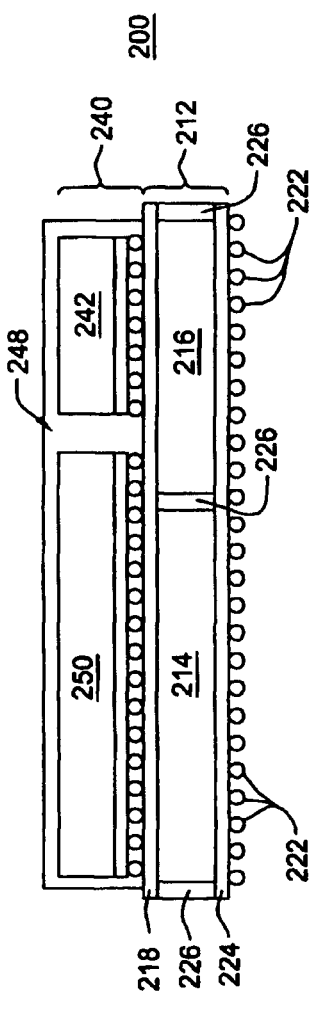
Figure 3:
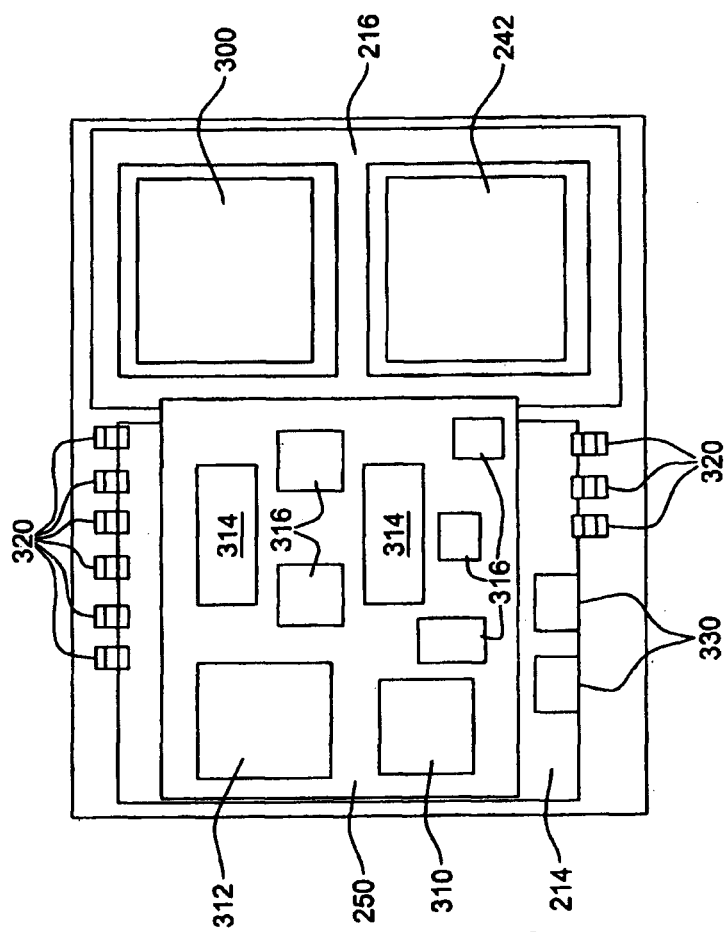
Figure 4B:
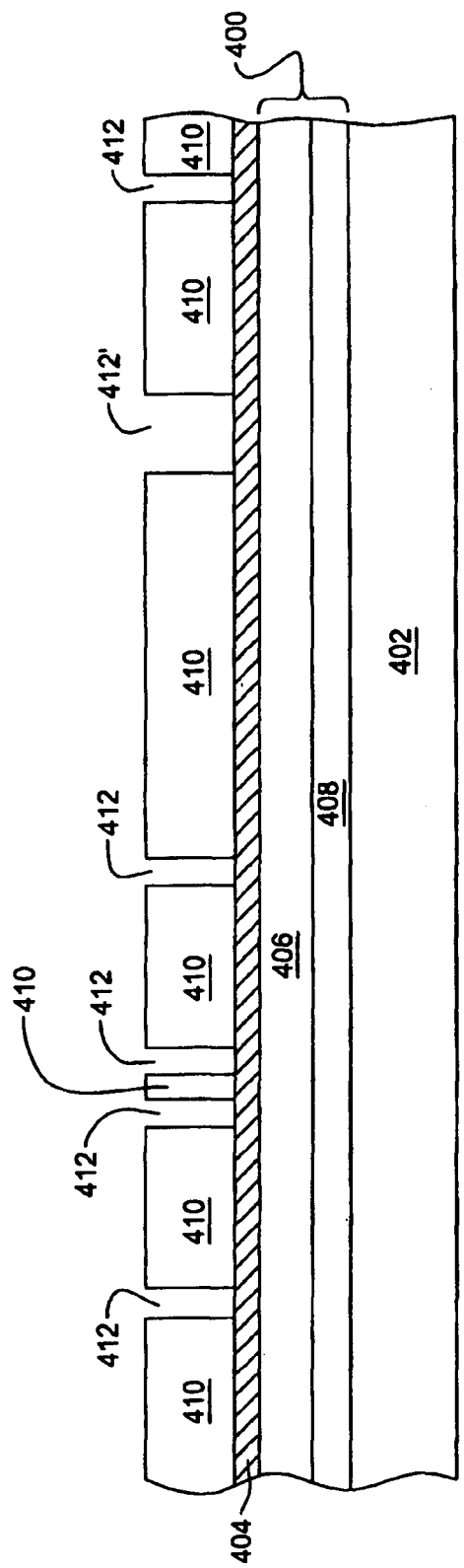
Figure 4C:
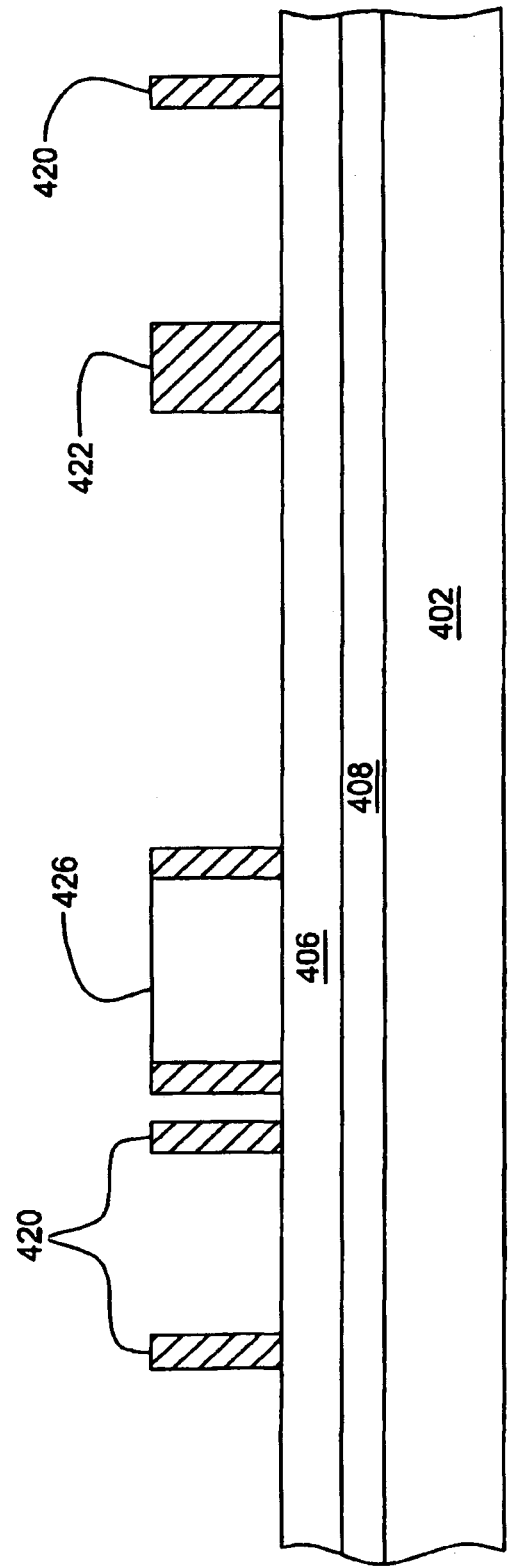
Figure 4D:
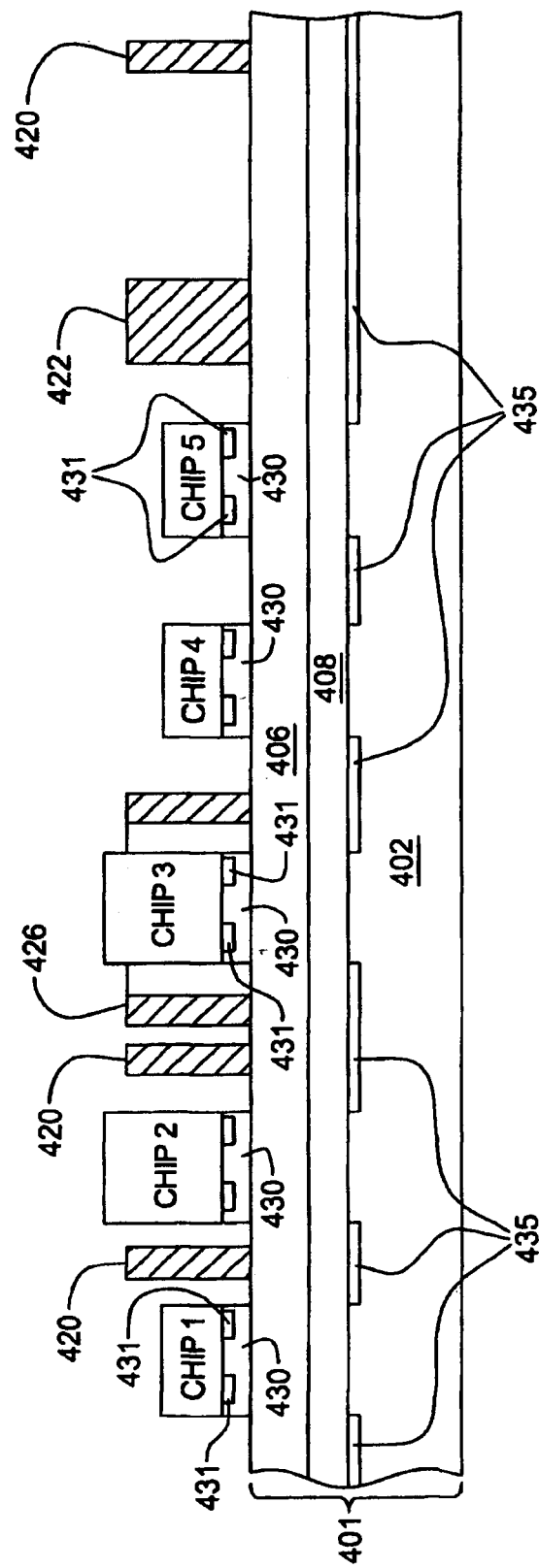
Figure 4E:
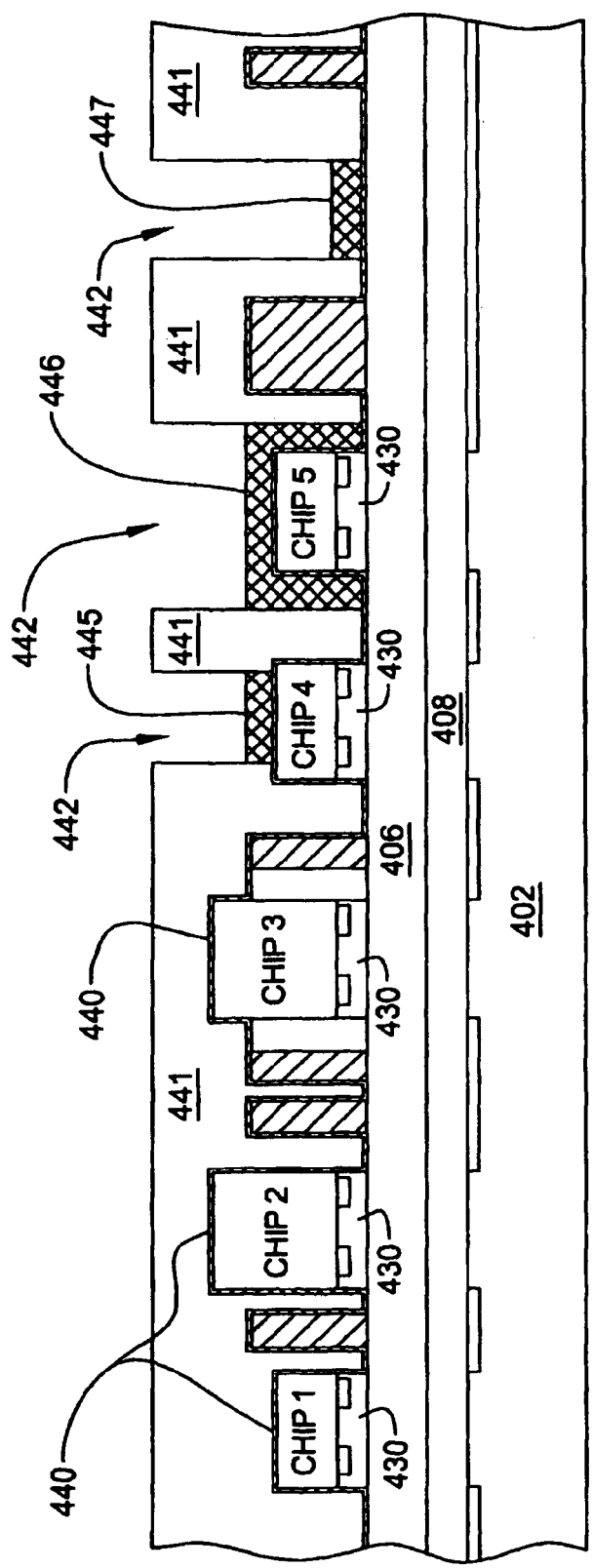
Figure 4F:
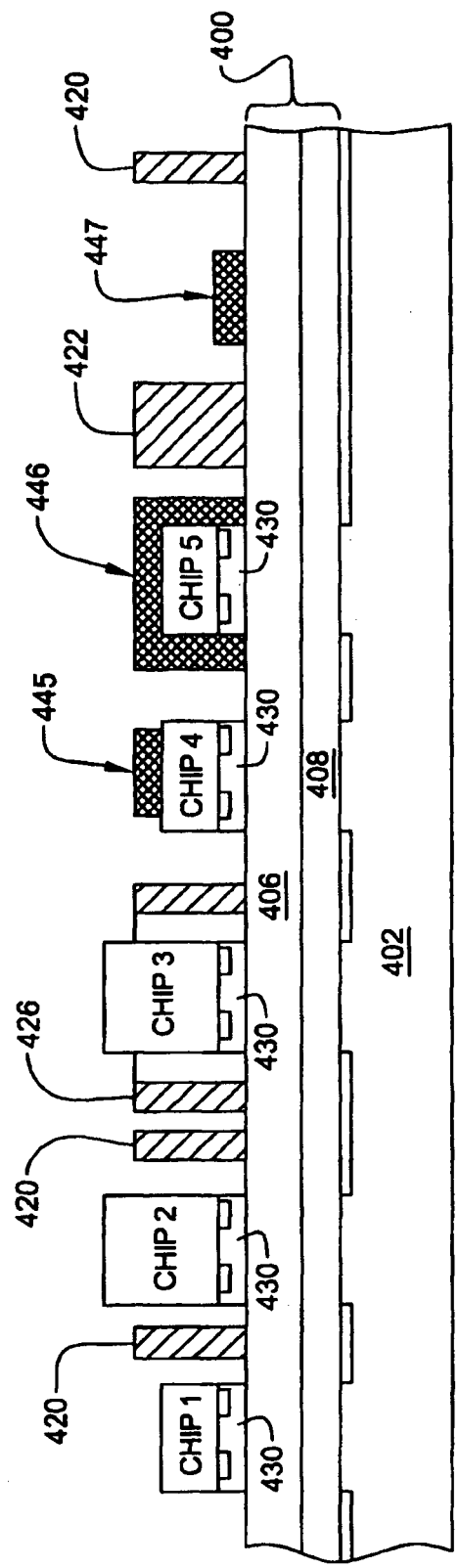
Figure 4G:
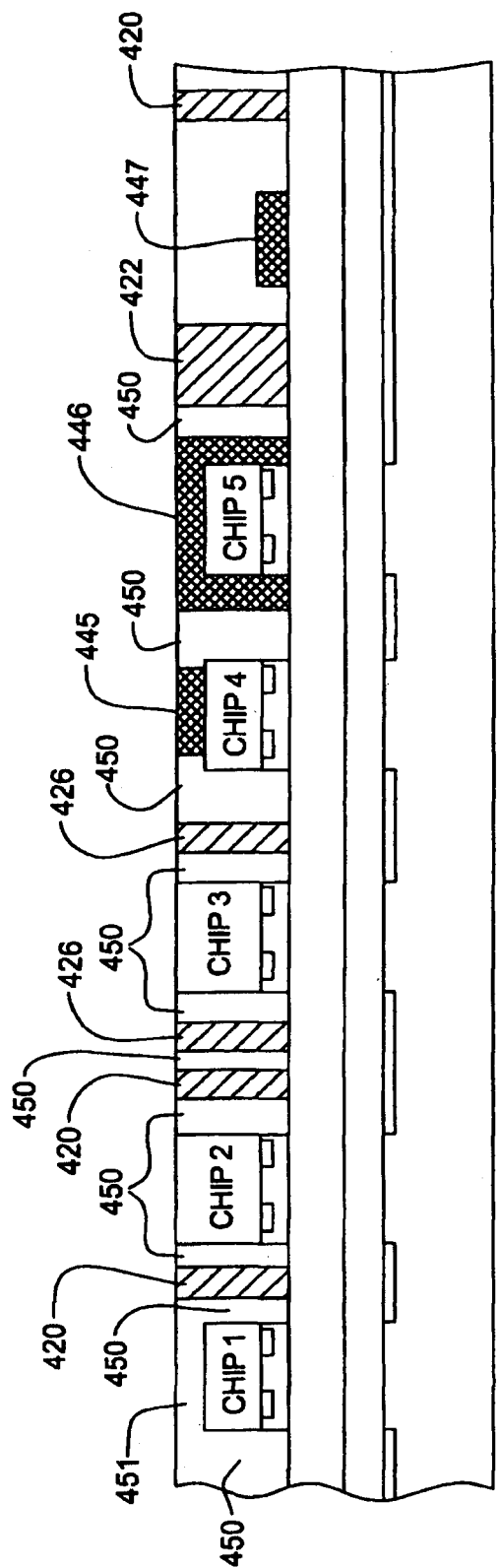
Figure 4H:
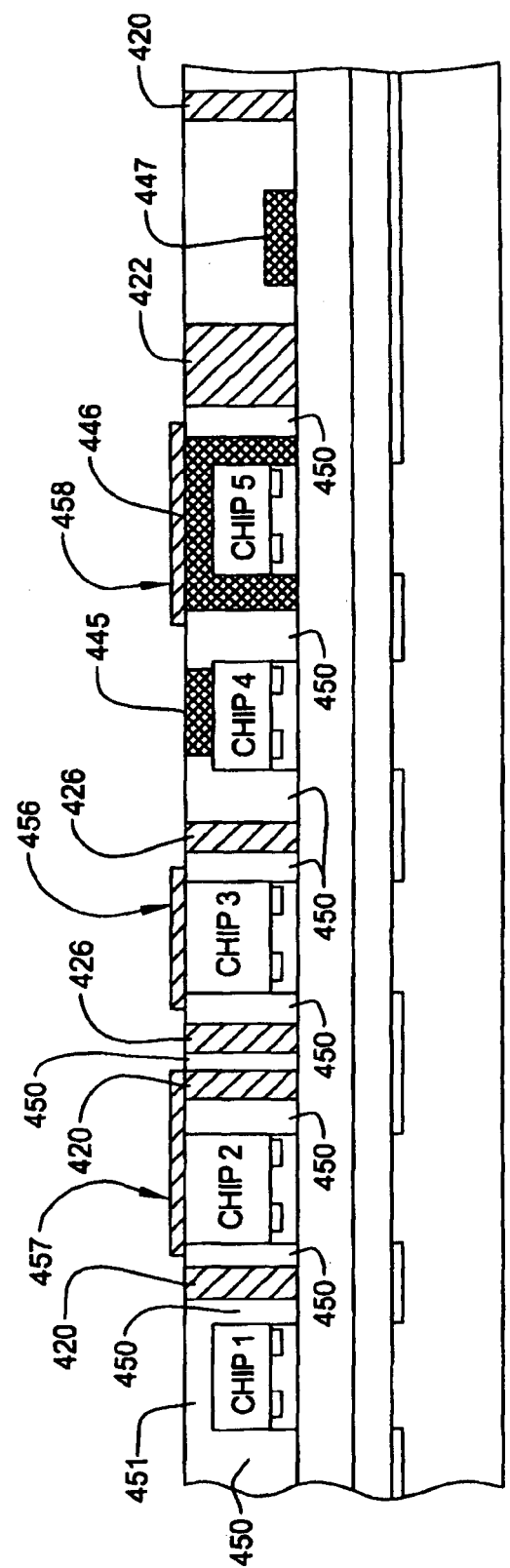
Figure 4I:
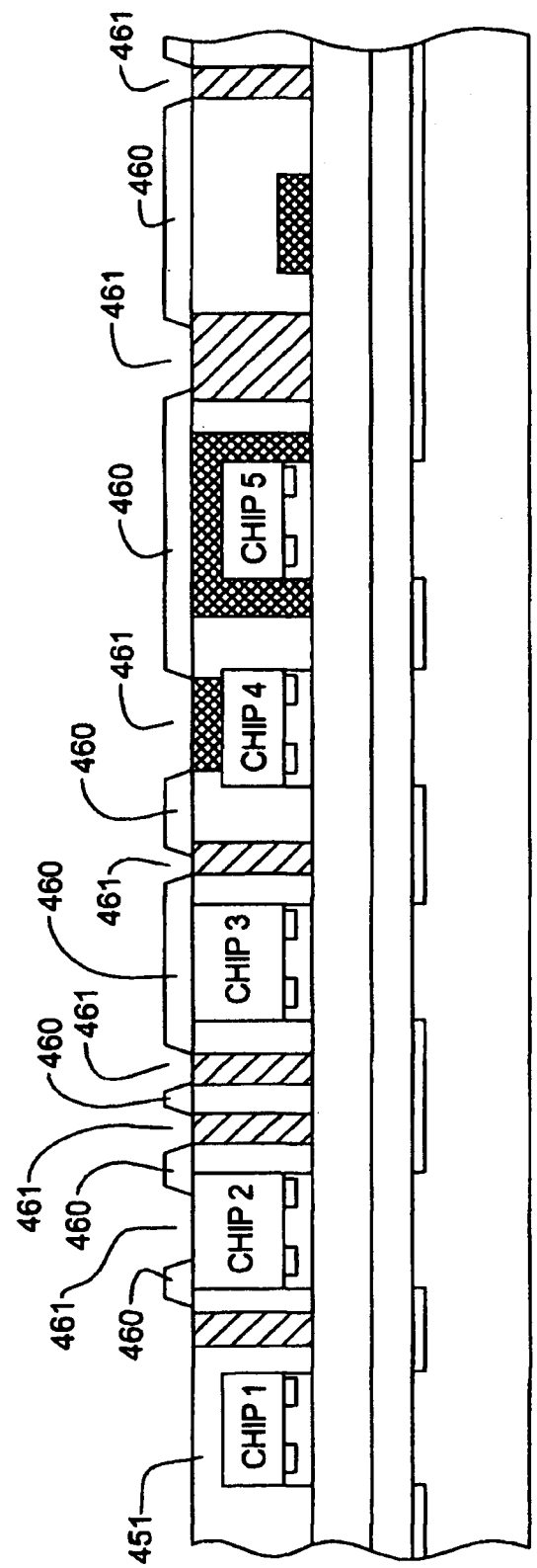
Figure 4J:
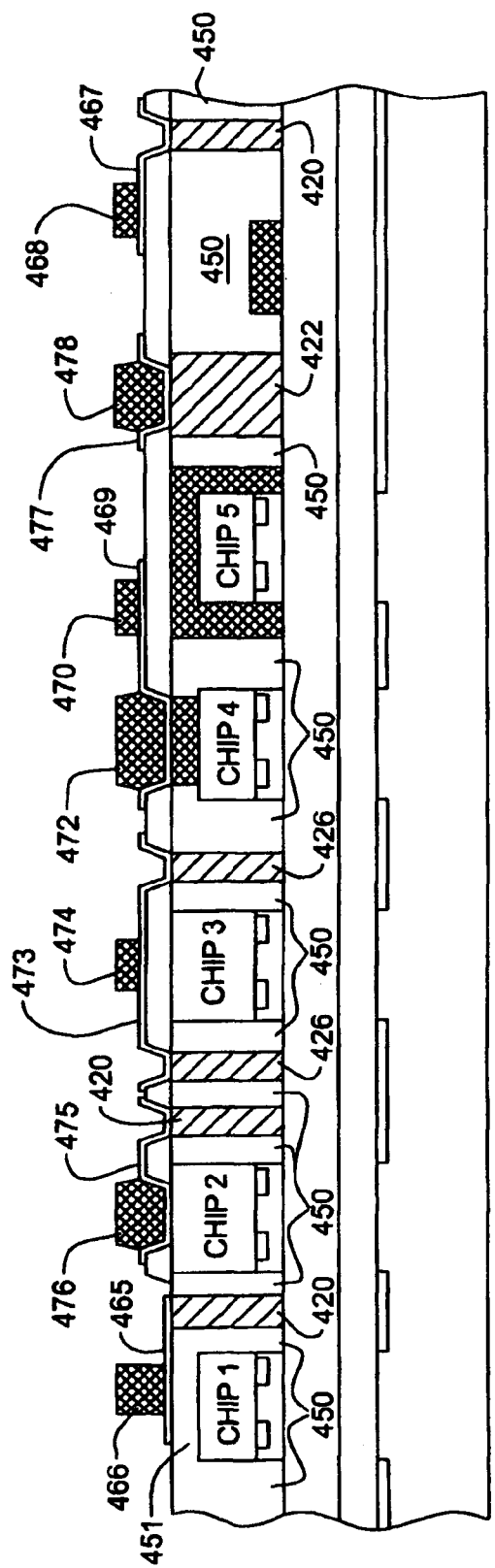
Figure 4L:
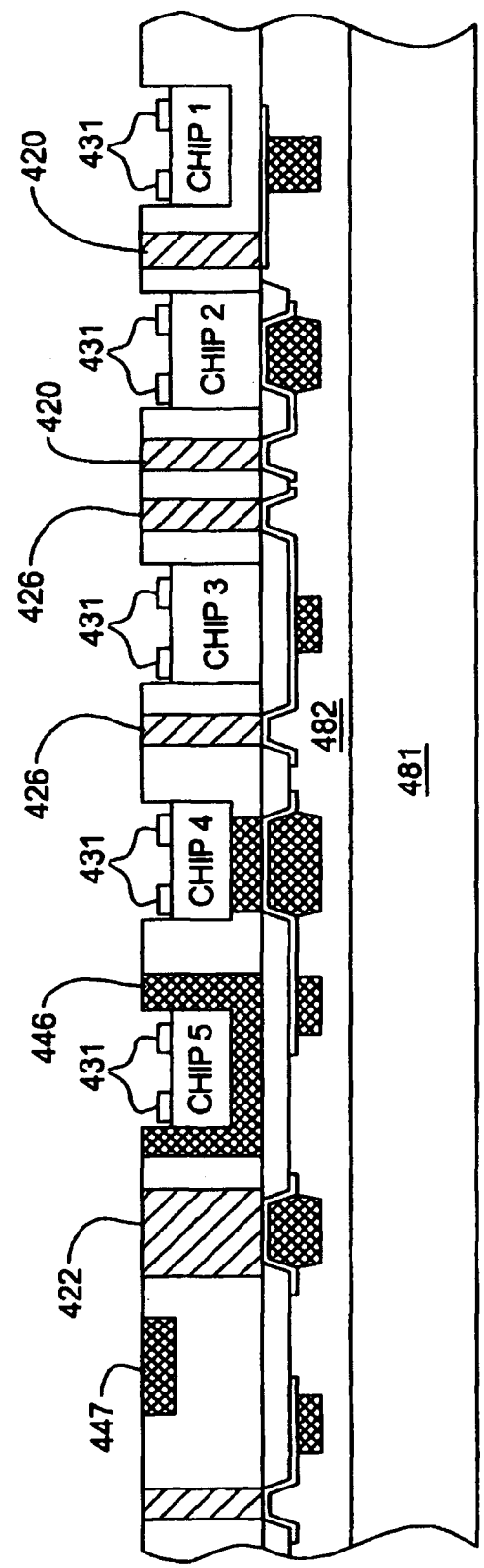
Figure 4M:
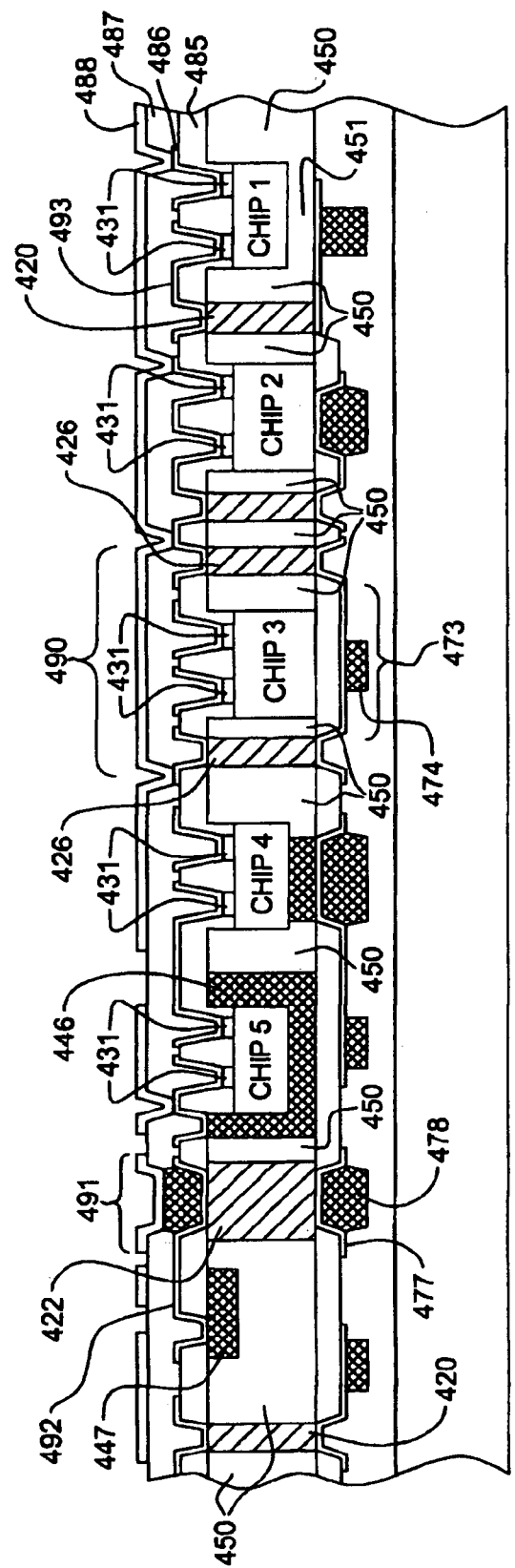
Figure 4N:
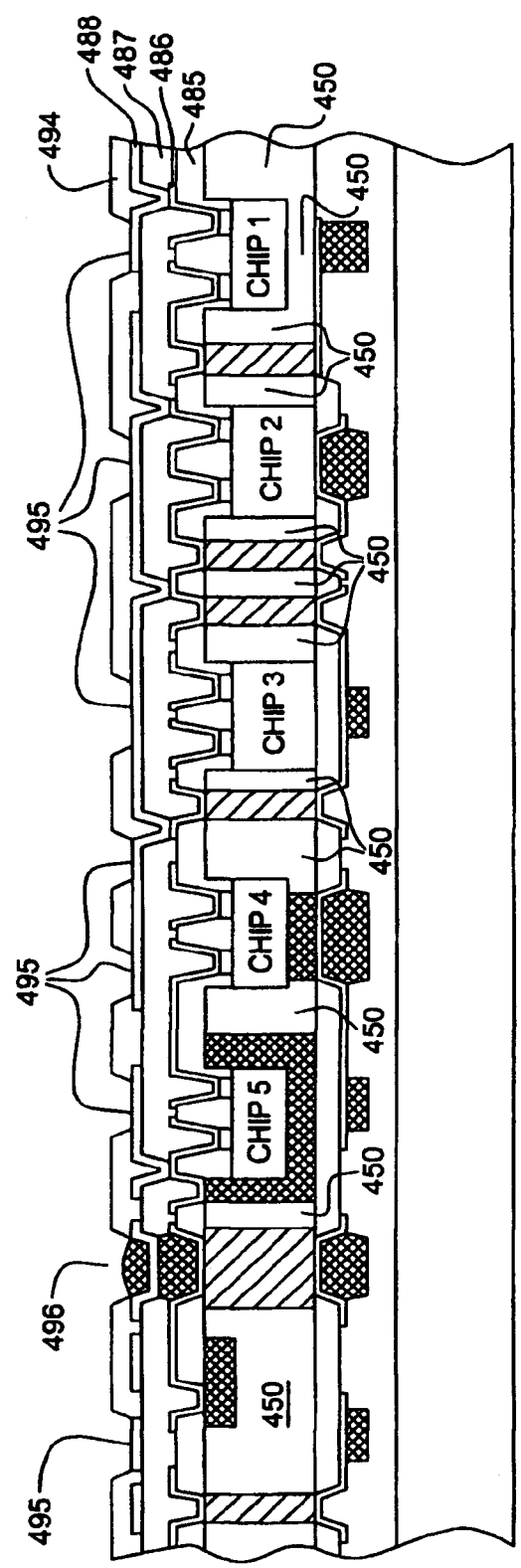
Figure 4O:
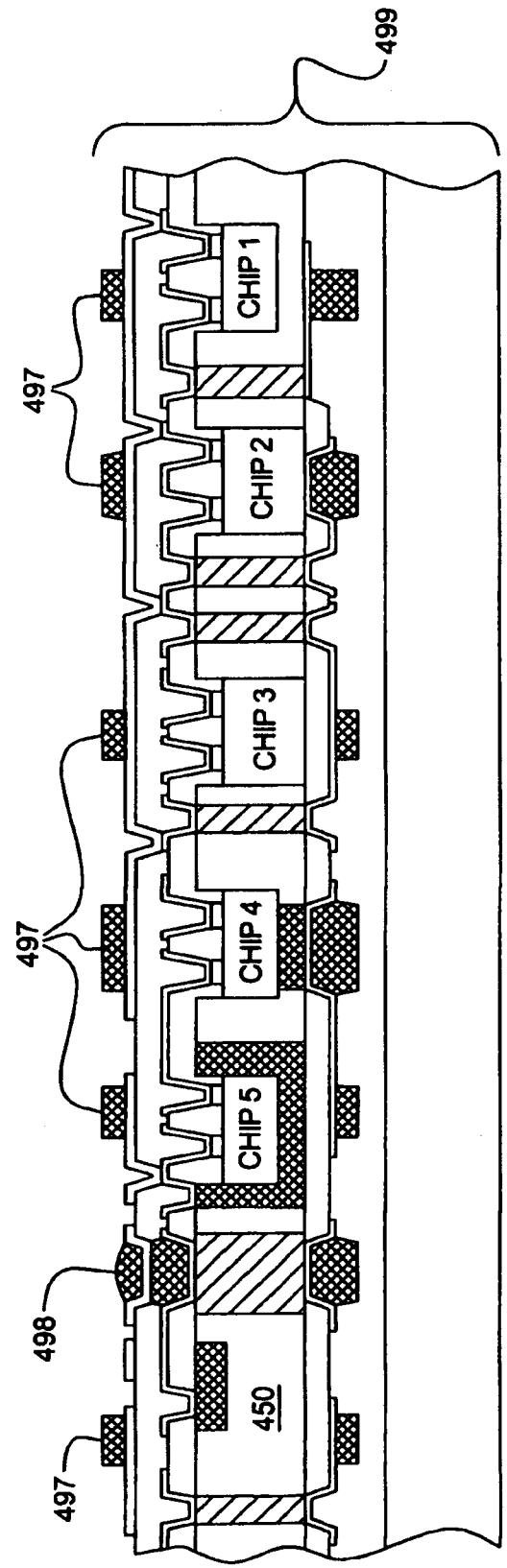
Figure 5B:
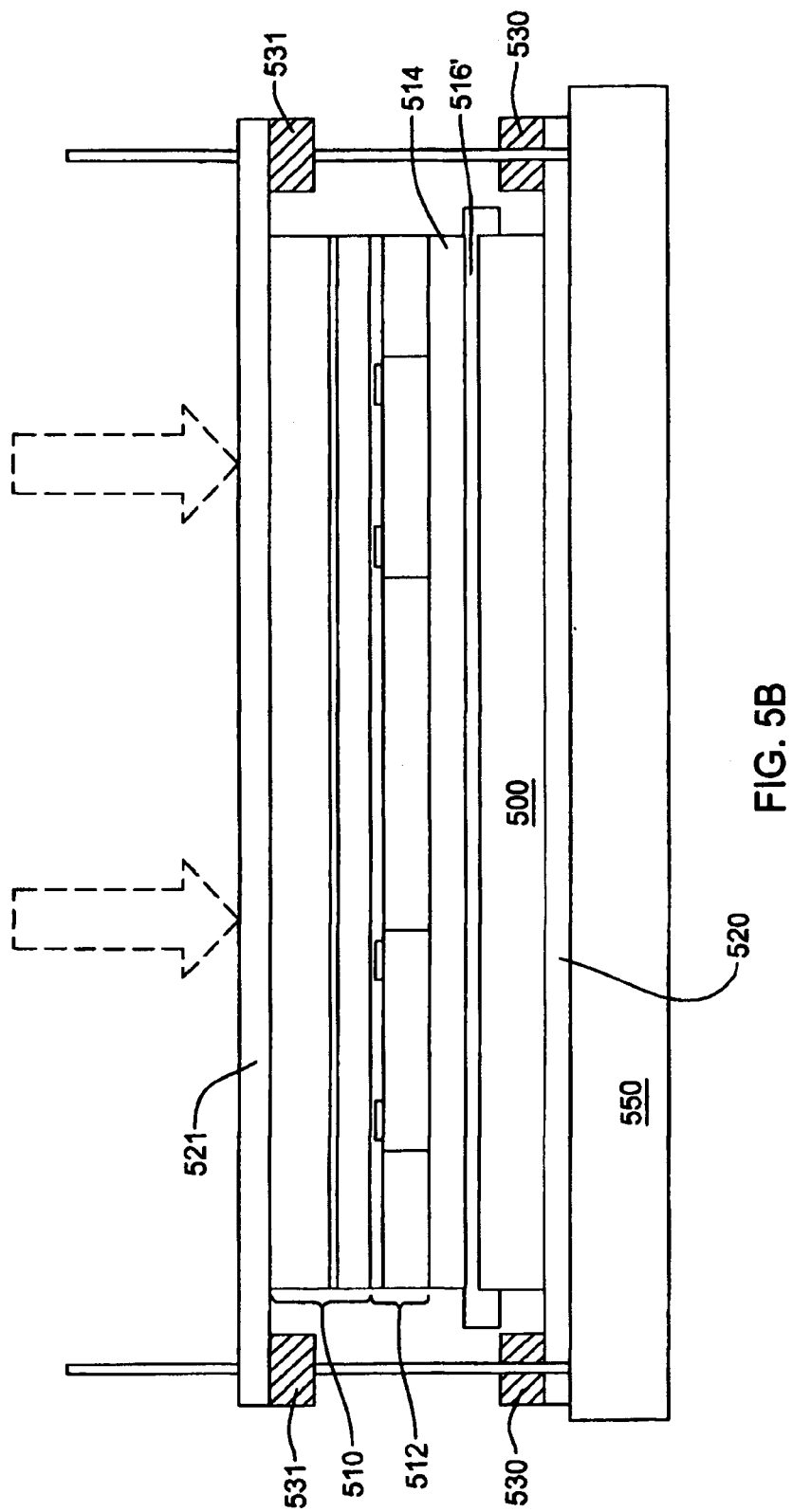
Figure 6:
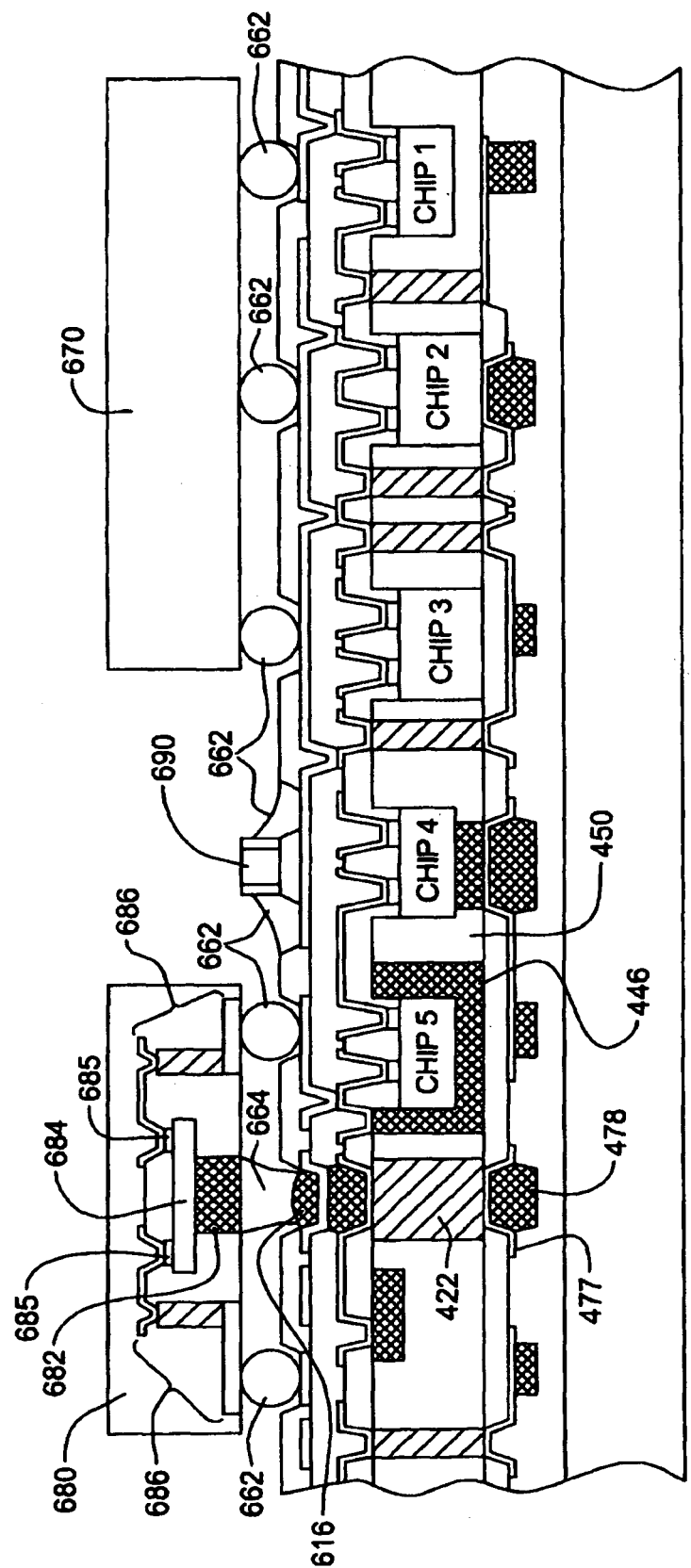
Figure 7A:
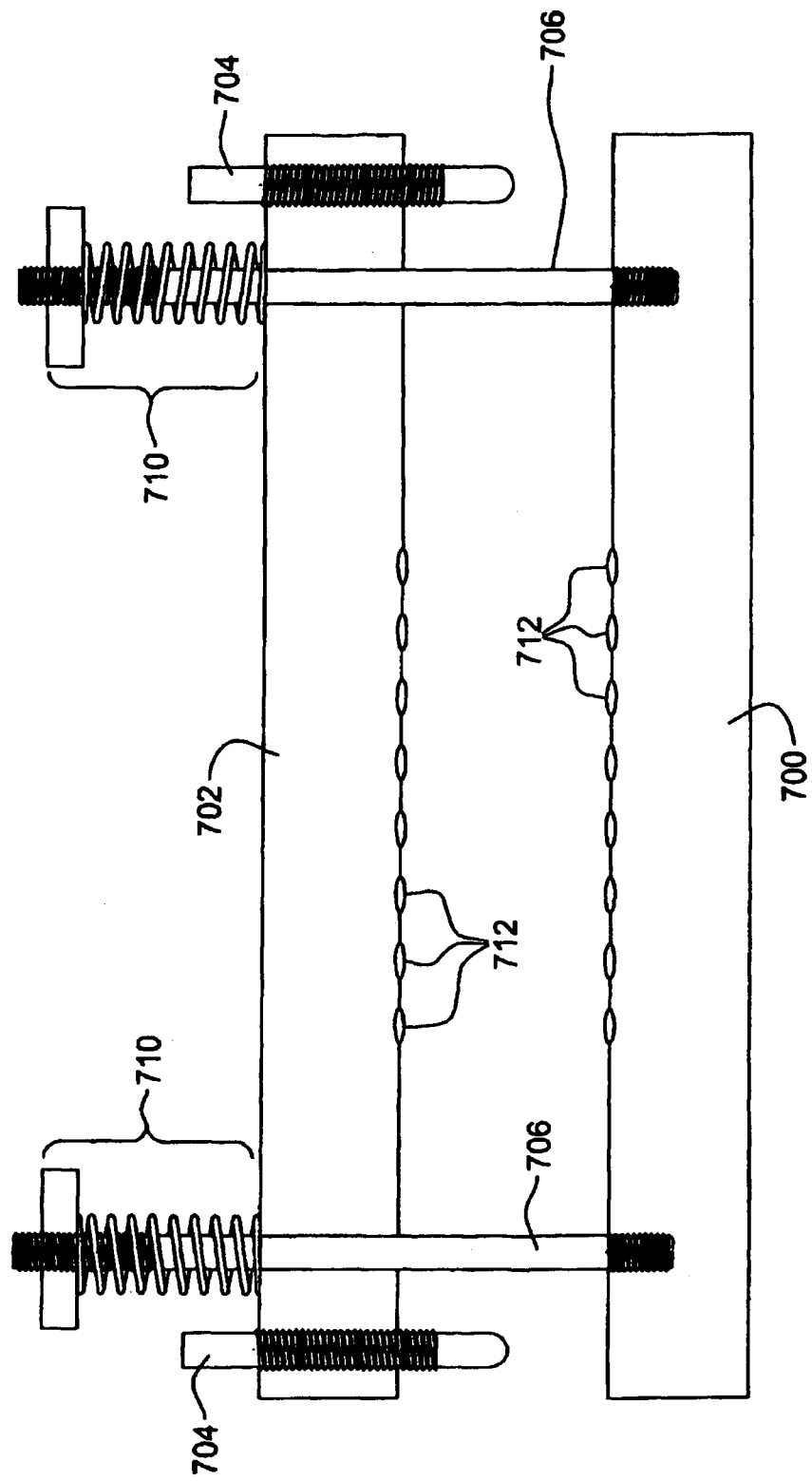
Figure 7B:
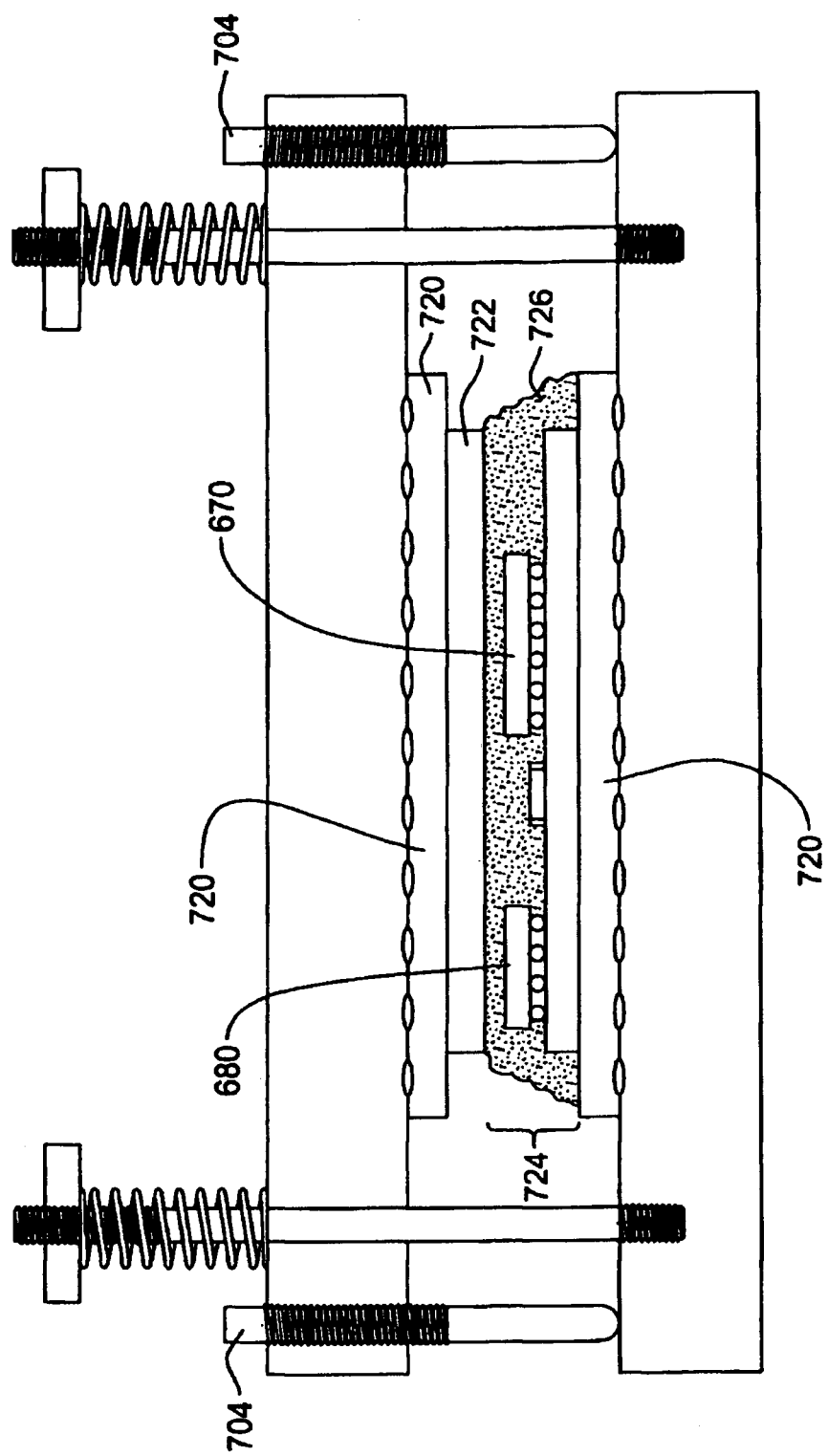
Figure 8A:
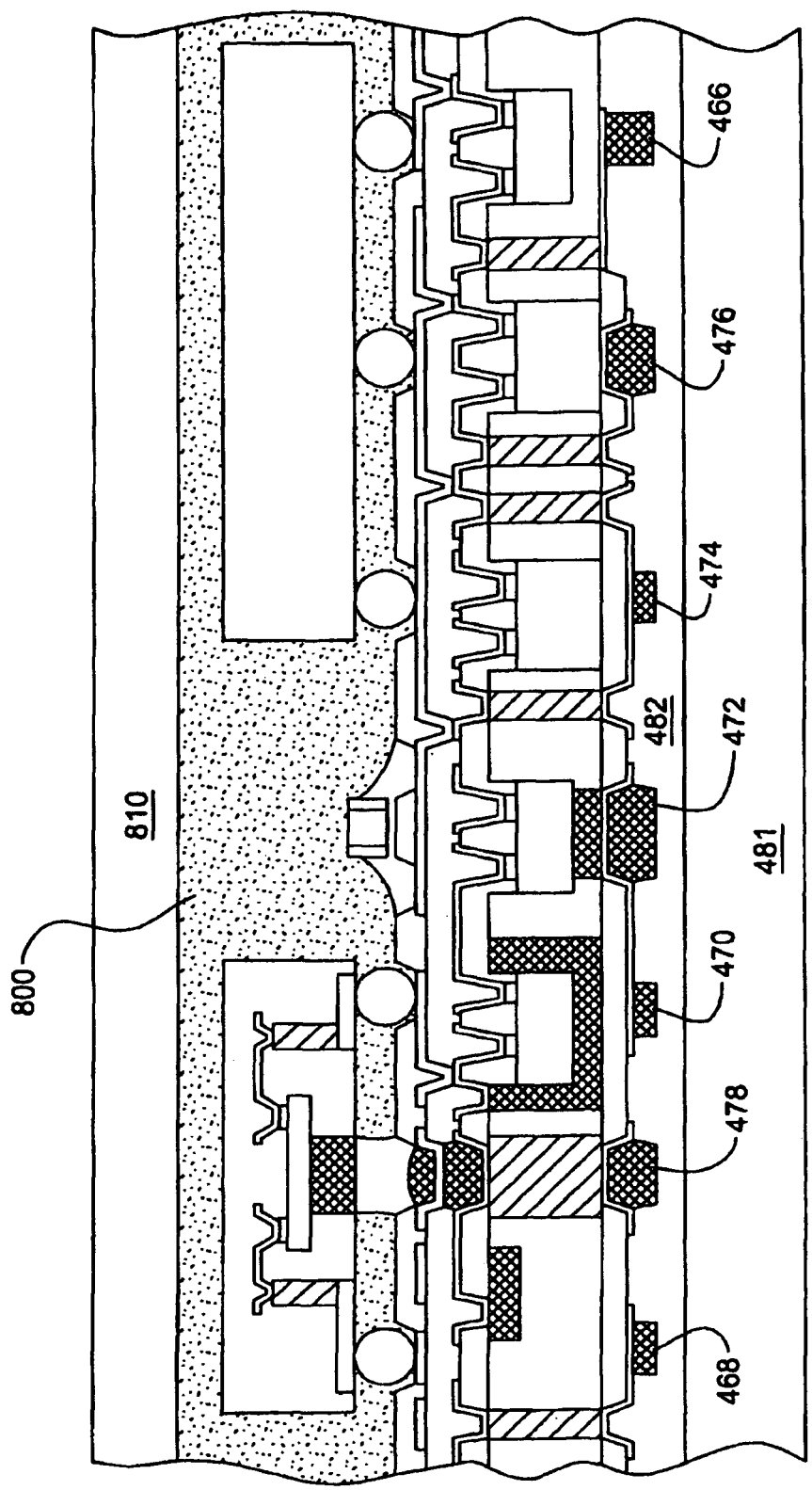
Figure 8B:
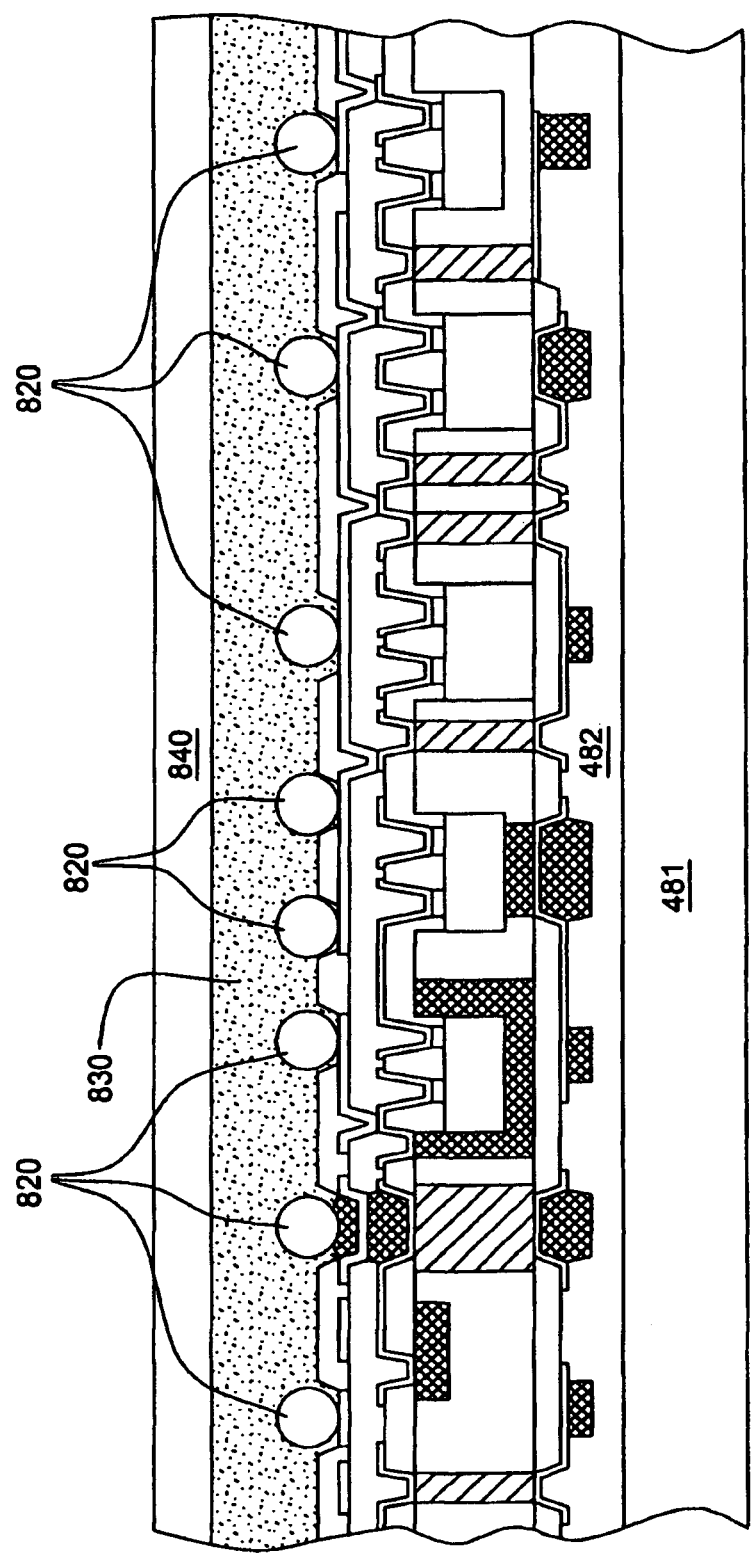
Figure 9A:
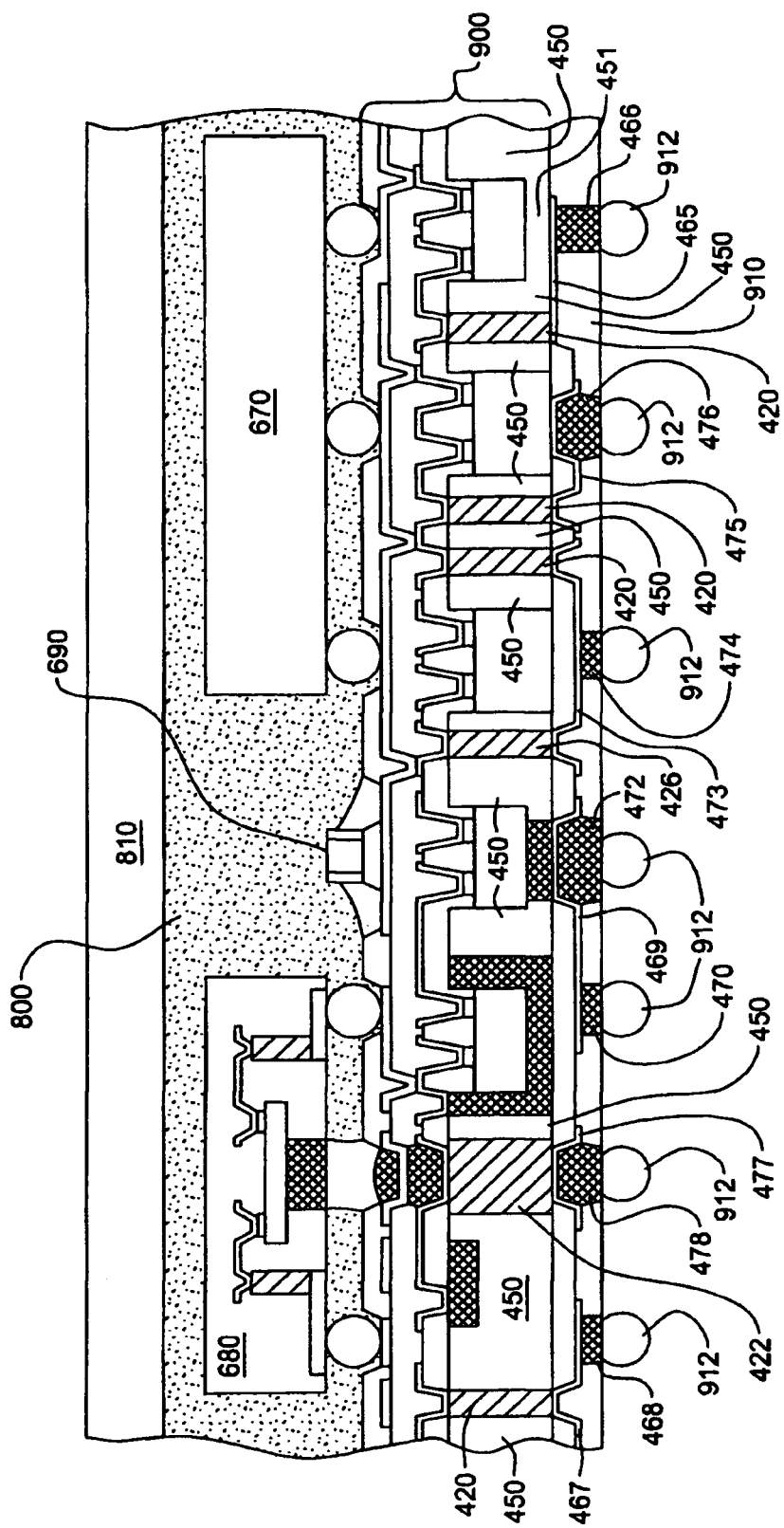
Figure 9B:
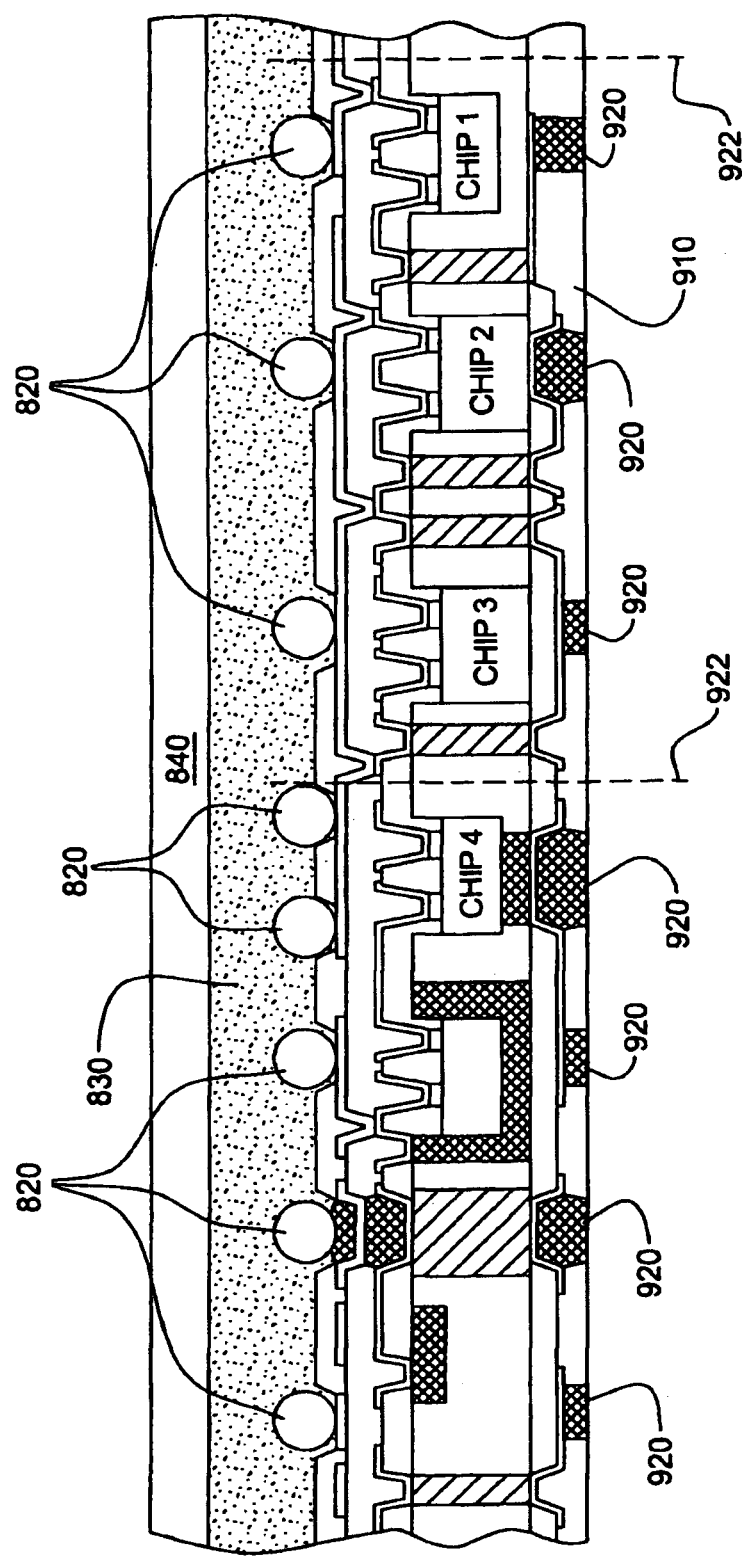
Figure 10A:
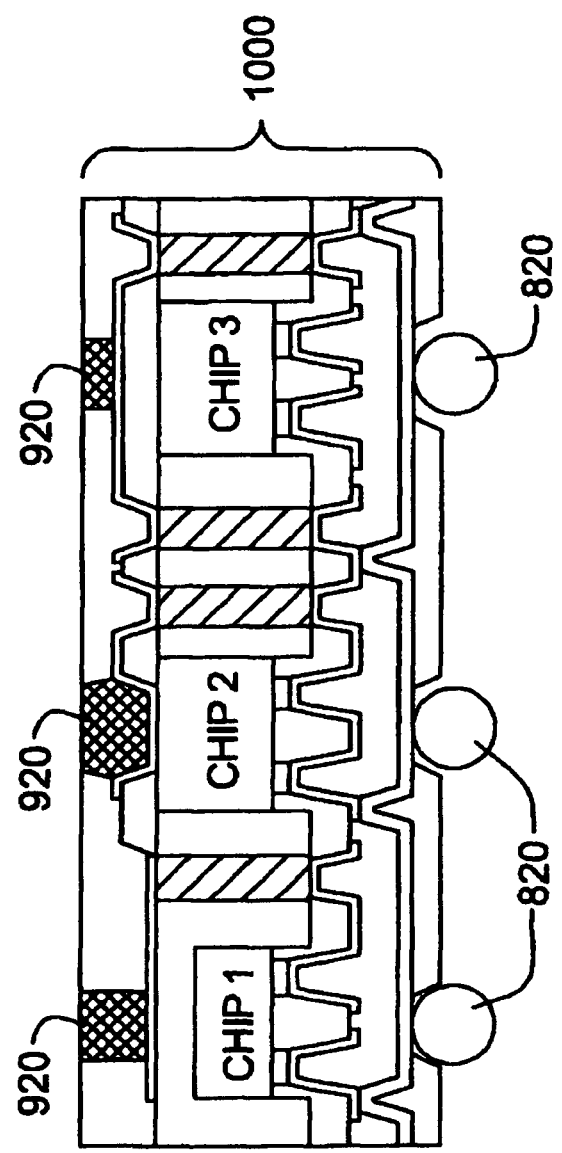
Figure 10B:
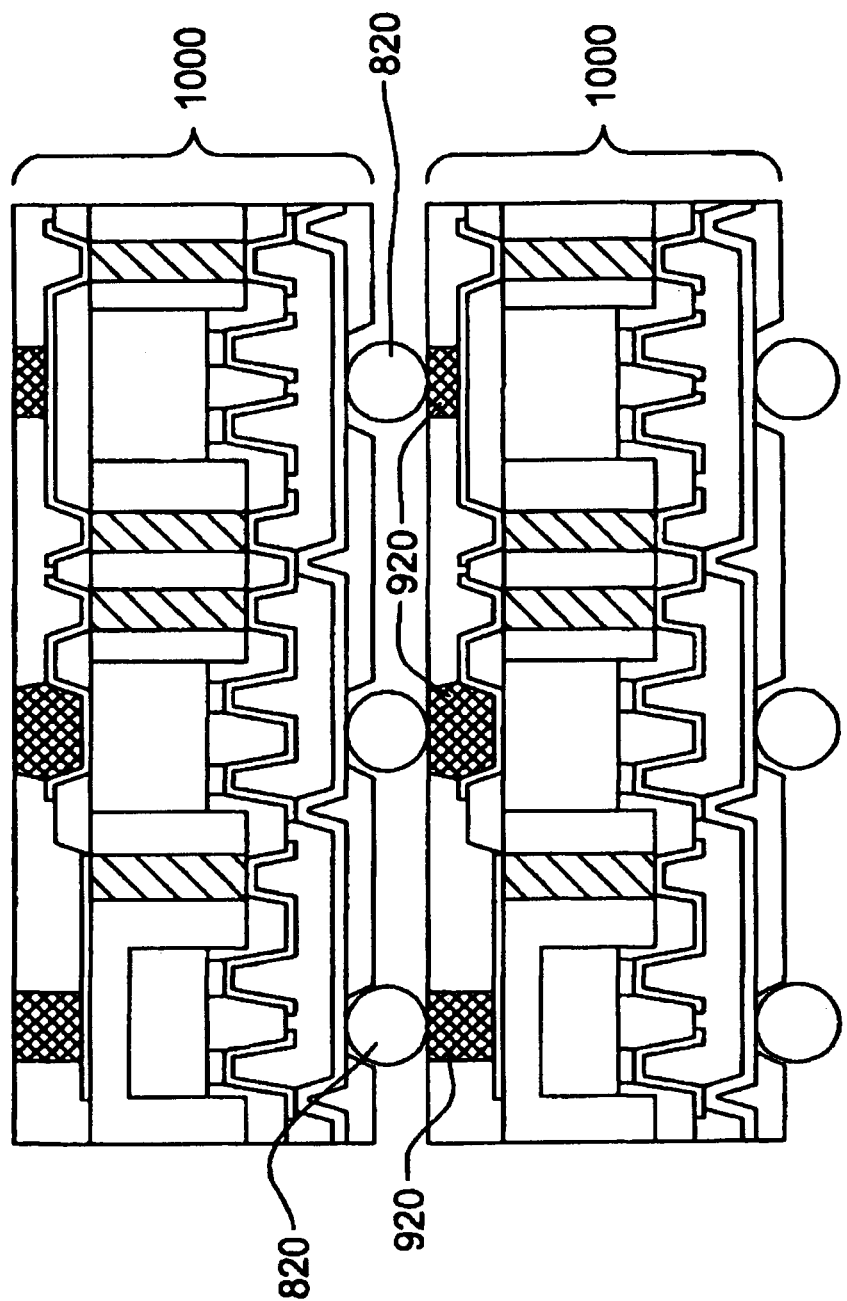
Figure 11:
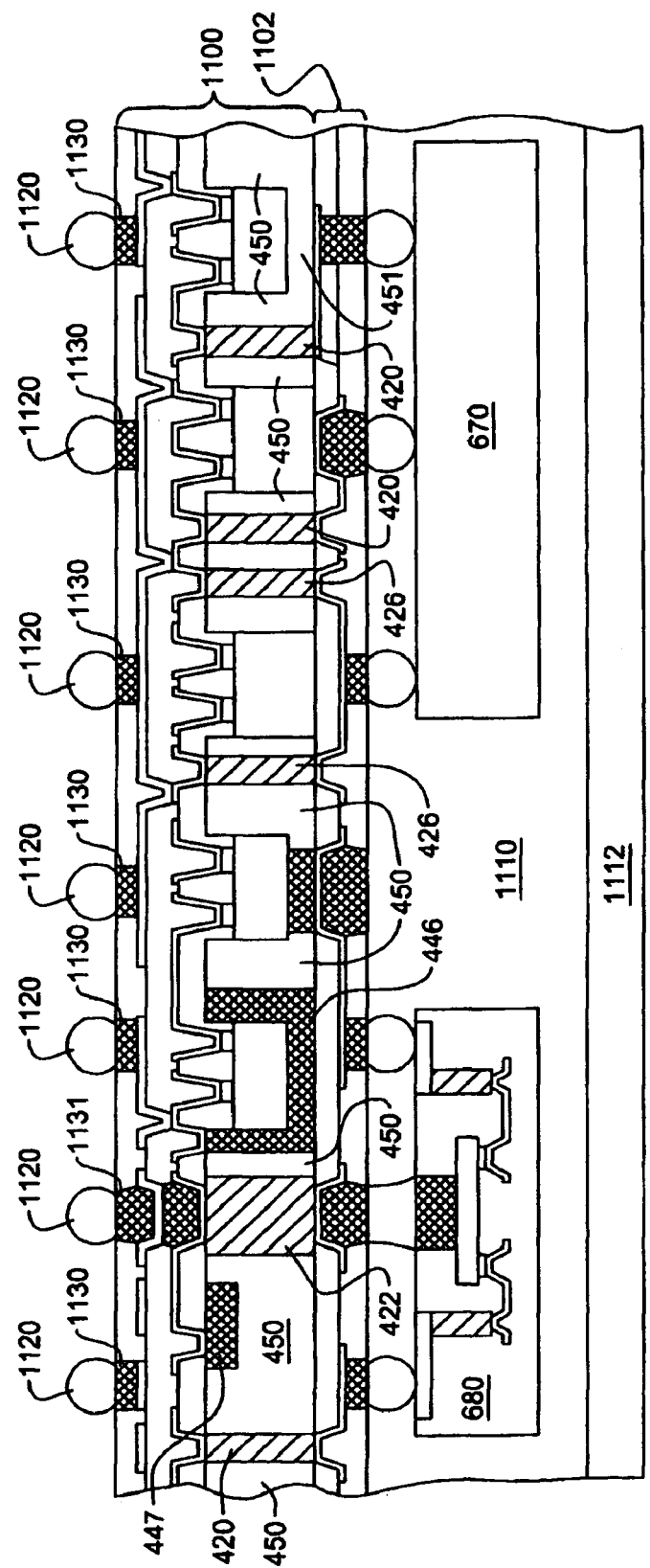
Figure 12A:
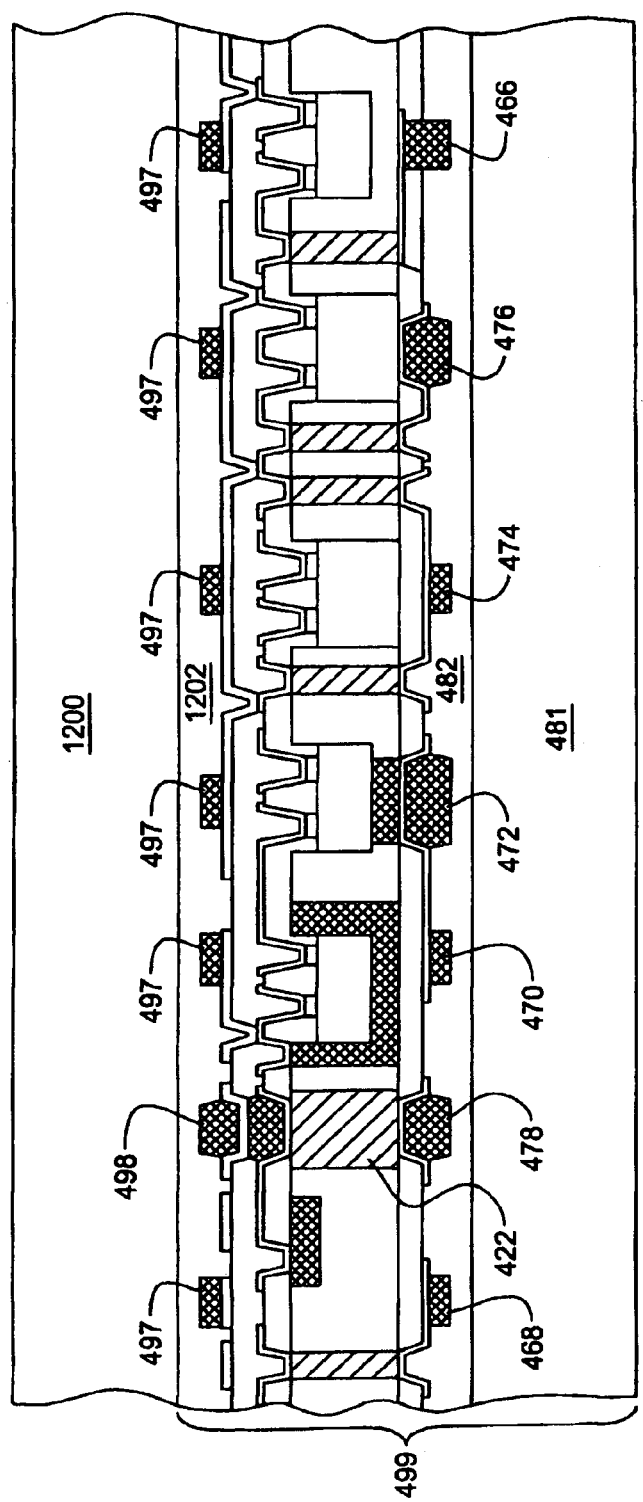
Figure 12B:
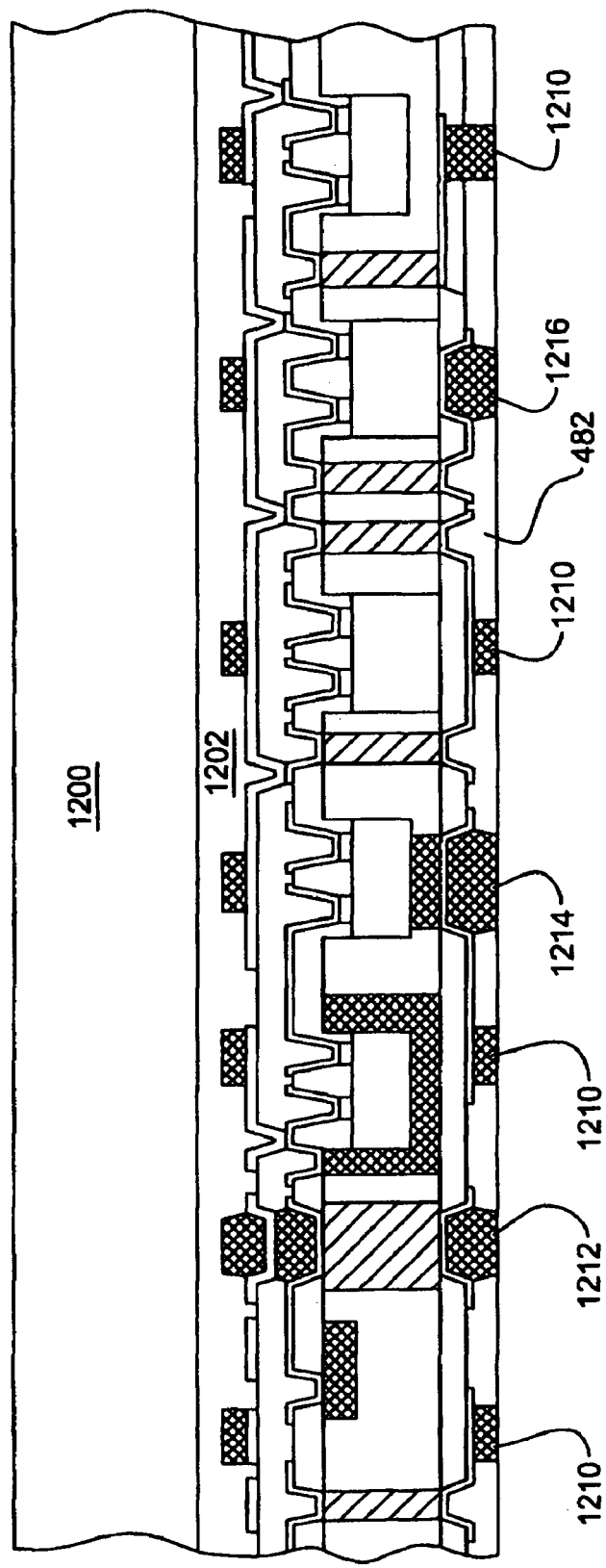
Figure 12C:
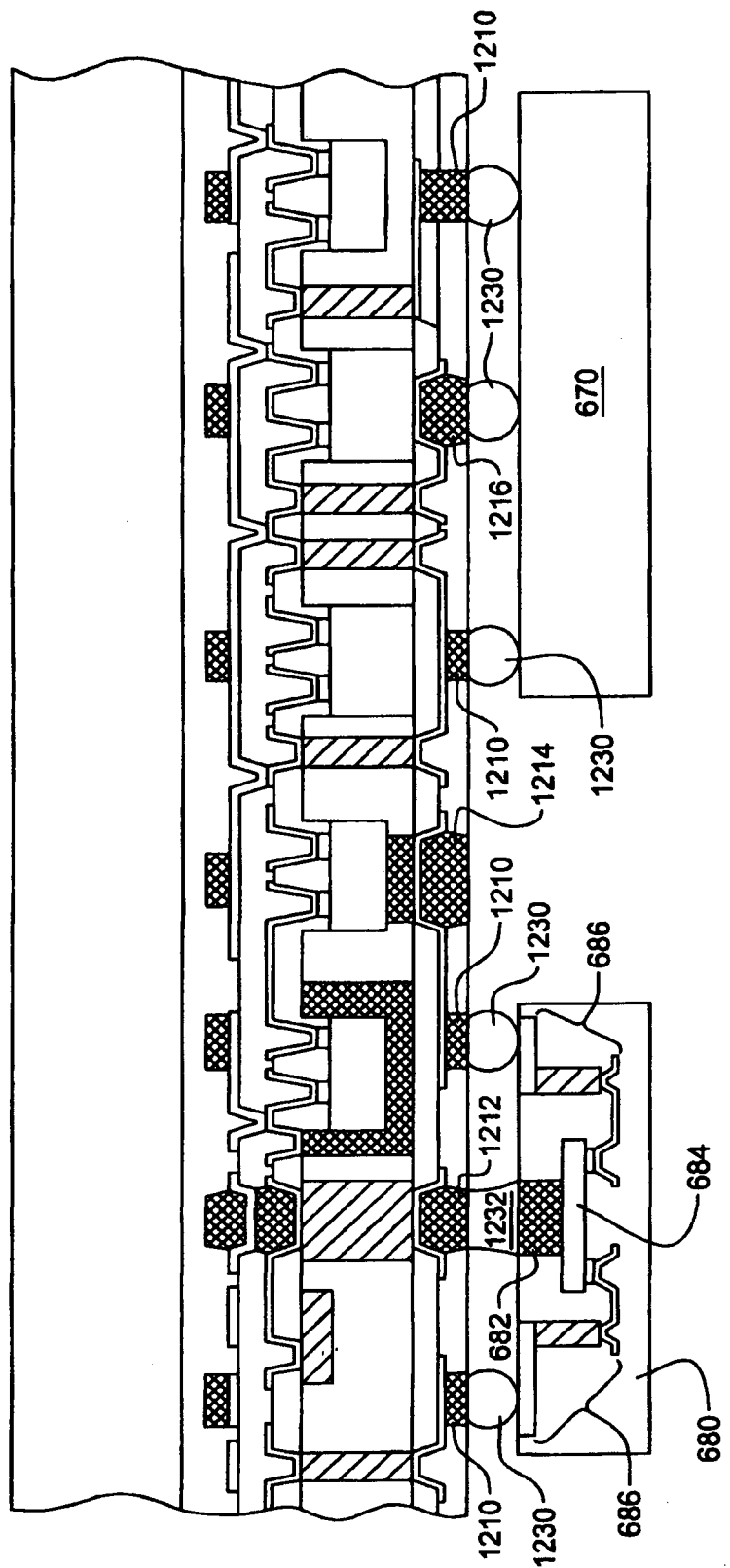
Figure 12D:
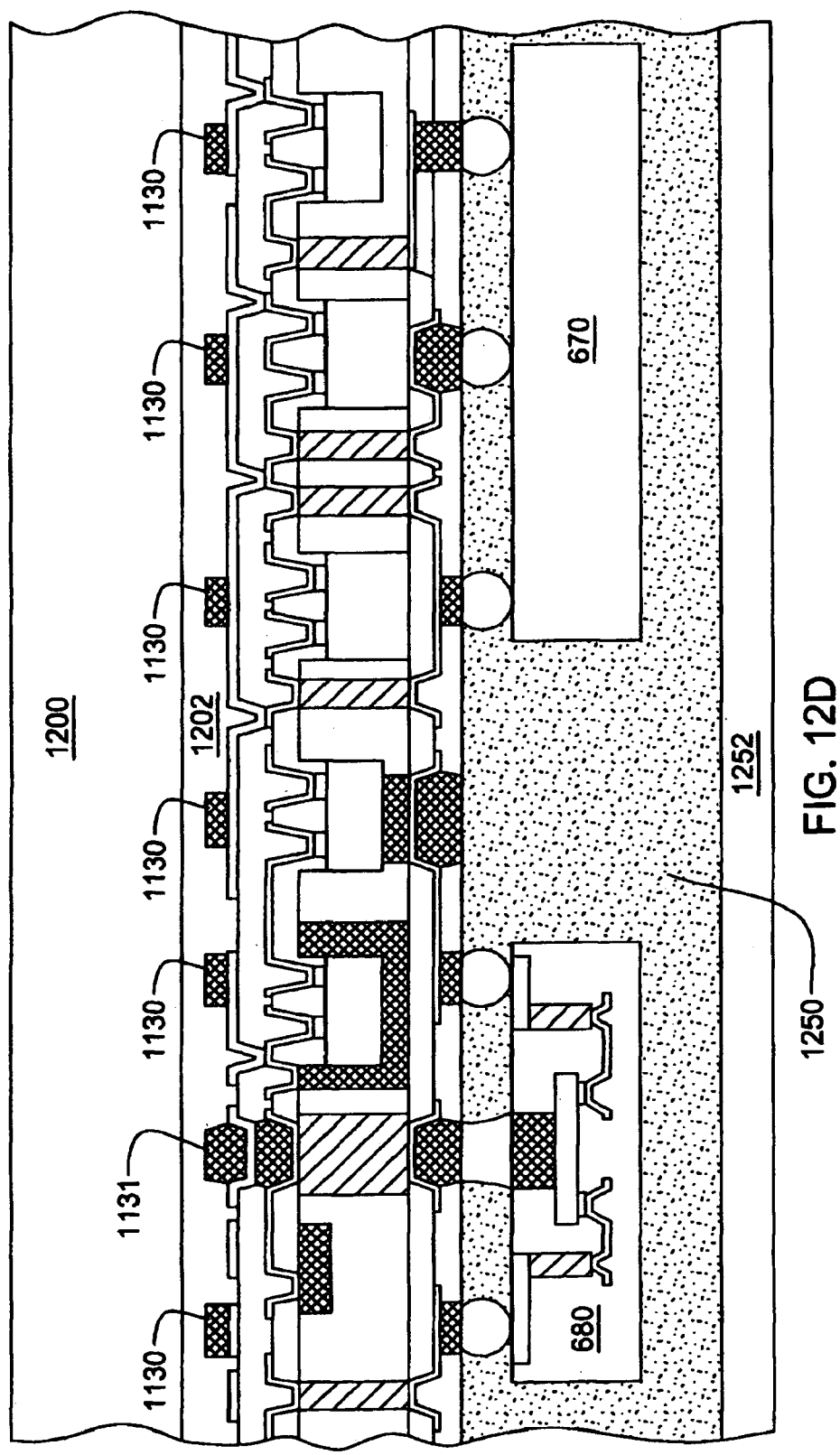

FIG. 12D depicts the multichip module after removal of the low tack adhesive tape. Encapsulant 1250 surrounds modules 670 and 680 and attaches an optional stiffener 1252. FIGS. 7A & 7B show a fixture that maintains accurate thickness of the encapsulant as well as allowing the attachment of a stiffener. It should be understood that conventional molding devices such as used to form electronic packages could also be used. In addition, if the fixture of FIGS. 7A & 7B is contained in a vacuum and the forcing devices shown are made pneumatic or otherwise remotely actuated, then the encapsulant may be degassed before the upper and lower plates of the fixture are forced together.

Removal of Second Process Carrier

At this point, process carrier 2 1200 can be removed. The second process carrier is removed by following the steps outlined in Removal of Process Carrier. This is again accomplished by lapping the glass process carrier and continuing lapping partially into the adhesive 1202 until the redistribution pads, and thermal slugs are exposed. Lapping can be carried out on a Lapmaster 36 using an alumina lap slurry such as WCA 20. The panel is attached to a vacuum hold down diamond stop lap carrier. The diamond stops are set to prevent lapping beyond the point where redistribution pads and thermal slugs are exposed. A pressure of 2 psi is applied as a ramp over a five minute interval and lapping is continued until the diamond stops are riding on the lapping wheel. Alternatively, the process carrier may be removed by fine grinding or back-grinding equipment.

Note that the lapping or grinding process can yield a solder mask which can be used either to provide masking for application of solder bumps or for solder land pads when the bumps are on another module, device, component or circuit board. This solder mask feature is automatically provided since the adhesive 1202 that was used to adhere the module to the process carrier still surrounds the land pads 1130 and thermal slug lands 1131. As mentioned, this material was chosen to be a high temperature material such as epoxy which is ideal for solder mask applications.

Adding Solder Bumps to the Top Side

The final processing steps add the interconnect bumps to the top of the module. This process is similar to that described in the section entitled Adding Solder Bumps to the Top Side, except that it is done on the surface above the active surface of the chips. The process is summarized again to avoid confusion. Solder paste is screen printed onto the exposed land pads 1130 and thermal slug pads 1131. Stencil printing solder paste is well know in the art. The assembly is then placed into a reflow oven and heated on a rapid ramp to just above the melting point of the solder, which melts the solder and forms bumps 1120 (see FIG. 11). The module panel is then cooled.

FIG. 11 shows the completed cell phone in a package multichip module, with a chips-first multichip layer 1000, through connects 420 from top to bottom in the filler/encapsulant (i.e., structural material), redistribution interconnect and land pads on the bottom 1102; a second layer of surface mounted modules 670, 680 and components attached to the bottom, an encapsulant 1110 and optional stiffener 1112 on the bottom, and I/O bumps 1120 on the top.

Although only one multichip module has been shown in many of the figures, in practice the modules are processed in a large panel which holds many modules. At this point, the panel would be singulated into individual multichip modules using a dicing saw. This completes the fabrication of another embodiment of the electronic system or subsystem in a package.

Further Variations

Other Types of Bumps

In each case where application of solder bumps is described above, there may be alternatives to fabricating any type of bump or pad structure suitable for the intended application. As an example, consider as a starting point the module of FIG. 4N, which shows solder mask 494 with openings 495, 496 that expose underlying copper pads. Any kind of metal bump or pad may be fabricated by first sputtering a copper seed layer over the solder mask 494 and into the openings 495, 496, applying photo resist, patterning holes in the photo resist where the bumps/pads are desired and plating up to the desired size of the bump/pad. This is followed by removal of the resist and etching the copper seed layer. This approach may be used, for example, to plate pads that have only a thin coating of solder. When this type of module is assembled into a system, the thickness of the system is reduced since the bump is quite thin. A bump of minimal height is especially effective when the dielectric below is of the low modulus, high elongation type such that stress/strain on the solder interconnect itself is minimized. In addition, the use of pure copper bumps for interconnection is well known in the art.

Other Types of Process Carriers and Their Removal

In each case where the use of a process carrier is described, the process carrier is adhesively attached and subsequently removed by lapping or grinding. Other types of process carrier removal may also be used. For example, using a process carrier that is transparent to laser light, the carrier may be removed by, for example, excimer laser pulses through the carrier that vaporize a small portion of the adhesive, thus separating the process carrier. Additionally, other techniques including using a process carrier with a solventable layer and solvent removing the carrier, or using one with a melting point above the previous processing temperatures and heating above this melting point and removing the carrier may be employed.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the spirit of the invention, and these are therefore considered to be within the scope of the invention as defined in the following claims.

What is claimed is:

1. An electronic module comprising:
a chip layer including:
at least one chip,
each chip comprising at least
one side surface,
an upper surface,
a lower surface, and
at least one contact pad at the upper surface;
a structural material surrounding and physically contacting the at least one side surface of each chip of the chip layer,
the structural material having an upper surface substantially co-planar with or parallel to an upper surface of each chip and defining at least a portion of a front surface of the chip layer, and
a lower surface substantially co-planar with or parallel to a lower surface of each chip and defining at least a portion of a back surface of the chip layer;
an interconnect layer disposed over the front surface of the chip layer,
the interconnect layer including at least one electrical conductor extending at least in part horizontally and in opposing relation to the front surface of the chip layer,
wherein the interconnect layer electrically connects to a contact pad of the at least one contact pad of the at least one chip of the chip layer; and
at least one electronic device disposed over the front surface of the chip layer and electrically connected to the interconnect layer; and
a thermal conduit from a surface of the at least one electronic device, through the interconnect layer and the chip layer to the back surface of the chip layer,
the thermal conduit comprising at least one thermally conductive structure extending through the structural material between the front surface and the back surface of the chip layer,
the thermal conduit facilitating extraction of heat from the at least one electronic device disposed over the front surface of the chip layer to the back surface of the chip layer.

2. The electronic module of claim 1 (see the rejection of claim 1 above), wherein the thermal conduit further comprises
a thermally conductive material disposed between the surface of the at least one electronic device and the at least one thermally conductive structure extending through the structural material.

3. The electronic module of claim 1 (see the rejection of claim 1 above),
wherein the at least one electronic device comprises at least one integrated circuit chip.

4. The electronic module of claim 1, further comprising multiple devices disposed over the front surface of the chip layer, at least two devices of the multiple devices having a surface thereof thermally coupled via a respective thermal conduit to the back surface of the chip layer for the extraction of heat from the at least two devices to the back surface of the chip layer.

5. The electronic module of claim 1 (see the rejection of claim 1 above), further comprising
a redistribution layer disposed over the back surface of the chip layer between the back surface of the chip layer and
a plurality of contacts arrayed over the redistribution layer, and
wherein the thermal conduit extends through the redistribution layer to facilitate extraction of heat from the surface of the at least one electronic device to at least one respective contact of the plurality of contacts arrayed over the redistribution layer.

6. The electronic module of claim 5, wherein the thermal conduit is a first thermal conduit, and wherein the electronic module further comprises a second thermal conduit, the second thermal conduit extending from a lower surface of a chip of the at least one chip of the chip layer through the redistribution layer to at least one respective contact of the plurality of contacts arrayed over the redistribution layer for facilitating extraction of heat from the chip of the at least one chip.

7. The electronic module of claim 1, wherein the thermal conduit comprises multiple aligned thermally conductive slugs or vias.

8. The electronic module of claim 1 (see the rejection of claim 1 above),
wherein the at least one electronic device is at least one packaged device, and
wherein the thermal conduit further comprises a thermally conductive material disposed within the at least one packaged device and aligned over the at least one thermally conductive structure extending through the structural material between the front surface and back surface of the chip layer.

9. A method of fabricating an electronic module comprising:
forming a chip layer including:
obtaining at least one chip,
each chip comprising
at least one side surface,
an upper surface,
a lower surface, and
at least one contact pad at the upper surface; and
disposing a structural material around and physically contacting the at least one side surface of each chip of the chip layer,
the structural material having an upper surface substantially co-planar with or parallel to an upper surface of the at least one chip and
defining at least a portion of a front surface of the chip layer, and
a lower surface substantially co-planar with or parallel to a lower surface of the at least one circuit chip and
defining at least a portion of a back surface of the chip layer;
providing an interconnect layer disposed over the front surface of the chip layer,
the interconnect layer including at least one electrical conductor extending at least in part horizontally and in opposing relation to the front surface of the chip layer,
wherein the interconnect layer electrically connects to a contact pad of the at least one contact pad of the at least one chip of the chip layer;
disposing at least one electronic device above the front surface of the chip layer and electrically connected to the interconnect layer; and
providing a thermal conduit from a surface of the at least one electronic device,
through the interconnect layer and the chip layer to the back surface of the chip layer,
the thermal conduit comprising at least one thermally conductive structure extending through the structural material between the front surface and the back surface of the chip layer,
the thermal conduit facilitating extraction of heat from the at least one electronic device disposed above the front surface of the chip layer to the back surface of the chip layer.

10. The method of claim 9 (see the rejection of claim 9 above),
wherein the thermal conduit further comprises a thermally conductive material disposed between the surface of the at least one electronic device and
the at least one thermally conductive structure extending through the structural material.

11. The method of claim 9 (see the rejection of claim 9 above),
wherein the at least one electronic device comprises at least one integrated circuit chip.

12. The method of claim 9, wherein disposing the at least one device further comprises disposing multiple devices over the front surface of the chip layer, at least two devices of the multiple devices having a surface thereof thermally coupled via a respective thermal conduit to the back surface of the chip layer for extraction of heat from the at least two devices to the back surface of the chip layer.

13. The method of claim 9 (see the rejection of claim 9 above), further comprising
providing a redistribution layer over the back surface of the chip layer between the back surface of the chip layer and a plurality of contacts arrayed over the redistribution layer,
wherein the thermal conduit extends through the redistribution layer to facilitate extraction of heat from the surface of the at least one electronic device to at least one respective contact of the plurality of contacts arrayed over the redistribution layer.

14. The method of claim 13, wherein the thermal conduit is a first thermal conduit, and wherein the method further comprises providing a second thermal conduit, the second thermal conduit extending from a lower surface of a chip of the at least one chip of the chip layer through the redistribution layer to at least one respective contact of the plurality of contacts arrayed over the redistribution layer for facilitating extraction of heat from the chip of the at least one chip of the chip layer.

15. The method of claim 9, wherein providing the thermal conduit further comprises providing multiple aligned thermally conductive slugs or vias.

16. The method of claim 9 (see the rejection of claim 9 above),
wherein the disposing at least one electronic device further comprises
disposing at least one packaged device above the front surface of the chip layer, and
wherein providing the thermal conduit further comprises
providing a thermally conductive material disposed within the at least one packaged device and aligned over the at least one thermally conductive structure extending through the structural material between the front surface and the back surface of the chip layer.

* * * * *

UNITED STATES PATENT AND TRADEMARK OFFICE
CERTIFICATE OF CORRECTION

| | |
|---|---|
| PATENT NO. | : 7,830,000 B2 |
| APPLICATION NO. | : 12/144717 |
| DATED | : November 9, 2010 |
| INVENTOR(S) | : Eichelberger et al. |

It is certified that error appears in the above-identified patent and that said Letters Patent is hereby corrected as shown below:

Please delete Patent 7,830,000 in its entirety and insert Patent 7,830,000 as attached.

Signed and Sealed this
Twenty-ninth Day of November, 2011

David J. Kappos
*Director of the United States Patent and Trademark Office*

CERTIFICATE OF CORRECTION (continued)

(12) United States Patent
Eichelberger et al.

(10) Patent No.: US 7,830,000 B2
(45) Date of Patent: Nov. 9, 2010

(54) INTEGRATED THERMAL STRUCTURES AND FABRICATION METHODS THEREOF FACILITATING IMPLEMENTING A CELL PHONE OR OTHER ELECTRONIC SYSTEM

(75) Inventors: Charles W. Eichelberger, Wakefield, MA (US); James E. Kohl, Reading, MA (US)

(73) Assignee: Epic Technologies, Inc., Woburn, MA (US)

( * ) Notice: Subject to any disclaimer, the term of this patent is extended or adjusted under 35 U.S.C. 154(b) by 0 days.

(21) Appl. No.: 12/144,717

(22) Filed: Jun. 24, 2008

(65) Prior Publication Data
US 2008/0315404 A1   Dec. 25, 2008

Related U.S. Application Data

(60) Provisional application No. 60/945,988, filed on Jun. 25, 2007.

(51) Int. Cl.
*H01L 23/34* (2006.01)
(52) U.S. Cl. .............. 257/706; 257/675; 257/E23.087; 438/122
(58) Field of Classification Search .......... 257/706, 257/675, E23.08, E23.087; 438/122
See application file for complete search history.

(56) References Cited

U.S. PATENT DOCUMENTS

| 4,640,010 | A | * | 2/1987 | Brown ........................ 29/832 |
| 4,783,695 | A | | 11/1988 | Eichelberger et al. |
| 5,111,278 | A | * | 5/1992 | Eichelberger ............. 257/698 |
| 5,250,843 | A | | 10/1993 | Eichelberger |
| 5,353,498 | A | | 10/1994 | Fillion et al. |
| 5,841,193 | A | | 11/1998 | Eichelberger |
| 5,998,859 | A | | 12/1999 | Griswold et al. |
| 6,064,114 | A | | 5/2000 | Higgins, III |
| 6,159,767 | A | | 12/2000 | Eichelberger |
| 6,426,545 | B1 | | 7/2002 | Eichelberger et al. |
| 6,507,115 | B1 | * | 1/2003 | Hofstee et al. ............. 257/777 |
| 6,555,908 | B1 | | 4/2003 | Eichelberger et al. |
| 6,586,827 | B2 | | 7/2003 | Takeuchi et al. |
| 6,818,544 | B2 | | 11/2004 | Eichelberger et al. |
| 6,838,776 | B2 | | 1/2005 | Leal et al. |

(Continued)

OTHER PUBLICATIONS

Kohl et al., "Low Cost Chip Scale Packaging and Interconnect Technology", Proceedings of the Surface Mount International Conference, San Jose, California (Sep. 1997).

(Continued)

*Primary Examiner* — A. Sefer
*Assistant Examiner* — Allen L Parker
(74) *Attorney, Agent, or Firm* — Kevin P. Radigan, Esq.; Heslin Rothenberg Farley & Mesiti P.C.

(57) ABSTRACT

Circuit structures and methods of fabrication are provided for facilitating implementing a complete electronic system in a compact package. The circuit structure includes, in one embodiment, a chips-first multichip base layer with conductive structures extending therethrough. An interconnect layer is disposed over the front surface of the multichip layer and includes interconnect metallization electrically connected to contact pads of the chips and to conductive structures extending through the structural material. A redistribution layer, disposed over the back surface of the multichip layer, includes a redistribution metallization also electrically connected to conductive structures extending through the structural material. Input/output contacts are arrayed over the redistribution layer, including over the lower surfaces of at least some integrated circuit chips within the multichip layer, and are electrically connected through the redistribution metallization, conductive structures, and interconnect metallization to contact pads of the integrated circuit chips of the multichip layer.

16 Claims, 33 Drawing Sheets

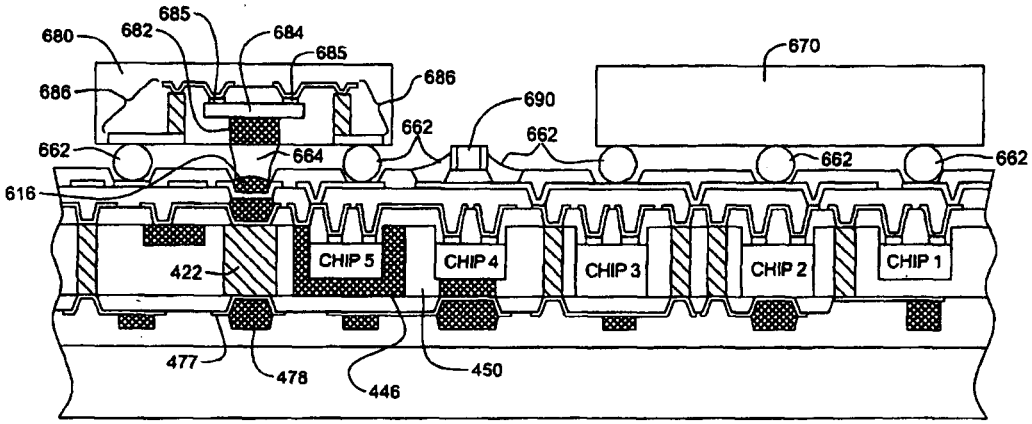

US 7,830,000 B2
Page 2

U.S. PATENT DOCUMENTS

| | | |
|---|---|---|
| 6,972,964 B2 | 12/2005 | Ho et al. |
| 7,006,359 B2 | 2/2006 | Galvagni et al. |
| 7,112,467 B2 | 9/2006 | Eichelberger et al. |
| 7,122,467 B2 | 10/2006 | Lee et al. |
| 7,238,602 B2 | 7/2007 | Yang |
| 7,339,279 B2 | 3/2008 | Yang |
| 7,345,365 B2 | 3/2008 | Lee et al. |
| 7,405,102 B2 | 7/2008 | Lee et al. |
| 7,427,812 B2 | 9/2008 | Wakisaka et al. |
| 7,429,793 B2 | 9/2008 | Yamagata |
| 7,550,830 B2 | 6/2009 | Yoon |
| 7,550,833 B2 | 6/2009 | Mihara |
| 7,572,681 B1 | 8/2009 | Hoemoeller et al. |
| 7,619,901 B2 | 11/2009 | Eichelberger et al. |
| 2003/0197285 A1 | 10/2003 | Strandberg |
| 2003/0201534 A1 | 10/2003 | Eichelberger et al. |
| 2005/0062147 A1 | 3/2005 | Wakisaka et al. |
| 2005/0161799 A1 | 7/2005 | Jobetto |
| 2006/0017155 A1 * | 1/2006 | Wang ........................ 257/703 |
| 2007/0249102 A1 | 10/2007 | Brunnbauer et al. |
| 2008/0315375 A1 | 12/2008 | Eichelberger et al. |
| 2008/0315377 A1 | 12/2008 | Eichelberger et al. |
| 2008/0315391 A1 | 12/2008 | Eichelberger et al. |
| 2010/0031500 A1 | 2/2010 | Eichelberger et al. |
| 2010/0032091 A1 | 2/2010 | Eichelberger et al. |
| 2010/0035384 A1 | 2/2010 | Eichelberger et al. |
| 2010/0044855 A1 | 2/2010 | Eichelberger et al. |
| 2010/0047970 A1 | 2/2010 | Eichelberger et al. |

OTHER PUBLICATIONS

"Wire Bond and Beyond: Semiconductor Packaging Innovation", White Paper, Freescale Semiconductor, Inc. Jul. 2006, pp. 1-9.

Leung, John, "Packaging Technology for Mobile Platforms", Wireless and Mobile Systems Group, Freescale Semiconductor, Inc., printed from Internet on Nov. 18, 2006, pp. 1-28.

Mangrum, Marc, "Packaging Technologies for Mobile Platforms", Wireless Mobile Systems Group, Freescale Semiconductor, Inc., Sep. 28, 2006, pp. 1-19.

"Redistributed Chip Package (RCP) Technology", Freescale Semiconductor, Inc., printed from Internet on Nov. 18, 2006, pp. 1-6.

Keser, Beth, "Birds-of-a-Feather: Redistributed Chip Package (RCP) Broad-Range Applications for an Innovative Package Technology", Freescale Semiconductor, Inc., Jun. 2007, pp. 1-18.

Keser, Beth, "Redistributed Chip Packaging", http://www.semiconductor.net/index.asp? layout=articlePrint&articleID=CA6428421, Semiconductor International, Apr. 1, 2007, pp. 1-5.

Office Action for U.S. Patent Publication No. 2008/0315377 A1 (U.S. Appl. No. 12/144,725), dated Mar. 17, 2010.

Office Action for U.S. Patent Publication No. 2008/0315375 A1 (U.S. Appl. No. 12/144,720), dated Apr. 29, 2010.

Office Action for U.S. Appl. No. 12/144,840 (U.S. Patent Publication No. 2008/0315391 A1), dated Jul. 6, 2010.

Office Action for U.S. Appl. No. 12/144,720 (U.S. Patent Publication No. 2008/0315375 A1), dated Nov. 19, 2009.

* cited by examiner

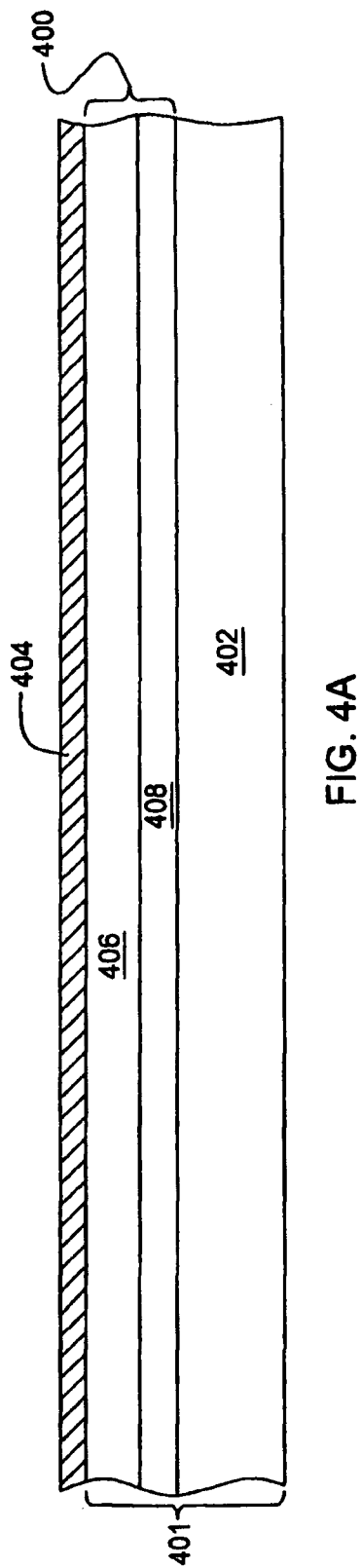

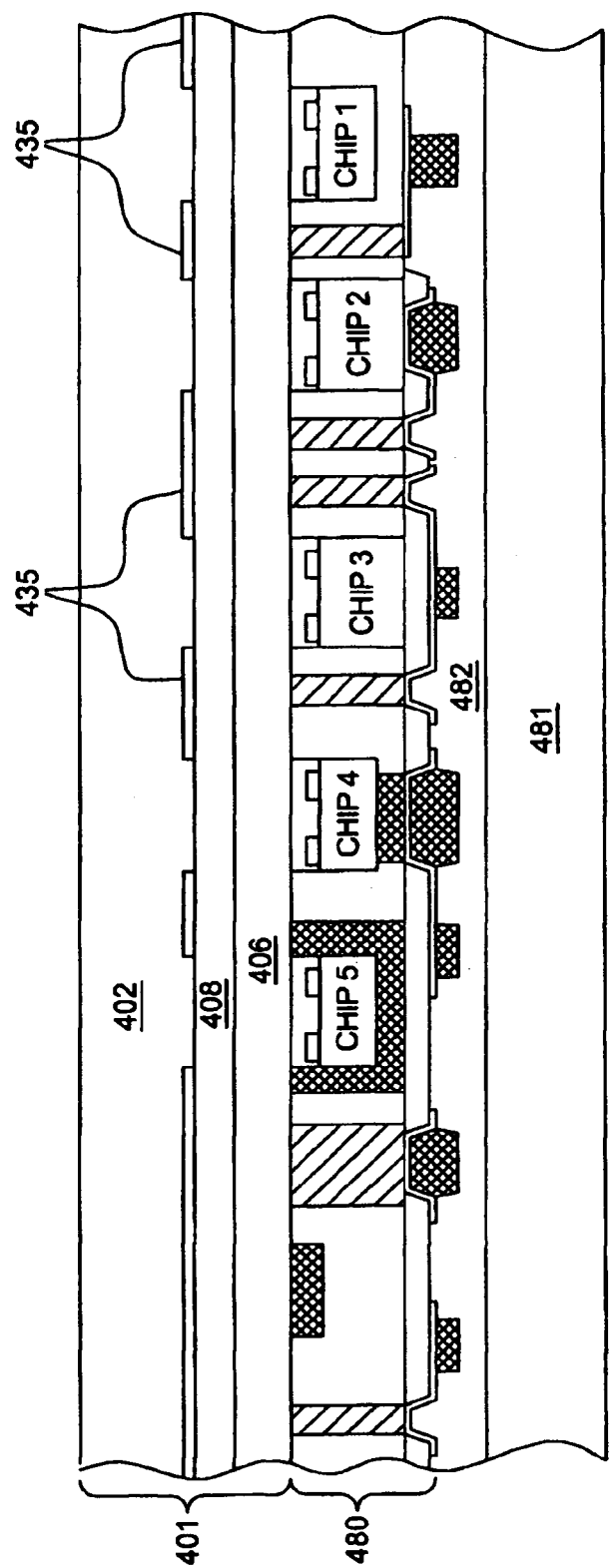

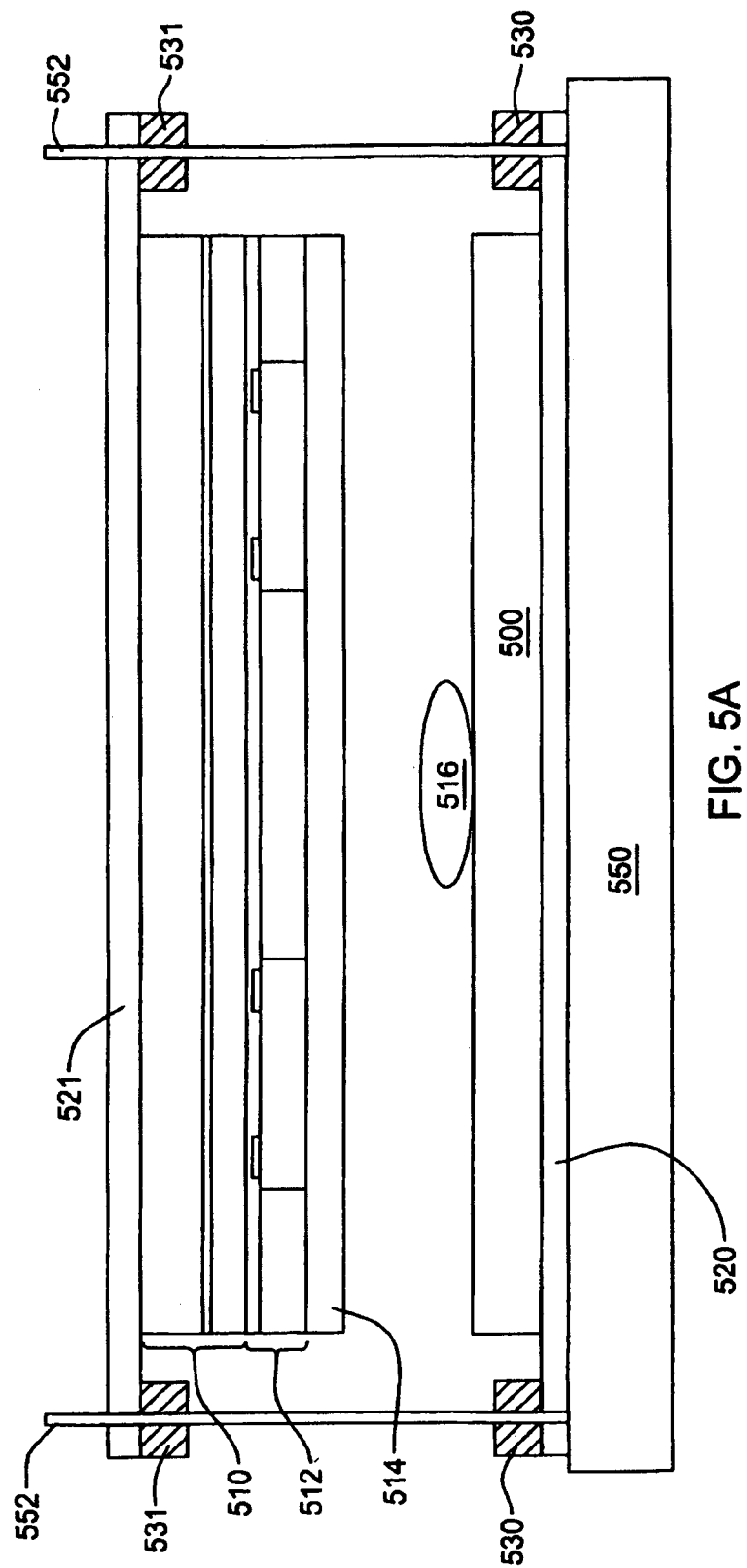

INTEGRATED THERMAL STRUCTURES AND FABRICATION METHODS THEREOF FACILITATING IMPLEMENTING A CELL PHONE OR OTHER ELECTRONIC SYSTEM

CROSS-REFERENCE TO RELATED APPLICATIONS

This application claims priority from U.S. Provisional patent application Ser. No. 60/945,988, filed Jun. 25, 2007, entitled "Integrated Structures and Fabrication Methods Thereof Implementing a Cell Phone or Other Electronic System", by Eichelberger et al., the entirety of which is hereby incorporated by reference.

TECHNICAL FIELD

This invention relates in general to circuit structures and methods of fabrication thereof, and more particularly, to integrated structures and methods of fabrication thereof implementing a complete cell phone system or other electronic system, or subsystem, in a highly compact package.

BACKGROUND OF THE INVENTION

The conventional approach to electronic packaging and interconnect has been to package individual integrated circuit (IC) chips into a single package and to attach these packages to a printed circuit board to provide interconnect between the individual IC chips. In recent years, this approach has met with problems of speed, size and interconnect density due to ever-constant demands for reduced size and increased performance from such integrated circuit packages.

Process speed is conventionally limited by the fact that individual packages have loading capacitance and inductance associated with their relatively long pins and by the large size of conductor runs in the packages relative to the size of the conductors of a bare IC chip. As the speed of computers and other devices continues to increase, the problem of providing electronic packaging and interconnect which provides maximum performance has become a significant challenge. One solution to the problem is the multichip module (MCM). In an MCM, bare (unpackaged) IC chips are interconnected by means of a miniature printed circuit board whose interconnect pitch may match the pitch of the IC chips themselves. There are presently two main classes of MCM. These are the chips-last MCM and the chips-first MCM. In the chips-last MCM, the miniature circuit board is fabricated first and then the bare IC chips are attached and interconnected to the circuit board. The method of interconnect is usually wire-bond or solder bump. In the chips-first MCM, the chips are placed first relative to each other and a miniature circuit board is then built above the chips. The interconnect is formed to the IC chips as an integral part of the processing of the circuit board.

Structures in accordance with the present invention fall into the category of chips-first MCMs. Chips-first MCMs provide one way to minimize size of a multichip module and provide high performance interconnect. Examples of chips-first modules are given in U.S. Pat. Nos. 5,250,843; 5,353,498; and 5,841,193, each of which is hereby incorporated herein by reference in its entirety.

One problem with an assembly using chips-first technologies is that modules are costly to repair. If a module is fabricated with a defective integrated circuit chip, then all other chips in the module are lost. Thus, it is desirable to take advantage of a chips-first technology for size and performance aspects, while still providing a fabrication method which avoids incorporating components that are not thoroughly tested and known to be good.

Another problem in the art is to provide very thin chips-first modules that have mechanical rigidity and protection so that they are easily handled by automated assembly equipment and can be used without further structural considerations by, for example, a cell phone assembler. A further problem is that certain components of an electronic system, such as a cell phone, generate a significant amount of heat. An example of this is the power amplifier. The use of a heat sink is prohibitive in that it adds an unacceptable thickness to the package. Instead, the conventional approach is to deliver heat to the circuit board on which the components are mounted. Still another problem is that in an extremely dense package, cross-talk between sensitive RF receiver components, powerful transmitter components and high speed digital components is markedly increased. This problem is reduced in circuit board versions of a cell phone in that the individual components can be spaced from one another and individual shield shells placed around the cross-talking components.

The chips-first circuit structures and methods of fabrication presented herein are directed in part to addressing the above-noted problems.

SUMMARY OF THE INVENTION

Briefly summarized, this invention comprises in a first aspect an electronic module which includes: a chip layer including at least one chip comprising at least one side surface, an upper surface, a lower surface, and at least one contact pad at the upper surface; a structural material surrounding and physically contacting the at least one side surface of each chip of the at least one chip of the chip layer, the structural material having an upper surface substantially co-planar with or parallel to an upper surface of each chip of the at least one chip and defining at least a portion of a front surface of the chip layer, and a lower surface substantially co-planar with or parallel to a lower surface of each chip of the at least one chip and defining at least a portion of a back surface of the chip layer; at least one device disposed over the front surface of the chip layer; and a thermal conduit from a surface of the at least one device to the back surface of the chip layer, the thermal conduit comprising at least one thermally conductive structure extending through the structural material between the front surface and the back surface of the chip layer, the thermal conduit facilitating extraction of heat from the at least one device disposed over the front surface of the chip layer through the back surface of the chip layer.

In another aspect, an electronic module is provided comprising: a chip layer including at least one chip, each chip including at least one side surface, an upper surface, a lower surface, and at least one contact pad at the upper surface, and a structural material surrounding and physically contacting the at least one side surface of each chip of the chip layer, the structural material having an upper surface substantially co-planar with or parallel to an upper surface of the at least one chip and defining at least a portion of a front surface of the chip layer, and a lower surface substantially co-planar with or parallel to a lower surface of the at least one chip and defining at least a portion of a back surface of the chip layer; at least one device disposed over the back surface of the chip layer; and a thermal conduit from a surface of the at least one device to the front surface of the chip layer, the thermal conduit comprising at least one thermally conductive structure extending through the structural material between the back surface and front surface of the chip layer, the thermal conduit facilitating extraction of heat from the at least one device disposed over the back surface of the chip layer to the front surface of the chip layer.

In a further aspect, an electronic module is provided which includes: a chip layer including at least one chip, each chip including at least one side surface, an upper surface, a lower surface, and at least one contact pad at the upper surface, and a structural material surrounding and physically contacting the at least one side surface of each chip of the chip layer, the structural material having an upper surface substantially co-planar with or parallel to an upper surface of the at least one chip and defining at least a portion of a front surface of the chip layer, and a lower surface substantially co-planar with or parallel to a lower surface of the at least one chip and defining at least a portion of a back surface of the chip layer; a redistribution layer disposed over the back surface of the chip layer; a plurality of contacts arrayed over the redistribution layer over the back surface of the chip layer; and at least one thermal conduit extending from the at least one surface of the at least one chip of the chip layer to at least one contact of the plurality of contacts arrayed over the redistribution layer, each thermal conduit extending through the redistribution layer and facilitating extraction of heat from the at least one chip to a respective contact of the plurality of contacts.

Various methods of fabricating the above-summarized modules are also described and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 is a cross-sectional elevational view of a conventional chips-first module;

FIG. 2 is a cross-sectional elevational view of one embodiment of a multichip module, in accordance with an aspect of the present invention;

FIG. 3 is a cross-sectional plan view of the multichip module of FIG. 2, in accordance with an aspect of the present invention;

FIGS. 4A-4O are cross-sectional elevational views of process structures obtained during manufacturing of multichip modules, in accordance with an aspect of the present invention;

FIGS. 5A & 5B depict use of a fixture for facilitating adhesive attachment of a process carrier to a process structure obtained during manufacturing of a multichip module, in accordance with an aspect of the present invention;

FIG. 6 is a detailed cross-sectional elevational view of one embodiment of a multichip module, in accordance with an aspect of the present invention;

FIGS. 7A & 7B are side elevational views of one embodiment of an apparatus for applying an encapsulant and a stiffener to the multichip module of FIG. 6, in accordance with an aspect of the present invention;

FIG. 8A depicts the structure of FIG. 6 with encapsulant and a stiffener applied thereto, in accordance with an aspect of the present invention;

FIG. 8B depicts an alternate embodiment of a multichip module having a temporary encapsulant and stiffener applied over a plurality of input/output contacts disposed over the front surface of the multichip layer, in accordance with an aspect of the present invention;

FIG. 9A is a cross-sectional elevational view of the structure of FIG. 8A after the removal of the process carrier and application of I/O contacts arrayed over the back surface of the multichip layer, in accordance with an aspect of the present invention;

FIG. 9B is a cross-sectional elevational view of the structure of FIG. 8B after removal of the process carrier and exposure of input/output contacts arrayed over the back surface of the multichip layer, in accordance with an aspect of the present invention;

FIG. 10A depicts a cross-sectional elevational view of the multichip module of FIG. 9B after the removal of the temporary encapsulant and stiffener to expose the plurality of input/output contacts arrayed over the front surface of the multichip layer, which is shown inverted in the figure, in accordance with an aspect of the present invention;

FIG. 10B is a cross-sectional elevational view of multiple multichip layers of FIG. 10A stacked and electrically interconnected in a compact package, in accordance with an aspect of the present invention;

FIG. 11 is a cross-sectional elevational view of an alternate embodiment of a multichip module, in accordance with an aspect of the present invention; and FIGS. 12A-12D are cross-sectional elevational views of process structures obtained during manufacturing of a multichip module, such as the module of FIG. 11, in accordance with an aspect of the present invention.

BEST MODE FOR CARRYING OUT THE INVENTION

Generally stated, provided herein are numerous enhancements to multichip modules, and in particular, to chips-first multichip modules. Advantageously, complete electronic systems or subsystems, and methods of fabrication thereof are disclosed herein in which a second layer of modules or other circuit components is connected to a multichip layer fabricated as a chips-first module. The multichip layer forms a base for the second layer of modules or components. Structures are provided for making through connection from a front surface to a back surface of the multichip layer. Interconnect structures are provided over the front surface of the multichip layer for interconnecting contact pads of integrated circuit chips in the multichip layer, as well as for connecting second layer components or for connecting to input/output contacts. The multichip modules disclosed herein include input/output contacts (e.g., contact pads or bumps) which may be placed at any location above the front surface of the multichip layer or below the back surface of the multichip layer, including over the upper surfaces and lower surfaces of the integrated circuit chips within the multichip layer.

In enhanced aspects, structures are disclosed for providing Faraday shields, high thermal conductivity paths, power bus structures, and for stiffening the complete system or subsystem. Structures and methods for extremely thin-stacked modules are also disclosed using the chips-first multichip layer and featuring input/output contacts arrayed anywhere above and below the integrated circuit chips of the multichip module.

One application of the multichip modules described herein is in providing a complete cell phone system integrated as a single package. It is highly desirable to incorporate all of the electronics of a system, such as a cell phone, into a single package that a cell phone assembler can incorporate as a completely tested unit into a cell phone by simply connecting battery and input/output means. The structure and methods disclosed are applicable to a wide variety of systems such as Bluetooth, portable computers, PDAs, stand-alone communication devices, etc. Although the concepts disclosed herein are presented with reference to a complete cell phone in a package, it should be realized that any small electronic system or sub-system can benefit from the structures and methods disclosed. In cell phone and portable electronic applications it is desirable to provide electronic modules that are as compact as possible, and in particular that have as little thickness as possible. As previously stated it is also highly desirable to incorporate as much of the electronic system as possible in a single multichip module that can be tested before supplying the module to the system manufacturer. One goal then is to provide a complete system in a module that is both thin and presents minimal footprint area.

To better understand the value of the present invention, an example of prior art cell phone systems and prior art cell phone modules is given. Presently, cell phone manufacturers use a main circuit board and mount the individual components or subassemblies on that circuit board. Typically the components are mounted on both sides of the circuit board. Connection is made from the I/O, such as keyboard and display, by flex circuit or ribbon cable. The antenna is connected through an RF connector or direct connection. The battery is also connected by individual wires or a battery connector mounted on the circuit board. In this configuration, the individual packages are each relatively large. The net result is that the cell phone assembler must mount many individual components and packages and test each board before shipping the phone. Ideally, if all the electronics for a cell phone were available in a pre-tested module, then the cell phone manufacturer would have reduced testing requirements. In addition, if that module were smaller than the cell phone manufacturer's individual component board today, it would allow for smaller cell phones and less cost to the manufacturer.

FIG. 1 is a cross-sectional view of a typical chips-first structure, generally denoted 100, showing direct interconnect between integrated circuit chips 110 utilizing two interconnect layers (i.e., a first layer 102 and second layer 104), and featuring edge to edge placement of chips, and I/O bumps 114 above the chips. A structural filler/encapsulant material 116 fills the spaces between chips, provides structural support and provides a planar surface for the interconnect layers 102 and 104. Chips-first interconnect structures are described in detail in the above-incorporated patents. As discussed in these patents, one advantage of a chips-first structure is that interconnection is made directly to the chip pads 112 and therefore the interconnection takes up minimal space. The chips can be placed essentially edge to edge further minimizing space. Minimum thickness is achieved because the chips themselves may be thinned to an arbitrary thickness, and because of the direct interconnection, there is no requirement for bumps or interposers (which would add to thickness) to connect from the chip pads to the interconnect layers.

Since chips-first fabrication methods are batch fabrication methods, a full panel of chips-first modules can be fabricated at the same time, and thus the manufacturing process can take advantage of economy of scale. One of the problems that chips-first modules face is that the economies are lost when bad chips are incorporated into the modules. One bad chip in the module renders the module and therefore the other chips in the module unusable. As a result, it is advantageous that the incorporated chips be thoroughly tested so that they are known to be good before they are affixed within the module. Semiconductor memory is one of the elements that are available in bare die form as "known good die". Therefore incorporating memory in a chips-first base layer takes advantage of the "chips-first" production economies, as well as minimal size and high performance, while not suffering the fallout caused by incorporation of bad die.

As used herein, the term "chip" or "chips" includes any semiconductor device, including a transistor or integrated circuit (e.g., those made with silicon, gallium arsenide, silicon-germanium, indium phosphide, etc.). Further, as used herein, the term "chip" can include integrated devices with one or more passive devices (such as resistors, capacitors and inductors). In addition, "chip" can refer to a metal or conductive die of any thickness, as well as to active devices (such as imagers, light sensors, photo or laser diodes, etc.). The term "chip" also includes a surface-mounted component or device, such as a capacitor or resistor.

As noted, presented herein are further enhancements to the chips-first module approach to packaging multiple integrated circuit chips. By way of example, FIGS. 2 & 3 depict a cross-sectional elevational view and a cross-sectional plan view of one embodiment of a multichip module implementing a cell phone system or subsystem as a highly integrated compact package. This multichip module, generally denoted 200, includes DRAM 214 and FLASH 216 memory elements incorporated in a chips-first base or multichip layer 212. As noted, the multichip layer allows for the most compact packaging of these "known good die" elements. The interconnect makes direct connection between integrated circuit chips in the multichip layer without the use of interposers, such as solder bumps. The direct connection improves electrical performance, as well as reducing the overall thickness of the multichip module. Additionally, integrated circuit chips in the multichip layer can be placed essentially edge to edge so that the overall footprint is minimized. Input/output structures such as contact pads or solder bumps may be placed in an array above the integrated circuit chips, thus minimizing the area required for interconnection to the next interconnect level.

In accordance with an aspect of the present invention, a second layer of devices 240 is surface mounted onto multichip layer 212. In one embodiment, these additional devices are also fabricated as chips-first modules, which again minimizes their footprint and thickness. The second layer of devices 240 includes chips of all kinds that are adapted to be surface-mounted. Device layer 240 also includes individual surface-mount components (e.g., resistors, capacitors, and inductors). Device layer 240 further includes surface acoustic wave (SAW) devices, piezo-electric devices (e.g., crystals and annunciators), and magnetic elements (e.g., speakers, transformers, and magnetic sensors). As explained above and in further detail below, the second layer of devices 240 can also include modules that can be chip scale packages (CSPs), conventional ball grid arrays (BGAs), and surface-mount packages, such as quad flat packs (QFPs). These modules may themselves be multi-component/device modules.

FIG. 3 illustrates how a variety of devices are surface mounted and positioned on the multichip layer. One of the devices is referred to as Apps. μP 242. This is a chips-first chip scale package (CSP). The Apps. μP 242 is a type of chip that is typically tested and additionally burned-in in packaged form. After testing and burn-in, module 242 can be incorporated into the cell phone as a packaged module in a chips-first CSP without impacting the yield.

A similar module referred to as a Phone µP 300 is also a chips-first module that performs control functions for operation of the phone. Similarly, another type of module can be incorporated. This other type of module is not just a single chip, but is rather a specific subsystem. FIG. 3 shows positioning of this other type of module, referred to as a "Chips-First rf/PA/Pwr Mgmt" module 250. Module 250 includes several electronic components and provides a sub-system with multiple functionalities.

FIG. 3 depicts one embodiment of the elements that make up "Chips-First rf/PA/Pwr Mgmt" module 250. One of these functionalities is a power amplifier (PA) 310, which is responsible for generating the power necessary for the phone to transmit a signal. The PA adds the requirement of removal of a significant amount of heat and also the requirement to shield generated RF noise from the rest of the system. Detailed explanation of certain techniques to achieve shielding and heat removal are provided herein. The "Chips-First rf/PA/Pwr Mgmt" module 250 also contains several other functional chips to provide the full subsystem function. These include a Pwr Mgmt chip 312 which controls how power is utilized in the cell phone and helps improve battery life. Integrated passive chips 314 are also incorporated. These chips provide the functions of resistors, capacitors and inductors, and are each configured as a monolithic chip for incorporation into a chips-first module. Additional miscellaneous chips 316 are also incorporated to complete the function of the subsystem. Other components included to complete the entire system are conventional surface mount passives 320 such as resistors, capacitors, and inductors. Surface Acoustic Wave filters (SAW) 330 can be surface mounted directly as provided by the SAW manufacturer. At this point, a complete system for all the electronics of a "feature rich" cell phone have been incorporated. A preliminary estimate shows that the entire cell phone electronics can be incorporated in a package with a footprint of 16×20 mm. By comparison, a typical circuit board containing the same electronic capability using conventional packaging has a minimum size of 39×59 mm. The multichip module presented herein thus represents a savings both in size and cost. Similar size and cost savings can be obtained for other portable electronic systems as well.

Two additional innovations can be added to the structure described in order to further enhance the efficacy of the cell phone in a package presented herein. If the module is to be provided to the cell phone assembler in a way that it is most easily assembled into a system, it should have a means for easy interconnection to the keyboard, battery, antenna and display. FIG. 2 shows a configuration where bumps 222 are provided on the back surface of, multichip layer 212. Cell phone assemblers are set up to handle components that can be surface mounted by soldering means. Bumps 222 are connected to the rest of the system by a redistribution layer 224 (which may comprise one or more metal levels) that redistributes signals from an array of bumps to conductive structures or through connects in the filler encapsulant material 226.

A second innovation that improves efficacy of the system is the addition of an encapsulant and stiffener or stiffening member (which is planar in one embodiment) to the side away from the bumps. This stiffener adds rigidity and protection to the module, and makes handling of the module easier since one of the main surfaces is flat. In addition, the added rigidity eliminates any requirement for the assembler to add a separate means to stiffen the module. FIG. 2 shows the incorporation of an encapsulant 248 that also provides stiffness and a uniform handling and protective surface.

Still referring to FIGS. 2 & 3, the thickness of the multichip module 200, that is, of the complete cell phone in a package in this example, containing all electronics and including the thickness of the bump interconnect 222 and the stiffener/encapsulant 248, is (in one embodiment) advantageously less than 1.6 mm. The description below details methods of fabrication of the above-described multichip module, as well as details of various alternate embodiments thereof. While the advantages are described herein in terms of a cell phone any electronic system or subsystem can benefit from the disclosed methods and structures.

Fabrication Of Chips-First Base Layer

FIGS. 4A-4O show various process steps to achieving a chips-first base layer (also referred to herein as a multichip layer or a chip layer). Referring to FIG. 4A, an alignment carrier assembly 401 is provided in which a film 400 comprising a polyester film 406 and UV release adhesive 408 is adhesively bonded to the alignment carrier. In one embodiment, a UV release film such as Adwill D218 Available from Lintec of Tokyo, Japan, is laminated to a plain glass plate 402. U.S. Pat. No. 7,112,467 B2, entitled "Structure and Method for Temporarily Holding Integrated Circuit Chips in Accurate Alignment", which is hereby incorporated herein by reference in its entirety, describes fabrication of chips-first modules using such an alignment carrier. In that patent, a second adhesive is applied to the back of the exposed side of the UV release film and IC chips are placed face down into that adhesive. In the fabrication of the chips-first base layer of the present invention additional steps are added. In particular, structures such as through connects, bus bars, thermal conduction paths, and Faraday shields are provided integrated within the chips-first multichip layer.

After lamination of the UV release film to the glass plate, copper 404 is sputtered onto the exposed surface of the UV release film. In one embodiment, the actual sputtering operation includes providing a very thin adhesion layer of titanium. Sputtering is well known in the art. By way of example, the thickness of the titanium is 400 angstroms followed by 4000 angstroms of copper. In an alternate embodiment, a film that has UV release adhesive on one side and metallization pre-coated on the other side could be laminated to the glass plate. This saves the step of sputtering the individual panels. FIG. 4A shows an alignment carrier with UV release film bonded to a glass plate with copper coated on the film.

Referring to FIG. 4B, a thick resist layer is spray coated over the sputtered copper. The resist 410 is then exposed and developed to form openings 412, 412' in the resist. Thick resist materials with excellent aspect ratios are well known in the art and can be supplied in both positive and negative acting form. The pattern of resist openings determines what copper structures will be provided. By way of example, through vias are provided by small round openings. Faraday shield structures are provided either with a frame-like opening that will surround the device to be shielded or by a "picket fence" of closely spaced round openings. Thermal slugs are provided by a rectangular opening 412' in the appropriate location. FIG. 4B shows the patterned resist 410 with openings 412, 412' disposed over the copper coated UV release film. Copper is then electroplated to the thickness required by subsequent processing steps, generally to the final thickness of the encapsulant/filler which will be added in subsequent processing. The resist is then removed. After all resist is removed, the sputtered copper and titanium is removed by etching the copper in ammonium persulfate and etching the titanium in 5% TFT Etchant in DI water. TFT Etchant is available from Transene Corp. Rowley, Mass.

FIG. 4C shows the copper structures formed on the alignment carrier. Through connects 420 are cylinders that will provide a conductive path from the top to the bottom of the structural filler material. The Faraday shield structure 426 will form a copper enclosure for one or more devices that create or are sensitive to RF noise. The Faraday shield enclosure will be completed by subsequent processing of top (i.e., interconnect) and bottom (i.e., redistribution) layers discussed below. Thermal slug 422 provides a highly thermally conductive path between the top and bottom of the multichip layer.

Referring to FIG. 4D, a chip attach adhesive 430 is next applied to the exposed side of the UV release tape. This adhesive is, in one embodiment, an adhesive that can be cured by UV light, although other types of adhesive may be used. Details of using a UV release tape and UV cureable adhesive are given in U.S. Pat. No. 7,112,467 B2 incorporated above. The adhesive can be spray coated to the UV release film and dried of solvent at 50-75° C. for a period of 30 minutes in a forced hot air oven. By way of example, thickness of the adhesive is 3 to 6 microns.

Chips (e.g., Chip1, Chip2, Chip3, Chip4 & Chip5) are placed face down into the UV curable adhesive 430. The UV curable adhesive is exposed to UV light, e.g., 500 mJ/cm$^2$ at a fluence of 5 mW/cm$^2$. This particular material is air inhibited at the above fluence level such that it only cures under the chips where the air is excluded. After exposure, the adhesive is developed away in a spray developer using propanol as a developer. In an optional embodiment, the alignment carrier is provided with a masking pattern 435 that aligns openings with the placement of the chips. By exposing with a collimated UV source, the area under the chips is exposed while the area away from the chips is completely unexposed. This also has the advantage that alignment marks can be provided which allow for extremely accurate alignment of the chips on the alignment carrier.

FIG. 4D shows the alignment carrier assembly 401 with chips (Chip1, Chip2, Chip3, Chip4 & Chip5) positioned face down, with their contact pads 431 in the adhesive 430, and with the adhesive developed away in areas not under the chips. The alignment carrier is also provided with a masking pattern 435 that corresponds to the positioning of the chips. This masking pattern may be provided by the same processes that are well known for the formation of chrome on glass photomasks.

Referring to FIG. 4E, in a further optional embodiment a second sputtering step can be performed which covers the backs of chips and other exposed surfaces with a seed layer of copper 440. A resist is coated and patterned with openings at least partially over the backs of selected chips, and optionally, at least partially opening the resist over the alignment carrier region adjacent to selected chips. Resist 441 is shown with openings 442. Electroplating builds up the copper and forms thermal slugs 445 or high conductivity shells 446 around the chip for low inductance back-side connection or Faraday shielding. When the resist opening is over the film 406 of the alignment carrier assembly, a bus bar 447 is formed.

FIG. 4E shows the patterned resist with a second metal plated in the resist openings. At this point the resist is stripped and the copper seed metal is etched. FIG. 4F shows the chips adhesively bonded to the UV release film as well as the metallization structures formed by the first and second metallization steps.

Exposed chip surfaces, the copper structures, and the adhesively bonded film are next cleaned by wet cleaning and plasma etching followed by appropriate adhesion promotion steps to adhesion promote the copper as well as the chip surfaces. Filler/encapsulant, such as a liquid epoxy resin, is added to the module to cover all exposed surfaces on the back. To increase strength and improve the expansion match of the filler/encapsulant (i.e., the structural material) to that of the silicon chips, the filler/encapsulant can be loaded with an inert powder such as alumina or glass particles. The filler/encapsulant can be poured or dispensed onto the alignment carrier, or the alignment carrier may be covered at its outer edges or other locations on the carrier with a mold form and injection molded, or covered with a frame and frame molded. In one embodiment, the filler is dispensed by a liquid dispensing machine such as a CamALot Dispensing Machine available from CamALot Division of Cookson Electronic Equipment located in Franklin, Mass. The dispensing machine accurately dispenses the relatively high viscosity loaded epoxy to the edge of the alignment carrier. The viscosity keeps the filler from flowing off the carrier. This eliminates the need for molds or frames in the fabrication process. Alternatively, a mold may be used if it is required to contain the filler/encapsulant in cases where viscosity is low or where injection molding is used.

In one embodiment, a two-part epoxy system which can be cured at or near room temperature is used. The cured filler/encapsulant is then lapped to the appropriate thickness. In one embodiment, the filler and chips are thinned to a minimum thickness. This thickness is in the range of 50 to 100 microns. It is possible to go thinner than that thickness, but there is a tradeoff between lapping speed and final chip thickness. The finer the grit size the slower the lapping rate, but thinner chips can be made and still not be damaged. Noting that the chips are rigidly held by the alignment carrier, there is no penalty in going very thin except the economy of lapping very slowly or using multiple grit sizes. In any event, the lapping exposes the through connects and thermal slugs for further processing. Alternatively, if the chips are adequately thinned before application of the filler/encapsulant, then the filler/encapsulant can be lapped to a thickness that is greater than the chips, but that still exposes through connects and thermal slugs. Practical molding techniques could also achieve this without a lapping step to thin the filler/encapsulant.

FIG. 4G shows both of these cases in cross section in the same multichip layer. Note that Chip1 is thinner than the final thickness of the filler/encapsulant 450. The filler/encapsulant covers the back of this chip as well as the sides. The area of encapsulant that is thicker than Chip1 is denoted 451. Chip2 and Chip3 are thinned during lapping of filler/encapsulant 450, and thereby are the same thickness as the filler/encapsulant, so that filler/encapsulant only contacts the sides of these chips. Likewise, Chip4 and Chip5 have copper structures that are partially thinned with the filler/encapsulant lap and are thereby the same thickness. Note also that the through connect 420, Faraday shield 426, thermal slug 422, backside thermal slug 445, and low inductance backside connect 446 structures are uncovered by the lap operation so that electrical or thermal connection may be made to these structures.

Adding Redistribution Interconnect

In the next processing steps, one or more redistribution interconnect layers (generally referred to herein as the "redistribution layer") are provided that connect the exposed copper to other locations on the bottom of the multichip layer. Alternative processing is used depending on the desired structure.

In one optional but novel embodiment, copper is sputtered over the exposed back surface. The actual sputtering operation includes providing a very thin adhesion layer of titanium. Sputtering is well known in the art. By way of example, the thickness of the titanium is 400 angstroms, followed by 4000 angstroms of copper. Next, a resist layer is spray-coated over the sputtered copper. The resist is then exposed and developed to form openings in the resist. Resist materials with excellent aspect ratios are well known in the art and can be supplied in both positive and negative acting form. The pattern of resist openings determines what copper structures will be provided. Next, copper is electroplated in the openings (for example, to a thickness of 3 to 12 microns). The resist is then removed by methods well known in the art and depending on whether a positive or negative resist is used. This is followed by removal of the sputtered copper and titanium seed layer by etching the copper in ammonium persulfate and etching the titanium in 5% TFT Etchant in DI water. TFT Etchant is available from Transene Corp., of Rowley, Mass. FIG. 4H shows the resulting structure. Two copper structures are fabricated. Copper structure 456 covers all of the back of Chip3 and extends beyond the chip to the filler/encapsulant material. This structure provides a strengthening function by bridging from the chip to the filler/encapsulant. When the modules are in final form, stress is induced on the interface between the chip edge and the filler/encapsulant. The copper strengthening member securely holds this interface together. Copper structure 457 provides the same strengthening function and additionally connects electrically from the back of the chip to a through-connect. Structure 458 provides a strengthening function by bridging from the copper covered back of Chip4 to the filler/encapsulant. The strengthening function is especially valuable as the overall thickness of the module is decreased. Throughout the remaining discussion, structures 456, 457 and 458 may be left in place or, optionally, the steps outlined above may be eliminated without impacting the other structures to be described. In the interest of clarity, optional structures 456, 457 and 458 are not shown.

In one embodiment, a dielectric is added to the back side and openings are provided in the dielectric. The dielectric is applied as a liquid, dried and then hardened in all areas except the openings by exposing the material through a photomask with collimated UV light. As an example, the material is a low modulus high elongation dielectric such as described in U.S. Pat. No. 6,426,545 B1, entitled "Integrated Circuit Structures and Methods Employing a Low Modulus High Elongation Photodielectric" which is incorporated herein by reference in its entirety. Details of suitable processing and material formulations are explained in U.S. Pat. No. 6,426,545 B1, which is hereby incorporated herein by reference in its entirety.

FIG. 4I shows a dielectric layer 460 with patterned openings 461 overlying the copper structures exposed by the above mentioned lapping steps. The advantage of using a low modulus high elongation material is that it relieves the stress caused by a mismatch in expansion coefficient between the module and the circuit board to which it is attached. This allows the solder balls or contact bumps to be much thinner than would be required with a rigid dielectric. Alternatively, other photo-patternable and non photo-patternable in situ formed dielectrics such as epoxy or BCB could be used. In addition, a fully cured material (such as polyimide) may be adhesively bonded in place to form the dielectric layer. For example, kapton polyimide may be adhesively bonded in place to form the dielectric layer. In cases where the material is not photo-patternable, the openings can be formed by laser ablation or by reactive ion etching. Both techniques are well known and suitable parameters for the polymer dielectrics described above are described in the via formation discussion of the above-incorporated U.S. Pat. No. 5,250,843. Alternatively, if the encapsulant is thicker than the associated chips as depicted by area 451, then the encapsulant may be used as the dielectric layer.

FIG. 4I shows the patterned dielectric with openings as described above. Note that Chip1 is thinner than the filler/encapsulant so that the encapsulant itself may act as an insulating dielectric. In FIG. 4I, the opening in the dielectric 460 extends entirely over the area above Chip1. In this way, both the dielectric and filler/encapsulant structures may be fabricated at the same time. Next, a seed layer of copper is sputtered over dielectric 460 and into the openings 461. In one embodiment, the actual sputtering operation includes providing a very thin adhesion layer of titanium. Sputtering is well known in the art. Thickness of titanium may be 200 angstroms followed by 4000 angstroms of copper. A resist layer is spray coated over the sputtered copper. The resist is then exposed and developed. Resist materials with excellent aspect ratio are well known in the art. The pattern of resist openings determines what copper structures will be formed. One example is an interconnect that distributes from the exposed through connections to positions where connection pads or bumps are to be disposed.

Faraday shield structures are provided by an opening that defines metallization behind the chip and also connects to the previously defined Faraday shield structure in the filler/encapsulant. Connections to the back side of chips are provided by openings behind exposed chip surfaces and patterns to the through connects. Thermal slugs are provided by an opening located over the backs of chips. Thermal continuation slugs can be provided by openings over the copper slug in filler/encapsulant previously provided. The copper is electroplated to the thickness required by subsequent processing steps. For example, the copper may be plated to a thickness of 6 to 12 microns. The resist is removed by methods well known in the art and depending on whether a positive or negative resist is used. A second layer of resist is applied and patterned to provide built up copper in the area where I/O pads, or I/O bumps are desired and also in the areas where thermal slugs are desired. Copper is electroplated to a thickness of, for example, 12 to 50 microns to accommodate the various structures described. The second layer of resist is removed followed by removal of the sputtered copper and titanium seed layer by etching the copper in ammonium persulfate and etching the titanium in 5% TFT Etchant in DI Water. TFT Etchant is available from Transene Corp. of Rowley, Mass.

FIG. 4J shows a cross section of the structure with patterned copper for redistribution from the through connects to I/O structures such as bumps or pads, connection to the back side of components, thermal slugs through the filler/encapsulant and also to the back of chips, and direct patterning of redistribution on the filler/encapsulant. Patterned metal 465 redistributes connection from a through connect 420 to an I/O pad 466. This redistribution is insulated from Chip1 by the filler/encapsulant itself area 451. Patterned metal 467 redistributes from a through connect 420 to an I/O pad 468. Redistribution interconnect 469 makes electrical interconnection from I/O pad 470 to the back of Chip4 by contacting electrical contact and thermal slug 445 (see FIG. 4G). A high conductivity thermal path is shown by the plated area 472 which directly contacts metal 469 and slug 445. The redistribution interconnect provides a capping structure 473 on the bottom side of the enclosure contacting Faraday shield structure 426. Through this structure, the back of Chip3 is covered by the capping structure 473 and the sides are covered by metallization 426 in the filler/encapsulant. Pad 474 provides electrical connection to the Faraday shield structure. Redistribution metallization 475 makes interconnection from through connect 420 to the back of Chip2 as well as to pad 476. Note also that thermal connection is also provided from the back of Chip2 to thermal slug 476. A high thermal conductivity path is provided through the filler/encapsulant 450 by the combination of plating structures 477, 478, making contact to thermal slug 422.

Attaching Process Carrier and Initiating Processing on Top Side

At this point, processing on the top of the chips-first structure may be initiated. This is begun by attaching a process carrier to the back, which will facilitate handling of the very thin chips-first structure. It will also maintain accurate spacing between chips and will facilitate processing alignment when processing large panels. FIG. 4K shows a process carrier 481 attached to the multichip layer of FIG. 4J by adhesive 482. This process carrier is (in one embodiment) a plain glass panel that has been slightly roughened on one side to improve adhesion. The dielectric and metal on the module attached to the alignment carrier (as shown in FIG. 4J) is pre-coated with a layer of adhesive. In one embodiment, a high temperature epoxy that can be cured at or near room temperature is used. This material is coated to a thickness of, for example, between 12 and 50 microns by spin or spray coating. The material is cured until solid but not completely cured. An epoxy that cures in 24 hours at room temperature is coated then baked on a hot plate for 30 minutes at 75° C. to achieve this solid, but not fully cured objective.

The next steps of the process may be understood with reference to FIGS. 5A and 5B. These figures show a representative module 512 attached to an alignment carrier assembly 510 with a partially cured adhesive 514 coated to the back side of module 512. Next, the process carrier 500 and alignment carrier assembly 510 are bonded by low adhesion tape 520 and 521 into open frames 530 and 531. Such a process is well know in the art for the purpose of holding wafers when they are diced by a dicing saw. A frame bonder that is suitable for this use is sold by Semiconductor Equipment Corp. of Moorpark, Calif. Various sizes and configurations can be supplied to accommodate different size substrates and to allow contact or non contact to the front face of the taped substrate. Low tack tape is also available from the same company. The frames are available from the companies that sell dicing saws. A suitable dicing frame may be purchased from Disco Corp. of Tokyo, Japan. Frames to 300 mm or larger are available. The process carrier frame 530 is then placed on a fixture 550 that holds the frame in alignment by way of alignment pins 552 and thereby holds the process carrier in alignment. The same liquid, high temperature epoxy adhesive 516 is then applied to the center of the process carrier. The alignment carrier frame 531 is placed on the same fixture such that the two untaped surfaces face one another.

Referring to FIG. 5B, the fixture 550 is then placed into a laminating press and pressure is applied. This squeezes the adhesive into a thin uniform film 516' and bonds the process carrier 500 to the bottom of the partially processed chips-first base 512. The total glue line thickness is primarily dictated by the thickness of the pre-applied and partially cured coating 514. After the adhesive has bonded the process carrier 500 to the chips-first base 512 the fixture is removed from the laminating press and the low tack tape 520 and 521 is removed from both the alignment carrier and the process carrier. The low tack tape and frame thus serve the dual purpose of holding the process carrier and alignment carrier in alignment and also containing any run off of the adhesive.

Returning to FIG. 4K, the process carrier 481 is shown attached to the partially processed chips-first base 480, which is still attached to the alignment carrier assembly 401. At this point the alignment carrier is separated from the partially processed chips-first base. This is done by exposing the adhesive 408 to UV light which decreases the adhesion of the UV release tape to the glass alignment carrier. It should be noted that this exposure of the release tape to UV light can be done anytime after the tape has been laminated to the alignment carrier. The residual adhesion is sufficient to maintain accurate positioning through the subsequent processing steps. In fact, in the case where the alignment carrier has a mask 435, as described above, it is necessary to expose the UV release tape before the opaque filler/encapsulant is applied. This exposure is from both sides since the mask prevents light from reaching some significant areas from the masked side. The alignment carrier can be easily removed by prying from a corner. Moderate heating of the assembly at this point aides the removal process as it slightly softens the adhesives and makes separation easier. Additionally, the removal process is aided by making process carrier 481 just slightly smaller than the alignment carrier. This prevents the adhesive that is squeezed out during the lamination operation from adhering to the alignment carrier edges. If the adhesive does contact the edge of the alignment carrier it bonds the two carriers and the edges and hampers separation. The separation occurs at the UV release adhesive 408 to alignment carrier glass 402 interface and therefore leaves the UV release film attached to the top of the partially processed chips-first module. At this point, a corner of the film is engaged and peeled in a 90 degree peel. This whole process works because of the difference between the adhesion over the area of chips and the adhesion of the film that is being peeled. It should be noted that the adhesion is quite sufficient to hold the chips in accurate position due to high shear capability of a thin glue line over the area of the chips. When a 90 degree peel is initiated the adhesive gives up readily as the adhesive force of the very thin adhesive is spread over a concentrated area of the bend point of the peel.

Any residual adhesive left on the chips is now cleaned off. The first step is to soak the structure in acetone which lifts the cured adhesive film from the tops of the chips. The second step is a light plasma etch, with either $O_2$ or $O_2/CF_4$ (70/30) to remove any residual adhesive that was not removed by the acetone soak. The final step is cleaning by wet processing which removes any residual ions such as sodium and chloride from the surface of the chips. FIG. 4L shows a cross-sectional view of the chips-first base ready for application of the one or more interconnect layers (generally referred to herein as the "interconnect layer") above the chips. Note that the top of the through connects 420, copper bus bars 447, copper Faraday shielding layers 426, low inductance chips backside connection 446, and thermal slug 422 are exposed, as well as pads 431 of the chips.

Adding the Interconnect Above the Chips

In one embodiment, the interconnect layer starts with a layer of low modulus high elongation dielectric containing openings down to pads of the chips and down to the copper through connects and copper bus bar. This dielectric is applied as a liquid, dried and hardened in all areas except the openings by exposing through a mask with collimated UV light. Details of processing and formulations of low modulus high elongation dielectrics are again given in the above-incorporated U.S. Pat. No. 6,426,545 B1.

Alternatively, other photo patternable and non photo-patternable in situ formed dielectrics such as epoxy or BCB could be used. In addition, a fully cured material such as kapton polyimide may be adhesively bonded in place to form the dielectric layer. In cases where the material is not photo-patternable, the openings can be formed by laser ablation or by reactive ion etching. Both techniques are well known and suitable parameters for the polymer dielectrics described above are described in the above-incorporated U.S. Pat. No. 5,250,843.

Next, a seed layer of copper is sputtered over the dielectric and into the openings to make connection to the IC chip pads and other copper structures in the encapsulant. In one embodiment, the actual sputtering operation includes providing a very thin adhesion layer of titanium. Sputtering is well known in the art. The thickness of titanium may be 200 angstroms, followed by 4000 angstroms of copper. A resist layer is coated over the sputtered copper. The resist is then exposed and developed. Resist materials with excellent aspect ratio are well known in the art. The resist is patterned with openings where the copper interconnect runs are desired. The copper is then electroplated to the thickness required by subsequent processing steps. A thickness of 6 to 12 microns may be used. The resist is removed by methods well known in the art and depending on whether a positive or negative resist is used. The sputtered copper and titanium is removed by etching the copper in ammonium persulfate and etching the titanium in 5% TFT Etchant in DI water. TFT Etchant is available from Transene Co. of Rowley, Mass. In the area where a thermal slug is desired two alternatives may be used.

Without adding any processing steps the area above the thermal slug that goes through the filler/encapsulant can be patterned with tightly spaced vias at the same time that the rest of the interconnect is patterned. For maximum performance, an additional resist step can open an area above the thermal slug as was done on the other end of the slug. Again, copper is electroplated and resist removed. After removal of resist, the sputtered copper and titanium is removed by etching the copper in ammonium persulfate and etching the titanium in 5% TFT Ecthant in DI water.

Additional interconnect layers can be patterned by repeating the steps of applying dielectric, patterning openings in the dielectric, sputtering copper, applying photo resist, patterning the resist, electroplating the copper and stripping the resist and etching the sputtered seed layer. FIG. 4M shows a cross section of two layers of dielectric and interconnect. Dielectric1 485 with Metal1 486 makes direct connection to the exposed areas shown in FIG. 4L. Dielectric2 487 with Metal2 488 forms additional interconnect structures. Interconnect in area 490 completes the Faraday shield enclosure. Specifically, capping structure 473 forms the bottom/top of the enclosure and makes connection to the Faraday shield side structures 426. Structures 426 lie in the filler/encapsulant 450 and surrounds Chip3 on the sides. Capping structure 490 completes the enclosure above/below Chip3 and makes connection to the top end of Faraday shield side structures 426. A complete ground enclosure is thus formed at the same time and with the same processing steps as the through connects and other interconnect and redistribution layer interconnects.

A high conductivity path through the filler/encapsulant 450 is provided by structure 491 connected to slug 422 and back side elements 477 and 478. This thermal path facilitates heat removal from a device to be soldered in place above. Interconnect structure 492 provides interconnection to the bus bar 447. Interconnect structure 493 makes connection from a through connect 420 to chip pads 431 of Chip1 showing direct connection from a chip to the other side of the filler/encapsulant. When all interconnect layers are completed, there are two possible finishing steps depending on the final use of the module. In one embodiment, a solder mask is applied, for example, by spray coating. Solder mask type LP2 available from Rogers Corp. of Chandler, Ariz., may be used. The mask is coated, for example, to a thickness of 25 microns. Mixing, coating drying, exposure, development, and post bake are all done in accordance with the specifications of the manufacturer. Openings in the solder mask expose the solder landing pads for surface mounting of components, and for attachment of heat removal slugs associated with components requiring heat removal through the chips-first base. FIG. 4N shows the structure of FIG. 4M with solder mask 494 added and openings for electrical connection 495 and thermal connection 496.

In an alternative embodiment, it is desired to have no solder mask at this point, but rather have an array of solder landing pads. This is accomplished by stripping the resist when the final layer is processed, then applying another layer of resist and patterning holes where the solder landing pads are desired. Copper is electroplated to form the pads followed by stripping the resist and etching the seed layer. FIG. 4O shows this alternative structure generally denoted 499. Land pads 497 are for electrical connection and pads 498 are for thermal connection.

At this point, the chips-first base portion of the structure of FIG. 4N or 4O can be tested. The advantage of testing at this stage is that if the interconnect or components in the chips-first base layer for a given module are found to be defective, then further population of that module with additional components can be halted. This way the value of the unpopulated components can be saved by not associating them with an ultimately defective module.

Adding Devices of the Second Layer

The devices of the second layer are next added. Starting with the module of FIG. 4N, solder paste is screen printed onto the base layer over openings 495 and 496 in the solder mask. Stencil printing solder paste is well known in the art. Second layer devices are placed with their bumps or pads disposed within the solder paste. The assembly is placed into a reflow oven and heated on a rapid ramp to just above the melting point of the solder, which melts the solder to complete the electrical interconnection between the second layer devices and the chips-first base layer.

FIG. 6 shows the chips-first layer with second layer devices attached electrically 662 and thermally 664. Note that a thermal conduit is formed under a thermal slug of the second layer devices by solder melting to provide an all metallic path for heat flow from the second layer devices through the structural encapsulant of the chips-first base. Although one mode is to use solder to interconnect the chips-first base to second layer interconnect, it is also possible to screen print conductive epoxy, and then place the bumps or pads of the second layer devices into the conductive epoxy and cure the conductive epoxy. Another method is to dip the solder bumps of some or all of the second layer devices in flux and place them bumps down on the chips-first base. Solder paste is not required where flux dipped bumps are used. The same reflow process that was used to reflow the solder paste can at the same time reflow bumps that are just flux dipped. This method is of value when stacks of devices are assembled since it is difficult to print solder paste on an uneven surface. It should also be noted that the use of the high elongation low modulus dielectric on the chips-first base and/or over the second layer devices allows the solder bumps to be extremely thin. This is because substantially all the strain is taken up in the dielectric and little strain is transmitted to the bumps. This allows the structure to be considerably thinner.

In the example shown in FIG. 6, two bumped modules are illustrated as part of the second layer. It should be understood that there are a vast variety of modules that could be used, such as: chip scale packages, conventional bumped packages and modules, stacked packages, bumped chips, SAW modules and essentially any device that may be surface mounted to a circuit board. Additionally one or more of the incorporated modules could be a subsystem module which was previously fabricated according to this application. One of the modules 670, which is representative of a generic module and could be any of the above mentioned modules, includes solder bumps or pads that interconnect the module to the multichip layer.

Module 680 is depicted as a module optimized for heat removal. Such a module may be formed by the processing steps disclosed herein. Some of the salient internal structure of this module is shown in FIG. 6. Chip 684 is mounted such that the back side is connected to thermal slug 682, which allows both electrical and intimate thermal contact to chip 684. Structure 686 makes electrical connection from the top chip pads 685 to bumps/pads 662 on the bottom of the module. A continuous highly thermal conductive path is provided by copper slug 682, solder bump 664, structure 616, slug 422 and the back side structures 477 and 478. To further generalize the structure, a surface mount component 690 is shown. This component represents components such as resistors, capacitors, inductors, crystals etc. that are required in a complete system and not incorporated in one of the integrated modules.

Adding Encapsulant and Stiffener

In one embodiment, an encapsulant layer is added to provide mechanical rigidity to the module and to provide a flat surface for improved handling by automated equipment. The encapsulant may be added alone or with a rigid stiffening member. Using the rigid stiffening member is advantageous if the module is to be of minimum thickness since practical encapsulants are not as stiff for a given thickness.

FIGS. 7A and 7B show a laminating fixture suitable for molding encapsulant and bonding a stiffener to the module. The fixture consists of two plates 700 and 702 held apart by fine adjustment screws 704. An arrangement 710 is provided that forces the two plates together under moderate pressure either by pneumatics or by springs. Alignment studs 706 hold the top and bottom plates in alignment. Vacuum hold down holes 712 are provided in each plate for maintaining alignment of the parts to be molded.

With reference to FIG. 7B, both the stiffener 722 and a chips-first module with second layer devices and components 724 (similar to the module shown in FIG. 6) are laminated with low adhesion tape 720. This is done to contain the encapsulant runoff. Tape lamination can be done using a roll laminator from Think & Tinker, Ltd. of Palmer Lake, Colo., and a low tack tape such as available in various sizes and thickness from Semiconductor Equipment Corp. of Moorpark, Calif. Encapsulant is applied to both the stiffener and module. By way of example, the encapsulant material is one that contains a curing agent, and can be applied in liquid form, such as an epoxy or a urethane acrylate. Applying the material in liquid form allows it to run under the attached second layer modules and allows entrapped air bubbles to flow out. In an alternative embodiment, conventional underfill material is dispensed and allowed to flow under the modules by capillary attraction. This underfill is cured before the encapsulant is applied. The use of underfill is well known in the art.

The encapsulant material 726 is applied and dried. The stiffener 722 mounted on low tack tape 720 is attached to the upper plate of the fixture. This can be done by incorporating vacuum hold down in the fixture plate or by applying a thin layer of low tack adhesive or both. Similarly, the module 724 mounted on low tack tape 720 is attached to the bottom of the fixture. The top and bottom plates are assembled with the module facing up and the stiffener facing down. Pressure to force the plates together is applied and the fixture is heated to a temperature that allows the encapsulant to flow and also causes it to cure. The plates are held apart by a precise amount by adjustable stops 704. After the encapsulant is cured the fixture is cooled. If a holding vacuum is applied, then it is released along with the applied pressure; and the fixture plates are separated. The laminated part is then removed from the fixture plate and the low tack tape peeled from both sides.

FIG. 8A shows the module of FIG. 6 after removal of the low tack adhesive tape with permanent encapsulant 800 and optional stiffener 810.

FIGS. 7A and 7B show a fixture that maintains accurate thickness of the encapsulant, as well as allows the attachment of a stiffener. It should be understood that conventional molding devices such as used to form electronic packages could also be used. In addition, if the fixture of FIGS. 7A and 7B is contained in a vacuum and the forcing devices are made pneumatic or otherwise remotely actuated, then the encapsulant may be degassed before the upper and lower plates of the fixture are forced together.

Removal of Process Carrier

With reference to FIG. 8A, at this point the process carrier 481 is removed. This can be accomplished by lapping the glass process carrier and continuing lapping partially into the adhesive 482 until the redistribution pads (466, 468, 470, 474), and thermal slugs (472, 476, 478) are exposed. Lapping equipment of various sizes is available from Lapmaster International of Mount Prospect, Ill. Lapping is carried out using an alumina lap slurry such as WCA 20 available from Microabrasives of Westfield, Mass. The panel is attached to a vacuum hold down diamond stop lap carrier also available from Lapmaster. The diamond stops are set to prevent lapping beyond the point where redistribution pads and thermal slugs are exposed. The lapping process proceeds by applying a pressure in a five minute ramp to 2 psi, lapping then continues until the diamond stops are riding on the lapping wheel. Alternatively, the process carrier may be removed by fine grinding equipment which is also available from Lapmaster. Yet another alternative is to use backgrinding equipment such as used for back-grinding finished wafers to thin the wafers before they are diced and the dice put into packages. Such equipment is available from Disco of Tokyo, Japan.

Note that the lapping or grinding process can yield a solder mask which can be used either to provide masking for application of solder bumps or for solder land pads when the bumps are on another module, device component or circuit board. This solder mask feature is automatically provided since the adhesive that was used to adhere the module to the process carrier still surrounds the land pads and thermal slugs. As mentioned this material was chosen to be a high temperature material such as epoxy which is ideal for solder mask applications.

Adding Solder Bumps to the Back Side

The final processing steps add the interconnect bumps to the bottom of the module. Solder paste is screen printed onto the exposed land pads and thermally conductive metal slugs. Stencil printing solder paste is well known in the art. The assembly is placed into a reflow oven and heated on a rapid ramp to just above the melting point of the solder which melts the solder and forms bumps. The module panel is then cooled.

FIG. 9A shows the cell phone in a package module with a chips-first base layer 900, through connects 420 from top to bottom in the filler/encapsulant 450, redistribution interconnect (467, 468, 469, 470, 472, 473, 474, 475, 476, 465, 466), bumps 912 on the bottom masked by solder mask 910 formed when the adhesive is lapped into the land pads, a second layer of surface mounted modules 670, 680 and components 690, and an encapsulant 800 and optional stiffener 810.

Although only one module has been shown in many of the figures, the modules are processed in a large panel that holds many modules. At this point the panel can be singulated into individual modules using a dicing saw. Dicing saws available for this application are available from Disco Corp of Tokyo, Japan. This completes the fabrication of one embodiment of the electronic system or subsystem in a package.

Variations of the Process

There are several variations of the process as described which lead to different and novel structures.

No Stiffener or No Encapsulant

In the section that describes Adding Encapsulant and Stiffener, and with reference to FIGS. 7A and 7B, if no stiffener is laminated to the top low tack tape, the result will be an encapsulated module with encapsulant 726 surrounding the second layer of components and a flat surface of encapsulant for automated handling.

If it is desired to have the stiffener just bonded to some of the second layer components, then the stiffener can be coated with a low flow adhesive and no encapsulant 726 would be applied to the module side. The balance of the steps discussed above would be followed with the desired result.

No Second Layer Devices

If devices are not included in the second layer, a chips-first module with encapsulant, optional stiffener, and through connects, thermal slugs, backside connection and Faraday shielding capability is fabricated. The above steps are followed except those outlined in Adding Devices of the Second Layer. Modules with bumps 912 on the side away from the active side of the chips have particular utility in systems where it is desired to electrically or thermally connect the back side of the chip to the same circuit board where the I/O is connected. Such a module is depicted as module 680 in FIG. 9A.

Accommodating Very Thick Second Layer Devices

If a hole is provided in the stiffener, a very thick component can be accommodated without increasing the overall thickness of the resultant module. The thick component protrudes into the hole and the encapsulant is kept even with the top of the hole by the low tack tape. Some novel structures that may be formed by this technique are given below.

If a surface mount connector is placed as one of the second level devices, then this connector may be accessed from the top of the module after the module is mounted. This can allow connection, for example, of an antenna or I/O device such as a keyboard. A photo optic sensor or source may be surface mounted in such a way that direct interface to a fiber optic cable may be effected. If a patch antenna is printed on the top of the module, it may be connected by an embedded connector.

Temporary Encapsulant Structures

There are several innovative structures that are enabled by the use of a temporary encapsulant. The temporary encapsulant is applied at the same point in the process as the permanent encapsulant shown as 726 in FIG. 7B. This gives the advantage that the remaining process may be followed and at the appropriate point in the process the encapsulant may be easily removed to reveal the desired resulting module.

Stacked Modules

To fabricate a very thin module that can be stacked the same processing steps as outlined above may be followed. Specifically, reference the above discussion for Fabricating a Chips-First Base Layer, Adding Redistribution Interconnect, Attaching a Process Carrier and Initiating Processing of Top Side, and Adding the Interconnect Above the Chips. This processing results in the structure shown in FIG. 4N. FIG. 4N shows an embodiment that has had back side processing and has had two metal interconnect layers (485, 486) (487, 488) and solder mask 494 applied to the top side of the module. The solder mask is patterned with openings 495 in the solder mask. Solder paste is now screen printed into openings 495 and the module is reflowed in a solder reflow oven. Bumps are thereby formed on the top surface. Next, the steps outlined in Adding Encapsulant and Stiffener are performed, except that a temporary encapsulant is used instead of the permanent one.

Using the temporary encapsulant results in the embodiment shown in FIG. 8B. Aquabond A55 available from Semiconductor Equipment Corp. of Moorpark, Calif., can be used as a temporary encapsulant 830. When this material is heated to 90° C., it flows with a viscosity nearly that of water. At 90° C., it can be dispensed on top of the chips-first bumped structure described above, which is preferably preheated to 100° C. The stiffener 840 is also coated by dispensing the heated liquid, temporary encapsulant material on the preheated stiffener. For this embodiment, a stiffener 840 may be a glass plate roughened on the encapsulant side. Both pieces are cooled to solidify the temporary encapsulant before assembly. As outlined in Adding Encapsulant and Stiffener, a low tack tape is laminated to the process carrier and to the stiffener. The encapsulant molding fixture of FIGS. 7A and 7B is assembled and heated with the fixtures plates forced together as show in FIG. 7B. The temporary encapsulant flows to mold the encapsulant together with the stiffener. After cooling and removal of the low tack tape, the assembly is as shown in FIG. 8B. FIG. 8B shows the module with temporary encapsulant 830, stiffener 840, solder bumps 820 and with process carrier 481 attached by adhesive 482.

The process carrier may be removed by following the steps in the above-noted section Removal of Process Carrier. For clarity, these steps are repeated here. Removal of the process carrier is accomplished by lapping the glass process carrier 481 and continuing lapping partially into the adhesive 482 until the redistribution pads, and thermal slugs are exposed. Lapping is carried out on a (for example) a Lapmaster 36 available form Lapmaster International of Mount Prospect, Ill., using an alumina lap slurry such as WCA 20 available from Microabrasives of Westfield, Mass. The panel is attached to a vacuum hold down diamond stop lap carrier also available from Lapmaster. The diamond stops are set to prevent lapping beyond the point where redistribution pads and thermal slugs are exposed. A pressure of 2 psi is applied by ramping from 0 psi over a 5 minute interval and lapping continues until the diamond stops are riding on the lapping wheel. Alternatively, the process carrier may be removed by fine grinding equipment available from Lapmaster or by back-grinding equipment typically used for back-grinding finished wafers to thin the wafers before they are diced and the die put into packages. Such equipment is available from Disco of Tokyo, Japan.

Note that the lapping or grinding process can yield a solder mask which can be used either to provide masking for application of solder bumps or for solder land pads when the bumps are on another module, device, component or circuit board. This solder mask feature is automatically provided since the adhesive that is used to adhere the module to the process carrier still surrounds the land pads and thermal slugs. As noted, this material is chosen to be a high temperature material, such as epoxy which is ideal for solder mask applications.

FIG. 9B shows one embodiment of the resultant module. On the back side, the exposed lands 920 for solder or other interconnect are exposed on the surface and surrounded by the residual adhesive that acts as a solder mask 910. To dice a panel into individual modules a dicing saw is used such as available from Disco Co. of Tokyo, Japan. The saw is set to dice part way into the temporary encapsulant from the module side. After dicing is completed the panel is heated to 100° C. and individual modules can be picked with a vacuum tool and placed in suitable wash pack, such as available from Entegris Corp. of Chaska, Minn. The washing process may include dipping for a period of 10 minutes in 90° C. DI water and surfactant, then 5 minutes in 90° C. DI water, then 1 minute in room temperature DI water, followed by propanol displacement drying in hot propanol or propanol vapor dryer.

The module represented by Chip1, Chip2 and Chip3 is an example of a stackable module (or multichip layer) that could be diced on the panel. The dicing lines 922 are shown in FIG. 9B. Note that there is no stiffener or encapsulant so these modules are fragile and in their thinnest form are not practically capable of standing on their own.

FIG. 10A shows the Chip1, Chip2 and Chip3 module as diced and cleaned of temporary encapsulant. Note that solder bumps 820 and land pads 920 are in alignment. As an example stack, this module is mounted to the base layer of FIG. 4N in the location shown by the generic module 670 (see FIG. 6). A first module can be mounted with its solder bumps to the land pads of the base layer. The assembly is then placed in an oven and the solder is reflowed. A second module is then soldered to the land pads 920 of the first module shown in FIG. 10A. This is accomplished by dipping the bumps of the second module in solder flux then placing the second module bumps onto the land pads of the first module. Again the assembly is placed in an oven to reflow the solder to make connection. The reflow may be done after each stacked module is added or the reflow process may be applied after the stack is completed. At this point, the permanent encapsulant may be applied with or without the optional stiffener and the process continued. Note that rigidity and robust protection is afforded to the very thin stackable modules by the encapsulant. FIG. 10B shows a generic module 670 (such as shown in FIG. 9A) as an exemplary stack of two of the modules 1000 as shown in FIG. 10A. It should be noted that the stacked module disclosed herein is the thinnest module known that has bumps on one side and pads on the other side, wherein both the pads and bumps are distributed above and below the chip or chips that are interconnected. A completely freestanding module with multiple stacked components may be attained where each element of the stack may be tested before assembly and where the resulting module is of minimal thickness.

Encapsulant Filler to Provide Stiffness

In cases where the filler/encapsulant is thicker than the chips, the filler/encapsulant can supply a stiffening function. In the example embodiment of FIGS. 4N & 9B, Chip1 and Chip4 are thinner than the final filler/encapsulant 450. Modules that are formed using structures associated with Chip1 and Chip4 would result in filler/encapsulant that is thicker than the chips. If the filler/encapsulant is thick enough it can provide a stiffening function and eliminate the need for a stiffener in the top side. Specifically, area 451 (FIG. 4M) on the back of Chip1 is the area of encapsulant 450 that is thicker than Chip1. The processing would proceed until the assembly reaches the point shown by FIG. 8B, where in the encapsulant is a temporary encapsulant 830. The process carrier is now removed by lapping techniques disclosed above. The module is heated to 100° C. and the rigid stiffening member 840 is removed. The module is now cleaned by soaking for 10 minutes in a 5% surfactant DI water solution at 90° C. followed by a rinse in 90° C. DI water. This is followed by a rinse for 1 minute in DI water and a propanol water displace for drying. The resultant module would have no encapsulant or stiffener, but would obtain sufficient rigidity from the thick filler/encapsulant shown as area 451.

Chips Completely Surrounded by Copper

With reference to FIG. 6, the module formed around Chip5 is one that has copper 446 surrounding the back and sides of the chip. As stated, this is of value in fabricating very low inductance connection to the back side of the chip. It also provides a heat path from the back and sides of the chip to the top of the module. Finally, it provides high conductivity shielding around the chip. In addition, this particular structure configuration doesn't allow filler/encapsulant 450 to contact the chip.

Complete System in a Package with Second Layer Devices on Back of Chips-First Base In another embodiment, the second layer of devices is interconnected on the back of the chips-first module, and bumps on the top of the module are used for input/output. FIG. 11 shows one embodiment of this structure. This configuration can be advantageous in digital systems where the chips-first base layer contains chips that have a significant amount of I/O. In such systems, having the I/O contacts on the back would require that the through connections pass through the chips-first base layer. For large amounts of interconnect this could increase the size of the module. In such cases putting the second layer devices on the side away from the active area of the chips allows efficient redistribution of the large I/O compliment on the same side as the pads of the high I/O content chips.

To fabricate a module according to this embodiment the steps below are followed. First a chips-first base layer is fabricated as described in Fabrication of Chips-first Base Layer. Next, the redistribution interconnect is fabricated on the back side as described in Adding Redistribution Interconnect. This is followed by the steps contained in the section entitled Attaching the Process Carrier and Initiating Processing of the Top Side. Next, the interconnect is added above the chips. This process follows the steps described in the section Adding the Interconnect Above the Chips. The optional embodiment that provides solder landing pads and no solder mask is fabricated. The module at this point is shown in FIG. 4O. At this point, the processing departs somewhat from that already disclosed.

Adding Second Process Carrier

In the above-described embodiments, processing is carried out to add the second layer devices or add solder bumps. In this embodiment, a second process carrier is attached to the just finished interconnect layers above the chips. The steps are very similar to those described in Attaching Process Carrier & Initiating Processing of Top Side, but will be repeated here in order to avoid confusion.

The second process carrier is (in one embodiment) a plain glass panel that has been slightly roughened on one side to improve adhesion. The top surface of the module 499 as shown in FIG. 4O is pre-coated with a layer of adhesive. In one embodiment, a high temperature material such as an epoxy that can be cured at or near room temperature is used. This material is coated to a thickness of between 12 and 50 microns by spin or spray coating. The material is cured until solid, but not completely cured. An epoxy that cures in 24 hours at room temperature is coated and then baked on a hot plate for 30 minutes at 75° C. to achieve this solid but not fully cured objective.

Next, each of the process carrier 1 of module 499 and process carrier 2 are bonded by low adhesion tape into open frames. Such a process is well know in the art for the purpose of holding wafers when they are diced by a dicing saw. A frame bonder that is suitable for this use and also the low tack tape is sold by Semiconductor Equipment Corp. of Moorpark, Calif. The process carrier frame is then placed on a fixture that holds the frame in alignment and thereby holds the process carrier in alignment. The same high temperature, liquid epoxy adhesive is then applied to the center of the process carrier 2. The process carrier 1 frame is placed on the same fixture such that two untaped surfaces face one another. The fixture is then placed into a laminating press and pressure is applied. This squeezes the adhesive into a thin uniform film and bonds the process carrier 2 to the top of the partially processed chips-first base. The actual glue line thickness is primarily dictated by the thickness of the pre-applied coating. After the adhesive has cured, the fixture is removed from the laminating press and the low tack tape is removed. The low tack tape and frame thus serve the dual purpose of holding alignment and also containing any run offof the adhesive. FIGS. 5A and 5B show the lamination fixture used to attach a process carrier to a partially processed module. FIG. 12A shows process carrier 2 1200 attached with adhesive 1202 to the partially processed base layer 499.

Removing First Process Carrier

Still referring to FIG. 12A, the first process carrier 481 is removed by the steps outlined in Removal of Process Carrier. This process is repeated below for clarity. Removal of first process carrier 481 can be accomplished by lapping the glass process carrier and continuing lapping partially into adhesive 482 until the redistribution pads (468, 470, 474, 466), and thermal slugs (478, 472, 476) are exposed. By way of example, lapping is carried out on a Lapmaster 36 using an alumina lap slurry such as WCA 20. The lapper is available form Lapmaster International of Mount Prospect, Ill., and the WCA 20 is available from Microabrasives Co. of Westfield, Mass. The panel is attached to a vacuum hold down diamond stop lap carrier also available from Lapmaster. The diamond stops are set to prevent lapping beyond the point where redistribution pads and thermal slugs are exposed. A pressure of 2 psi is applied in a five minute ramp and lapping continues until the diamond stops are riding on the lapping wheel. Alternatively, the process carrier may be removed by fine grinding equipment also available from Lapmaster. Another alternative is backgrinding which typically is used for backgrinding finished wafers to thin the wafers before they are diced and the die put into packages. Such equipment is available from Disco Co. of Tokyo, Japan.

Note that the lapping or grinding process can yield a solder mask, which can be used either to provide masking for application of solder bumps or for solder land pads when the bumps are on another module, device component or circuit board. This solder mask feature is automatically provided since the adhesive that is used to adhere the module to the process carrier still surrounds the land pads and thermal slugs. As mentioned, this material is chosen to be a high temperature material such as epoxy which is ideal for solder mask applications. FIG. 12B shows process carrier 1 removed and the redistribution pads 1210 and thermal slugs 1212, 1214, 1216, exposed, with the residual adhesive 482 acting as a solder mask.

Adding Devices of the Second Layer to the Backside of Chips-First Base

The components of the second layer are next added. This process is similar to the process described in Adding Devices of the Second Layer where components are added to the top of the chips-first base. The process discussion is repeated here to avoid confusion. First solder paste is screen printed onto the base layer over land pads (1210, 1212, 1214, 1216). Stencil printing solder paste is well known in the art. The second layer devices 670, 680 are placed with their bumps or pads into the solder paste. The assembly is placed into a reflow oven and heated on a rapid ramp to just above the melting point of the solder, which melts the solder to complete the interconnection from the second layer devices to the chips-first base layer. Under the thermal slug of second layer device 680, solder melts to provide an all metallic path or thermal conduit for heat flow from second layer device 680 through the structural material of the chips-first base layer.

FIG. 12C shows the chips-first layer with second layer devices 670, 680 attached electrically and thermally. Although one mode is to use solder to interconnect the chips-first base and second layer devices, it is also possible using screen print conductive epoxy, for example, by placing the bumps or pads of the second layer devices into the conductive epoxy and curing the conductive epoxy. Another method is to dip the solder bumps of some or all of the second layer devices in flux and place the devices bumps-down on the chips-first base. Solder paste is not required where flux dipped bumps are used. The same reflow that is used to reflow the solder paste can at the same time reflow bumps that are just flux dipped. This method is of value when stacks of devices are fabricated since it is difficult to print solder paste on an uneven surface. It should also be noted that the use of the high elongation low modulus dielectric on the chips-first base and/or the second layer devices allows the solder bumps to be extremely thin. This is because substantially all the strain is taken up in the dielectric and little strain is transmitted to the bumps. This allows the resultant structure to be considerably thinner.

In the example embodiment, two bumped modules are shown as part of the second layer. It should be understood that there is a vast variety of modules that could be used, such as: chip scale packages, conventional bumped packages and modules, stacked packages, bumped chips, SAW modules and essentially any device that may be surface mounted to a circuit board. Additionally, one of the incorporated modules could be a subsystem module that was previously fabricated according to this disclosure.

Adding Encapsulant and Stiffener to Bottom of Chips-First Base

In one embodiment, an encapsulant layer is next added to provide mechanical rigidity to the module and to provide a flat surface for improved handling by automated equipment. The encapsulant may be added alone or with a rigid stiffening member or layer. Using a stiffener is advantageous if the module is of minimum thickness since practical encapsulants are not as stiff as practical stiffeners for a given thickness. FIGS. 7A & 7B show a laminating fixture suitable for molding encapsulant and bonding a stiffener to the multichip module. The operation of this fixture is explained in detail in the section entitled Adding Encapsulant and Stiffener.

Both the stiffener and chips-first module (i.e., multichip base layer) with second layer devices as shown in FIG. 12C, are laminated with low adhesion tape. This is done to contain the encapsulant runoff. Tape lamination can be done using a roll laminator from Think & Tinker, Ltd. of Palmer Lake, Colo., and low tack tape is available from Semiconductor Equipment Corp. of Moorpark, Calif. Encapsulant is applied to both the stiffener and the module. One encapsulant material which can be used contains a curing agent, and can be applied in liquid form, such as an epoxy or a urethane acrylate. Applying the material in liquid form allows it to run under the attached second layer modules and allows entrapped air bubbles to flow out. (In an alternative embodiment, conventional underfill material is dispensed and allowed to flow under the modules by capillary attraction. This underfill is cured before the encapsulant is applied. The use of underfill is well known in the art.) The encapsulant material is applied and dried. The stiffener is attached to the upper plate of the fixture. This can be done by incorporating vacuum hold down in the fixture plate or by applying a thin layer of low tack adhesive or both. Similarly the module is attached to the bottom of the fixture. The top and bottom plates are assembled with the module facing up and the stiffener facing down. Pressure is applied to force the plates together, and the fixture is heated to a temperature that allows the encapsulant to flow and also cause it to cure. After the encapsulant is cured, the fixture is cooled. If a vacuum is applied, it is released and the force is released, which is followed by the fixture plates being separated. The laminated structure is then removed from the fixture plate and the low tack tape peeled from both sides.

FIG. 12D depicts the multichip module after removal of the low tack adhesive tape. Encapsulant 1250 surrounds modules 670 and 680 and attaches an optional stiffener 1252. FIGS. 7A & 7B show a fixture that maintains accurate thickness of the encapsulant as well as allowing the attachment of a stiffener. It should be understood that conventional molding devices such as used to form electronic packages could also be used. In addition, if the fixture of FIGS. 7A & 7B is contained in a vacuum and the forcing devices shown are made pneumatic or otherwise remotely actuated, then the encapsulant may be degassed before the upper and lower plates of the fixture are forced together.

Removal of Second Process Carrier

At this point, process carrier 2 1200 can be removed. The second process carrier is removed by following the steps outlined in Removal of Process Carrier. This is again accomplished by lapping the glass process carrier and continuing lapping partially into the adhesive 1202 until the redistribution pads, and thermal slugs are exposed. Lapping can be carried out on a Lapmaster 36 using an alumina lap slurry such as WCA 20. The panel is attached to a vacuum hold down diamond stop lap carrier. The diamond stops are set to prevent lapping beyond the point where redistribution pads and thermal slugs are exposed. A pressure of 2 psi is applied as a ramp over a five minute interval and lapping is continued until the diamond stops are riding on the lapping wheel. Alternatively, the process carrier may be removed by fine grinding or back-grinding equipment.

Note that the lapping or grinding process can yield a solder mask which can be used either to provide masking for application of solder bumps or for solder land pads when the bumps are on another module, device, component or circuit board. This solder mask feature is automatically provided since the adhesive 1202 that was used to adhere the module to the process carrier still surrounds the land pads 1130 and thermal slug lands 1131. As mentioned, this material was chosen to be a high temperature material such as epoxy which is ideal for solder mask applications.

Adding Solder Bumps to the Top Side

The final processing steps add the interconnect bumps to the top of the module. This process is similar to that described in the section entitled Adding Solder Bumps to the Top Side, except that it is done on the surface above the active surface of the chips. The process is summarized again to avoid confusion. Solder paste is screen printed onto the exposed land pads 1130 and thermal slug pads 1131. Stencil printing solder paste is well know in the art. The assembly is then placed into a reflow oven and heated on a rapid ramp to just above the melting point of the solder, which melts the solder and forms bumps 1120 (see FIG. 11). The module panel is then cooled.

FIG. 11 shows the completed cell phone in a package multichip module, with a chips-first multichip layer 1000, through connects 420 from top to bottom in the filler/encapsulant (i.e., structural material), redistribution interconnect and land pads on the bottom 1102; a second layer of surface mounted modules 670, 680 and components attached to the bottom, an encapsulant 1110 and optional stiffener 1112 on the bottom, and I/O bumps 1120 on the top.

Although only one multichip module has been shown in many of the figures, in practice the modules are processed in a large panel which holds many modules. At this point, the panel would be singulated into individual multichip modules using a dicing saw. This completes the fabrication of another embodiment of the electronic system or subsystem in a package.

Further Variations

Other Types of Bumps

In each case where application of solder bumps is described above, there may be alternatives to fabricating any type of bump or pad structure suitable for the intended application. As an example, consider as a starting point the module of FIG. 4N, which shows solder mask 494 with openings 495, 496 that expose underlying copper pads. Any kind of metal bump or pad may be fabricated by first sputtering a copper seed layer over the solder mask 494 and into the openings 495, 496, applying photo resist, patterning holes in the photo resist where the bumps/pads are desired and plating up to the desired size of the bump/pad. This is followed by removal of the resist and etching the copper seed layer. This approach may be used, for example, to plate pads that have only a thin coating of solder. When this type of module is assembled into a system, the thickness of the system is reduced since the bump is quite thin. A bump of minimal height is especially effective when the dielectric below is of the low modulus, high elongation type such that stress/strain on the solder interconnect itself is minimized. In addition, the use of pure copper bumps for interconnection is well known in the art.

Other Types of Process Carriers and Their Removal

In each case where the use of a process carrier is described, the process carrier is adhesively attached and subsequently removed by lapping or grinding. Other types of process carrier removal may also be used. For example, using a process carrier that is transparent to laser light, the carrier may be removed by, for example, excimer laser pulses through the carrier that vaporize a small portion of the adhesive, thus separating the process carrier. Additionally, other techniques including using a process carrier with a solventable layer and solvent removing the carrier, or using one with a melting point above the previous processing temperatures and heating above this melting point and removing the carrier may be employed.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the spirit of the invention, and these are therefore considered to be within the scope of the invention as defined in the following claims.

What is claimed is:

1. An electronic module comprising:
a chip layer including:
at least one chip,
each chip comprising at least
one side surface,
an upper surface,
a lower surface, and
at least one contact pad at the upper surface;
a structural material surrounding and physically contacting the at least one side surface of each chip of the chip layer,
the structural material having an upper surface substantially co-planar with or parallel to an upper surface of each chip and defining at least a portion of a front surface of the chip layer, and
a lower surface substantially co-planar with or parallel to a lower surface of each chip and defining at least a portion of a back surface of the chip layer;
an interconnect layer disposed over the front surface of the chip layer,
the interconnect layer including at least one electrical conductor extending at least in part horizontally and in opposing relation to the front surface of the chip layer,
wherein the interconnect layer electrically connects to a contact pad of the at least one contact pad of the at least one chip of the chip layer; and
at least one electronic device disposed over the front surface of the chip layer and electrically connected to the interconnect layer; and
a thermal conduit from a surface of the at least one electronic device, through the interconnect layer and the chip layer to the back surface of the chip layer,
the thermal conduit comprising at least one thermally conductive structure extending through the structural material between the front surface and the back surface of the chip layer,
the thermal conduit facilitating extraction of heat from the at least one electronic device disposed over the front surface of the chip layer to the back surface of the chip layer.

2. The electronic module of claim 1, wherein the thermal conduit further comprises
a thermally conductive material disposed between the surface of the at least one electronic device and the at least one thermally conductive structure extending through the structural material.

3. The electronic module of claim 1,
wherein the at least one electronic device comprises at least one integrated circuit chip.

4. The electronic module of claim 1, further comprising multiple devices disposed over the front surface of the chip layer, at least two devices of the multiple devices having a surface thereof thermally coupled via a respective thermal conduit to the back surface of the chip layer for the extraction of heat from the at least two devices to the back surface of the chip layer.

5. The electronic module of claim 1, further comprising
a redistribution layer disposed over the back surface of the chip layer between the back surface of the chip layer and a plurality of contacts arrayed over the redistribution layer, and
wherein the thermal conduit extends through the redistribution layer to facilitate extraction of heat from the surface of the at least one electronic device to at least one respective contact of the plurality of contacts arrayed over the redistribution layer.

6. The electronic module of claim 5, wherein the thermal conduit is a first thermal conduit, and wherein the electronic module further comprises a second thermal conduit, the second thermal conduit extending from a lower surface of a chip of the at least one chip of the chip layer through the redistribution layer to at least one respective contact of the plurality of contacts arrayed over the redistribution layer for facilitating extraction of heat from the chip of the at least one chip.

7. The electronic module of claim 1, wherein the thermal conduit comprises multiple aligned thermally conductive slugs or vias.

8. The electronic module of claim 1,
wherein the at least one electronic device is at least one packaged device, and
wherein the thermal conduit further comprises a thermally conductive material disposed within the at least one packaged device and aligned over the at least one thermally conductive structure extending through the structural material between the front surface and back surface of the chip layer.

9. A method of fabricating an electronic module comprising:
forming a chip layer including:
obtaining at least one chip,
each chip comprising
at least one side surface,
an upper surface,
a lower surface, and
at least one contact pad at the upper surface; and
disposing a structural material around and physically contacting the at least one side surface of each chip of the chip layer,
the structural material having an upper surface substantially co-planar with or parallel to an upper surface of the at least one chip and
defining at least a portion of a front surface of the chip layer, and
a lower surface substantially co-planar with or parallel to a lower surface of the at least one circuit chip and
defining at least a portion of a back surface of the chip layer;
providing an interconnect layer disposed over the front surface of the chip layer,
the interconnect layer including at least one electrical conductor extending at least in part horizontally and in opposing relation to the front surface of the chip layer, wherein the interconnect layer electrically connects to a contact pad of the at least one contact pad of the at least one chip of the chip layer;
disposing at least one electronic device above the front surface of the chip layer and electrically connected to the interconnect layer; and
providing a thermal conduit from a surface of the at least one electronic device,
through the interconnect layer and the chip layer to the back surface of the chip layer,
the thermal conduit comprising at least one thermally conductive structure extending through the structural material between the front surface and the back surface of the chip layer,
the thermal conduit facilitating extraction of heat from the at least one electronic device disposed above the front surface of the chip layer to the back surface of the chip layer.

10. The method of claim 9, wherein the thermal conduit further comprises a thermally conductive material disposed between the surface of the at least one electronic device and the at least one thermally conductive structure extending through the structural material.

11. The method of claim 9, wherein the at least one electronic device comprises at least one integrated circuit chip.

12. The method of claim 9, wherein disposing the at least one device further comprises disposing multiple devices over the front surface of the chip layer, at least two devices of the multiple devices having a surface thereof thermally coupled via a respective thermal conduit to the back surface of the chip layer for extraction of heat from the at least two devices to the back surface of the chip layer.

13. The method of claim 9, further comprising providing a redistribution layer over the back surface of the chip layer between the back surface of the chip layer and a plurality of contacts arrayed over the redistribution layer, wherein the thermal conduit extends through the redistribution layer to facilitate extraction of heat from the surface of the at least one electronic device to at least one respective contact of the plurality of contacts arrayed over the redistribution layer.

14. The method of claim 13, wherein the thermal conduit is a first thermal conduit, and wherein the method further comprises providing a second thermal conduit, the second thermal conduit extending from a lower surface of a chip of the at least one chip of the chip layer through the redistribution layer to at least one respective contact of the plurality of contacts arrayed over the redistribution layer for facilitating extraction of heat from the chip of the at least one chip of the chip layer.

15. The method of claim 9, wherein providing the thermal conduit further comprises providing multiple aligned thermally conductive slugs or vias.

16. The method of claim 9, wherein the disposing at least one electronic device further comprises disposing at least one packaged device above the front surface of the chip layer, and wherein providing the thermal conduit further comprises providing a thermally conductive material disposed within the at least one packaged device and aligned over the at least one thermally conductive structure extending through the structural material between the front surface and the back surface of the chip layer.

* * * * *